United States Patent
Sano et al.

(10) Patent No.: US 11,653,481 B2
(45) Date of Patent: May 16, 2023

(54) ELECTRIC POWER CONVERSION DEVICE

(71) Applicant: DENSO CORPORATION, Kariya (JP)

(72) Inventors: Tomohisa Sano, Kariya (JP); Ryota Tanabe, Kariya (JP); Yuta Hashimoto, Kariya (JP); Wataru Funatsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 5 days.

(21) Appl. No.: 17/155,729

(22) Filed: Jan. 22, 2021

(65) Prior Publication Data

US 2021/0144888 A1    May 13, 2021

Related U.S. Application Data

(63) Continuation of application No. PCT/JP2019/022914, filed on Jun. 10, 2019.

(30) Foreign Application Priority Data

Jul. 25, 2018   (JP) .............................. JP2018-139472
Jan. 29, 2019   (JP) .............................. JP2019-013377

(51) Int. Cl.
*H05K 7/20*   (2006.01)
*H02M 7/00*   (2006.01)
*H02P 27/06*  (2006.01)

(52) U.S. Cl.
CPC ........ *H05K 7/20927* (2013.01); *H02M 7/003* (2013.01); *H02P 27/06* (2013.01)

(58) Field of Classification Search
None
See application file for complete search history.

(56) References Cited

U.S. PATENT DOCUMENTS

| | | | | |
|---|---|---|---|---|
| 7,876,561 B2 * | 1/2011 | Schnetzka | .......... | H05K 7/20936 361/699 |
| 8,213,179 B2 * | 7/2012 | Yoshida | ............ | H05K 7/20927 361/689 |
| 8,355,244 B2 * | 1/2013 | Kimura | ............ | H05K 7/20927 361/624 |

(Continued)

FOREIGN PATENT DOCUMENTS

| | | |
|---|---|---|
| JP | 2015-095957 A | 5/2015 |
| WO | 2020/021843 A1 | 1/2020 |

OTHER PUBLICATIONS

U.S. Appl. No. 17/155,174, filed Jan. 22, 2021 in the name of Tomohisa Sano et al.

(Continued)

*Primary Examiner* — Courtney L Smith
(74) *Attorney, Agent, or Firm* — Oliff PLC

(57) ABSTRACT

An electric power conversion device includes: a cooler that includes a flow path through which a refrigerant flows, a first surface, and a second surface opposite to the first surface in a thickness direction; and multiple power modules that include a semiconductor device configuring an upper-lower arm circuit, and a capacitor connected to the upper-lower arm circuit in parallel. The capacitor and the semiconductor device are arranged in the thickness direction. The multiple power modules are placed on both of the first surface and the second surface of the cooler.

15 Claims, 50 Drawing Sheets

(56) References Cited

U.S. PATENT DOCUMENTS

| | | | | |
|---|---|---|---|---|
| 8,582,291 B2* | 11/2013 | Nakasaka | ........... | H01L 23/4012 |
| | | | | 361/677 |
| 8,693,193 B2* | 4/2014 | Ishibashi | ................ | H05K 7/209 |
| | | | | 361/689 |
| 10,797,036 B2* | 10/2020 | Nagase | ................ | H01L 25/072 |
| 10,855,195 B2* | 12/2020 | Dib | ................... | H05K 7/20927 |
| 2006/0284308 A1* | 12/2006 | Harada | ................ | H01L 23/473 |
| | | | | 257/729 |
| 2009/0231811 A1 | 9/2009 | Tokuyama et al. | | |
| 2011/0228479 A1 | 9/2011 | Tokuyama et al. | | |
| 2012/0099273 A1* | 4/2012 | Jacobson | ............ | H02M 7/4835 |
| | | | | 361/689 |
| 2013/0194853 A1 | 8/2013 | Tokuyama et al. | | |
| 2015/0070955 A1 | 3/2015 | Tokuyama et al. | | |
| 2015/0222196 A1 | 8/2015 | Tokuyama et al. | | |
| 2015/0349656 A1 | 12/2015 | Tokuyama et al. | | |
| 2017/0215304 A1 | 7/2017 | Tokuyama et al. | | |
| 2018/0269799 A1* | 9/2018 | Kimura | ................ | H02M 7/493 |
| 2019/0159367 A1* | 5/2019 | Umino | ................ | H05K 7/20927 |
| 2020/0093039 A1* | 3/2020 | Tokuyama | ............ | H01L 23/492 |

OTHER PUBLICATIONS

U.S. Appl. No. 17/154,697, filed Jan. 21, 2021 in the name of Ryota Tanabe et al.

* cited by examiner

FIG. 10
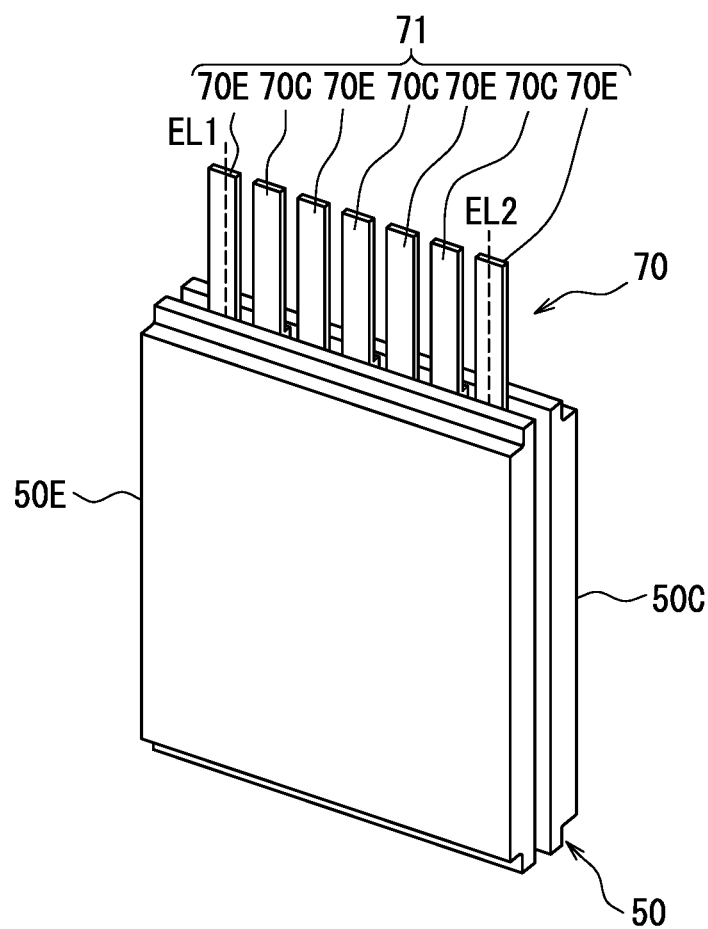
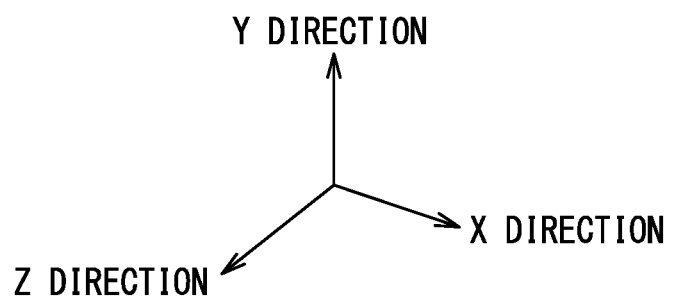

ELECTRIC POWER CONVERSION DEVICE

CROSS REFERENCE TO RELATED APPLICATIONS

The present application is a continuation application of International Patent Application No. PCT/JP2019/022914 filed on Jun. 10, 2019, which designated the U.S. and claims the benefit of priority from Japanese Patent Application No. 2018-139472 filed on Jul. 25, 2018 and Japanese Patent Application No. 2019-013377 filed on Jan. 29, 2019. The entire disclosures of all of the above applications are incorporated herein by reference.

TECHNICAL FIELD

The present disclosure relates to an electric power conversion device.

BACKGROUND

An electric power conversion device includes a semiconductor module, a cooler, and a capacitor.

SUMMARY

An electric power conversion device may include: a cooler that includes a flow path through which a refrigerant may flow, a first surface, and a second surface opposite to the first surface in a thickness direction; and multiple power modules that may include a semiconductor device configuring an upper-lower arm circuit, and a capacitor connected to the upper-lower arm circuit in parallel. The capacitor and the semiconductor device may be arranged in the thickness direction. The multiple power modules may be placed on both of the first surface and the second surface of the cooler.

BRIEF DESCRIPTION OF DRAWINGS

The above and other features and advantages of the present disclosure will be more clearly understood from the following detailed description with reference to the accompanying drawings. In the accompanying drawings.

FIG. 10 is a perspective view showing another example of the semiconductor device;

FIG. 21 is seen from an A direction;

FIG. 21 is seen from a B direction;

FIG. 21 is seen from a C direction;

FIG. 36 is seen from a D direction;

FIG. 36 is seen from an E direction;

FIG. 36 is seen from a F direction;

FIG. 36 is seen from a G direction;

DETAILED DESCRIPTION

Figure 1:
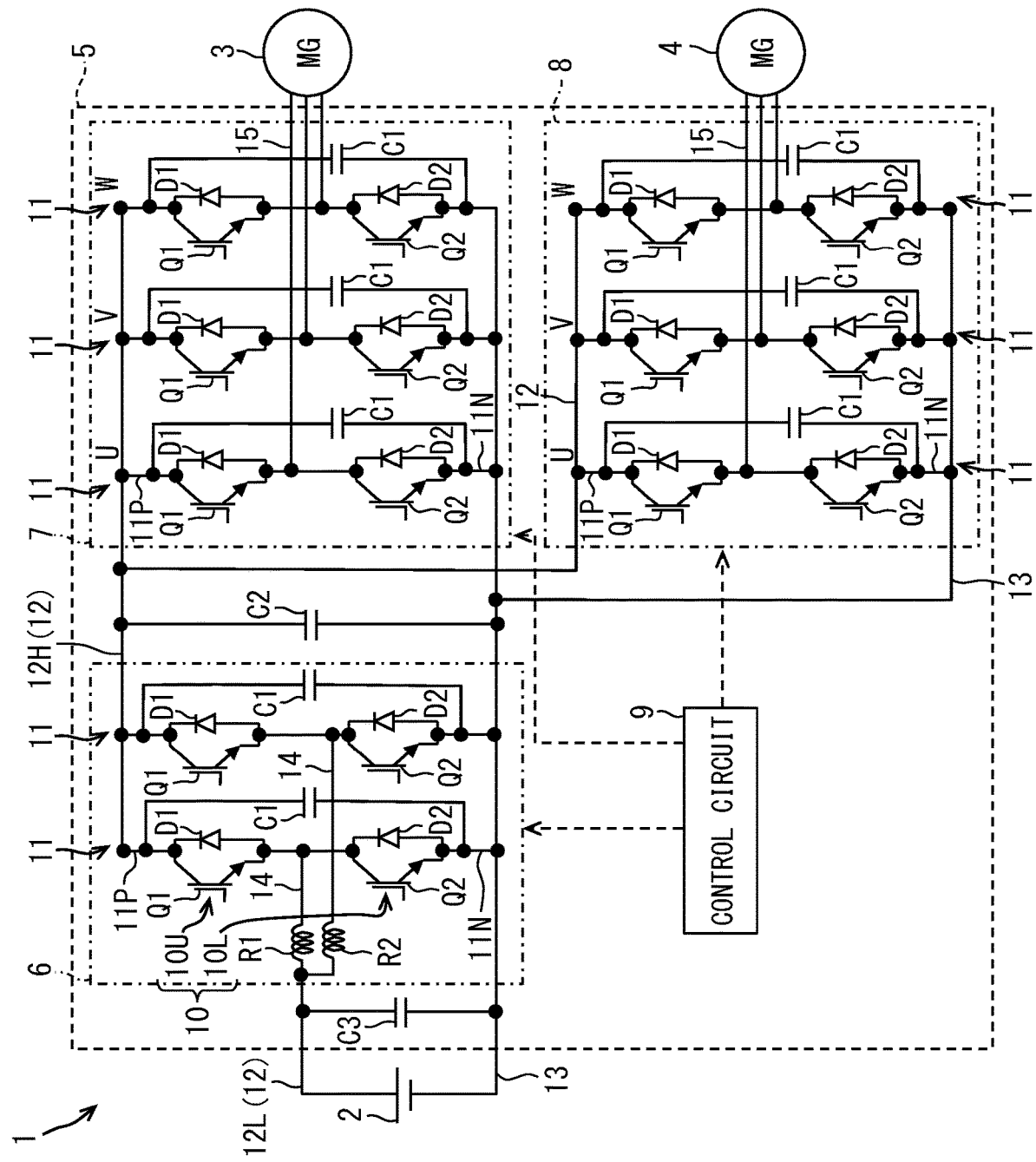
FIG. 1 is an equivalent circuit diagram showing a drive system to which an electric power conversion device according to a first embodiment is applied.

In an electric power conversion device, a semiconductor module is placed close to a first surface of a cooler, and a capacitor is placed close to a second surface opposite to the first surface in a thickness direction. However, it is required to reduce the size of the electric power conversion device in a direction orthogonal to the thickness direction while cooling the semiconductor module (semiconductor device).

One example of the present disclosure provides an electric power conversion device capable of reducing the size in a direction orthogonal to a thickness direction while cooling a semiconductor device.

According to one example embodiment, an electric power conversion device includes: a cooler that includes a flow path through which a refrigerant flows, a first surface, and a second surface opposite to the first surface in a thickness direction; and multiple power modules that include a semiconductor device configuring an upper-lower arm circuit, and a capacitor connected to the upper-lower arm circuit in parallel. The capacitor and the semiconductor device are arranged in the thickness direction. The multiple power modules are placed on both of the first surface and the second surface of the cooler.

According to one example embodiment, in the electric power conversion device, each of the multiple power modules includes not only the semiconductor device configuring the upper-lower circuit but also the capacitor connected to the upper-lower circuit in parallel. In such a manner, for each power module, in other words, each upper-lower arm circuit, the capacitor is provided. Further, in the power module, the semiconductor device and the capacitor are arranged in the thickness direction. By placing the power module on both surfaces of the cooler, it may be possible to reduce the size in a direction orthogonal to the thickness direction while cooling the semiconductor device.

Hereinafter, multiple embodiments will be described with reference to the drawings. In the embodiments, functionally and/or structurally corresponding parts are denoted by the same reference numerals. Hereinafter, a thickness direction of a heat exchange portion 233 of a cooler 230 is shown as a Z direction, and a direction in which multiple power modules 110 are arranged is shown as an X direction. A direction orthogonal to both of the Z direction and the X direction is shown as a Y direction. Unless otherwise specified, a shape along an XY plane defined by the X direction and the Y direction is a planar shape.

First Embodiment

An electric power conversion device of the present embodiment can be applied to a vehicle such as, for example, an electric vehicle (EV) or a hybrid vehicle (HV). In the following, an example in which the electric power is applied to the hybrid vehicle will be described.

(Drive System)

First, a schematic configuration of a drive system to which an electric power conversion device is applied will be described with reference to FIG. 1.

As shown in FIG. 1, a drive system 1 of a vehicle includes a direct current power source 2, motor generators 3 and 4, an electric power conversion device 5 that converts electric power between the direct current power source 2 and the motor generators 3 and 4.

The direct current power source 2 is a secondary battery capable of charging and discharging such as a lithium ion battery or a nickel hydrogen battery. The motor generators 3 and 4 are three-phase alternating type rotation electric machines. The motor generator 3 functions as an electric generator alternator) that is driven by an engine (not shown) and generates electricity and functions as an electric motor (starter) that starts the engine. The motor generator 4 functions as a traveling drive source of the vehicle, that is, the electric motor. The motor generator 4 also functions as the electric generator during regeneration. The vehicle includes, as traveling drive sources, the engine and the motor generator 4.

The electric power conversion device 5 includes a converter 6, inverters 7 and 8, a control circuit portion 9, a smoothing capacitor C2, and a filter capacitor C3. The converter 6 and the inverters 7 and 8 correspond to electric power converters. The converter 6 corresponds to a DC-DC converter that converts a direct voltage into a direct voltage having a different value. The inverters 7 and 8 correspond to a DC-AC converter. Each of these electric power converter includes a parallel circuit 11 including an upper-lower arm circuit 10 and a capacitor C1

The upper-lower arm circuit 10 includes switching elements Q1 and Q2 and diodes D1 and D2. In the present embodiment, as the switching elements Q1 and Q2, a n-channel type IGBT is employed. An upper arm 10U includes the switching element Q1 and a freewheeling diode D1 connected in reverse parallel to the switching element Q1. A lower arm 10L includes the switching element Q2 and a freewheeling diode D2 connected in reverse parallel to the switching element Q2. The switching elements Q1 and Q2 are not limited to the IGBT. For example, a MOSFET can be employed. As the diodes D1 and D2, parasitic diodes can be employed.

The upper arm 10U is paced close to a VH line 12H. The upper arm 10U and the lower arm 10L are connected in series between the VH line and a N line 13. A P line 12 is an electric power line on the high potential side, and includes a VL line 12L in addition to the VH line 12H. The VL line 12L is connected to a positive electrode terminal of the direct current power source 2. Between the VL line 12L and the VH line 12H, the converter 6 is placed. A potential of the VH line 12H is equal to or higher than a potential of the VL line 12L. The N line 13 is connected to the negative electrode of the direct current power source 2, and is referred to as a ground line. In such a manner, the upper-lower arm circuit 10 includes the upper arm 10U and the lower arm 10L that are connected in series between the electric power lines. One arm includes a semiconductor device 20 described later.

A collector electrode of the switching element Q1 is connected to the VH line 12H. An emitter electrode of the switching element Q2 is connected to the N line 13. The emitter electrode of the switching element Q1 and the collector electrode of the switching element Q2 are connected.

A positive electrode terminal of the capacitor C1 is connected to the collector electrode of the switching element Q1 of the upper arm 10U. A negative electrode terminal of the capacitor C1 is connected to the emitter electrode of the switching element Q2 of the lower arm 10L. That is, the capacitor C1 is connected to the corresponding upper-lower arm circuit 10 in parallel. The parallel circuit 11 includes the upper-lower arm circuit 10 and the capacitor C1 that are connected in parallel. The parallel circuit 11 has common wirings 11P and 11N. A connection point between the upper arm 10U and the positive electrode terminal of the capacitor C1 is connected to the VH line 12H via the common wiring 11P. A connection point between the lower arm 10L and the negative electrode of the capacitor C1 is connected to the N line 13 via the common wiring 11N.

In the present embodiment, the capacitor C1 is placed separately from the smoothing capacitor C2 and the filter capacitor C3. The capacitor C1 may have a function of supplying electric charges required for switching of the switching elements Q1 and Q2 of the parallelly connected upper-lower arm circuit 10. Due to the switching, an energy loss occurs, and a voltage between both ends of the upper arm and the lower arm drops. Therefore, the insufficient electric charges are supplied from the parallelly connected capacitor C1. Therefore, the capacitance of the capacitor C1 is set to a value sufficiently smaller than the capacitance of the smoothing capacitor C2 or the filter capacitor C3. For example, the capacitance of the smoothing capacitor C2 is set to 1000 μF, and the capacitance of the capacitor C1 is set to 10 μF to 20 μF. A power module 110 described later configures one parallel circuit 11.

The filter capacitor C3 is connected between the VL line 12L and the N line 13. The filter capacitor C3 is connected to the direct current power source 2 in parallel. For example, the filter capacitor C3 removes a power source noise from the direct current power source 2. Since the filter capacitor C3 is placed on the lower voltage side as compared with the smoothing capacitor C2, the filter capacitor C3 is also referred to as a lower voltage capacitor. At least one of the N line 13 or the VL line 12L is provided with a system main relay (SMR) (not shown) between the direct current power source 2 and the filter capacitor C3.

The converter 6 has the parallel circuit 11 and a reactor. In the present embodiment, the converter 6 is configured as a multi-phase converter, specifically, a two-phase converter.

The converter 6 has two sets of parallel circuits 11, and reactors R1 and R2 placed for each of the parallel circuits 11. The parallel circuits 11 are connected between the VH line 12H and the N line 13 in parallel. One end of each of the reactors R1 and R2 is connected to the VL line 12L. The other end is connected to a connection point between the upper arm 10U and the lower arm 10L in the corresponding parallel circuit 11 via a boost wiring 14. That is, the reactors R1 and R2 are placed between the VL line 12L and the connection point of the corresponding upper-lower arm circuit 10. The reactors R1 and R2 are connected between the VL line 12L and the N line 13 in parallel to each other.

The converter 6 converts the direct voltage into the direct voltage having the different value in accordance with a switching control by the control circuit portion 9. The converter 6 has a function of boosting the direct voltage supplied from the direct current power source 2. Further, the converter 6 has a drop function of charging the direct current power source 2 with use of the electric charges of the smoothing capacitor C2.

The smoothing capacitor C2 is connected between the VH line 12H and the N line 13. The smoothing capacitor C2 is placed between the converter 6 and the inverters 7 and 8. The converter 6 and the inverters 7 and 8 are connected in parallel. For example, the smoothing capacitor C2 smoothes the direct voltage boosted by the converter 6 and accumulates the electric charge of the direct voltage. A voltage between the ends of the smoothing capacitor C2 is a high direct voltage for driving the motor generators 3 and 4. The voltage between the ends of the smoothing capacitor C2 is set to be equal to or higher than a voltage between the ends of the filter capacitor C3. Since the smoothing capacitor C2 is placed on the higher voltage side as compared with the filter capacitor C3, the smoothing capacitor C2 is also referred to as a higher voltage capacitor.

The inverter 7 is connected to the converter 6 via the smoothing capacitor C2. The inverter 7 has three sets of parallel circuits 11. That is, the inverter 7 has the upper-lower arm circuits 10 for three phases. The connection point of the upper-lower arm circuit 10 in the U phase is connected to a U phase winding provided at a stator of a motor generator 3. Similarly, the connection point of the upper-lower arm circuit 10 in the V phase is connected to a V phase winding of the motor generator 3. The connection point of the upper-lower arm circuit 10 of the W phase is connected to a W phase winding of the motor generator 3. The connection point of the upper-lower arm circuit 10 in each phase is connected to the winding in accordance with the corresponding phase via an output wiring 15 placed for each phase.

The inverter 7 converts the direct voltage into a three-phase AC voltage in accordance with the switching control by the control circuit portion 9, and outputs the three-phase AC voltage to the motor generator 3. Thereby, the motor generator 3 is driven to generate a predetermined torque. In response to the output of the engine, the inverter 7 can convert the three-phase AC voltage generated by the motor generator 3 into the direct voltage in accordance with the switching control by the control circuit portion 9, and output the direct voltage to the VH line 12H. In such a manner, the inverter 7 performs bidirectional electric power conversion between the converter 6 and the motor generator 3.

Similarly, the inverter 8 is connected to the converter 6 via the smoothing capacitor C2. The inverter 8 has three sets of parallel circuits 11. That is, the inverter 8 has the upper-lower arm circuits 10 for three phases. The connection point of the upper-lower arm circuit 10 of the U phase is connected to a U phase winding provided at a stator of a motor generator 4. The connection point of the upper-lower arm circuit 10 of the V phase is connected to a V phase winding of the motor generator 4. The connection point of the upper-lower arm circuit 10 of the W phase is connected to a W phase winding of the motor generator 4. The connection point of the upper-lower arm circuit 10 in each phase is connected to the winding in accordance with the corresponding phase via the output wiring 15 placed for each phase.

The inverter 8 converts the direct voltage into a three-phase AC voltage in accordance with the switching control by the control circuit portion 9, and outputs the three-phase AC voltage to the motor generator 4. Thereby, the motor generator 3 is driven to generate a predetermined torque. At the time of regenerative braking of the vehicle, in response to the rotational force of the vehicle wheels, the inverter 8 can convert the three-phase AC voltage generated by the motor generator 4 into the direct voltage in accordance with the switching control by the control circuit portion 9, and output the direct voltage to the VH line 12H. In such a manner, the inverter 8 performs bidirectional electric power conversion between the converter 6 and the motor generator 4.

The control circuit portion 9 generates the drive instruction for operating the switching elements of the inverters 7 and 8, and outputs the drive instruction to a drive circuit portion (driver) (not shown). The control circuit portion 9 generates the drive instruction based on a torque request input from a higher-level ECU (not shown) or signals detected by various sensors.

The various sensors include a current sensor that detects a phase current flowing in the wiring of each phase of each of the motor generators 3 and 4, a rotation angle sensor that detects a rotation angle of the rotors of each of the motor generators 3 and 4, a voltage sensor that detects a both end voltage of the smoothing capacitor C2, that is, the voltage of the VH line 12H, a voltage sensor that detects a both end voltage of the filter capacitor C3, that is, the voltage of the VL line 12L, and a current sensor that is provided at the boost wiring 14 and detects the current flowing in the reactors R1 and R2. The electric power conversion device 5 has these sensors (not shown). Specifically, the control circuit portion 9 outputs a PWM signal as the drive instruction. The control circuit portion 9 includes, for example, a microcomputer. The drive circuit portion generates the drive signal based on the drive instruction from the control circuit portion 9, and outputs the drive instruction to the gate electrode of switching elements Q1 and Q2 of the corresponding upper-lower arm circuit 10. Thereby, the switching elements Q1 and Q2 are driven, that is, turned on and off. In the present embodiment, the drive circuit portion is placed for each upper-lower arm circuit 10.

Next, before the electric power conversion device 5 is described, the semiconductor device 20 and the power module 110 including the semiconductor device 20 will be described. The semiconductor device 20 and the power module 110 are the components of the electric power conversion device 5.

(Semiconductor Device)

One example of the semiconductor device 20 applicable to the electric power conversion device 5 of the present embodiment will be described. The semiconductor device 20 described below configures one of the upper-lower arm circuit 10, that is, one arm. That is, the upper-lower arm circuit 10 are configured by the two semiconductor devices. Since such a semiconductor device 20 is packaged in element units configuring one arm, the semiconductor device 20 is also referred to as one-in-one package. The semiconductor device 20 has a basic configuration same as the upper arm 10U and the lower arm 10L, for example, can be the common part.

Figure 3:
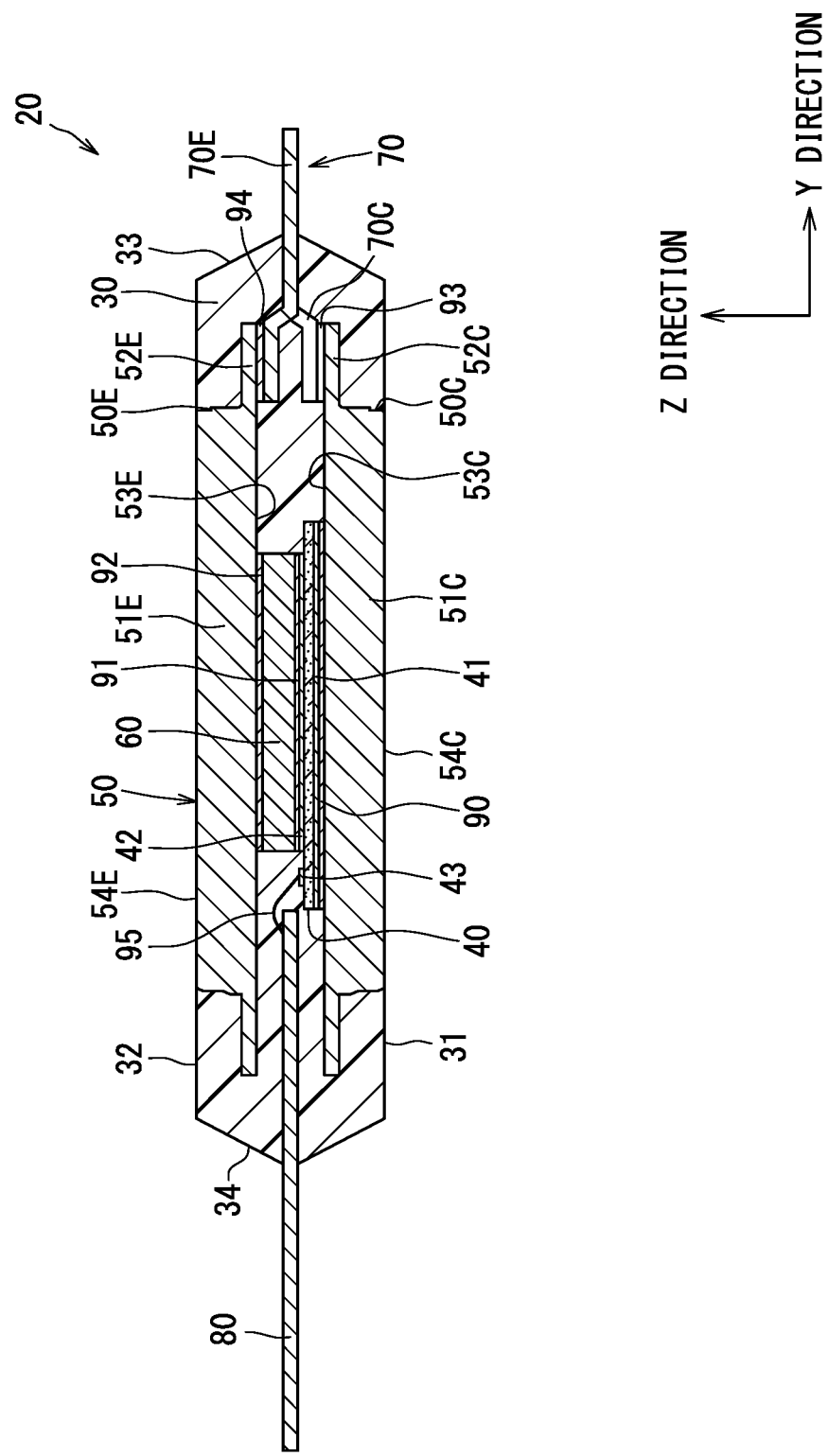
FIG. 3 is a cross-sectional view along a III-III line in FIG. 2.
Figure 4:
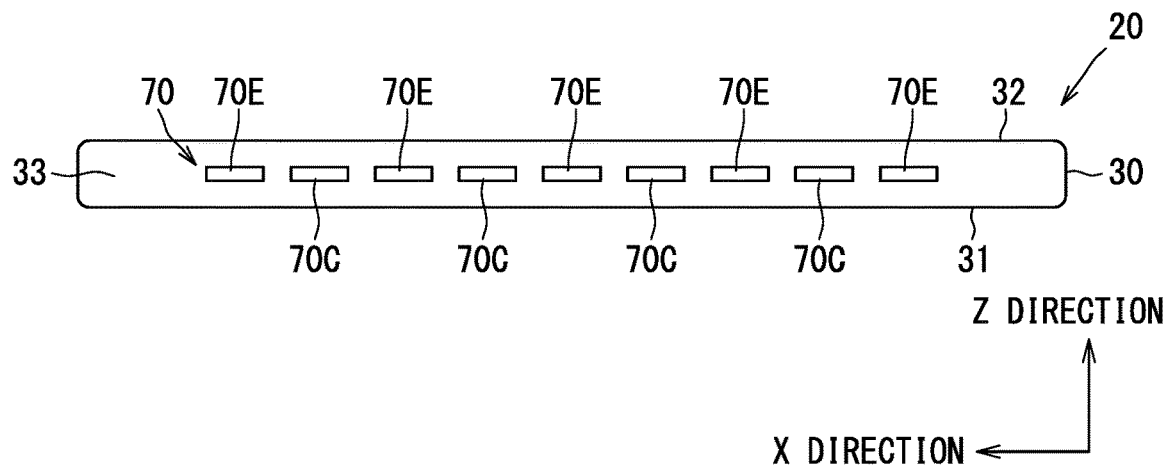
FIG. 4 is a plan view of the semiconductor device seen from a main terminal side.
Figure 5:
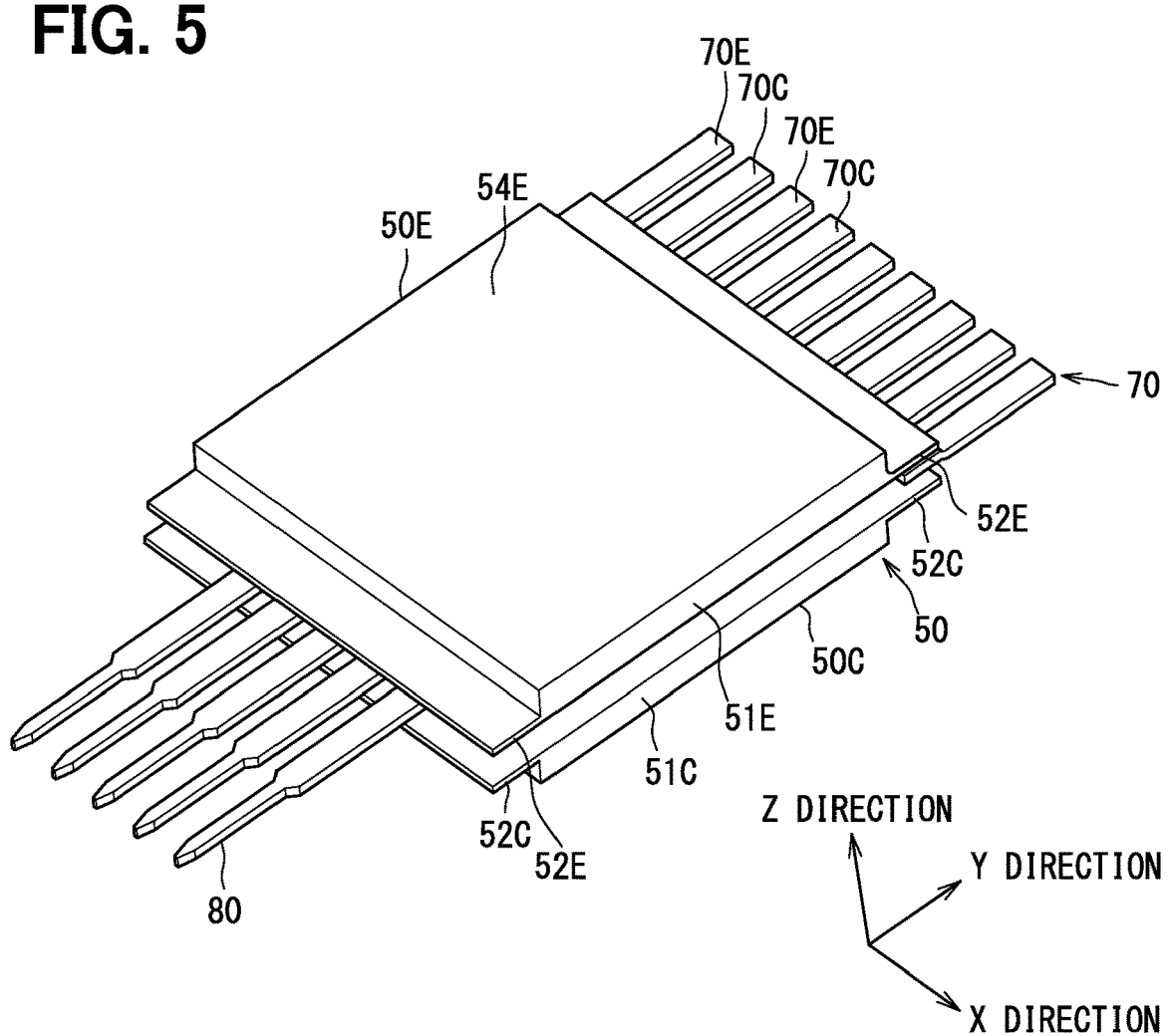
FIG. 5 is a view obtained by omitting a sealing resin body from FIG. 2.
Figure 6:
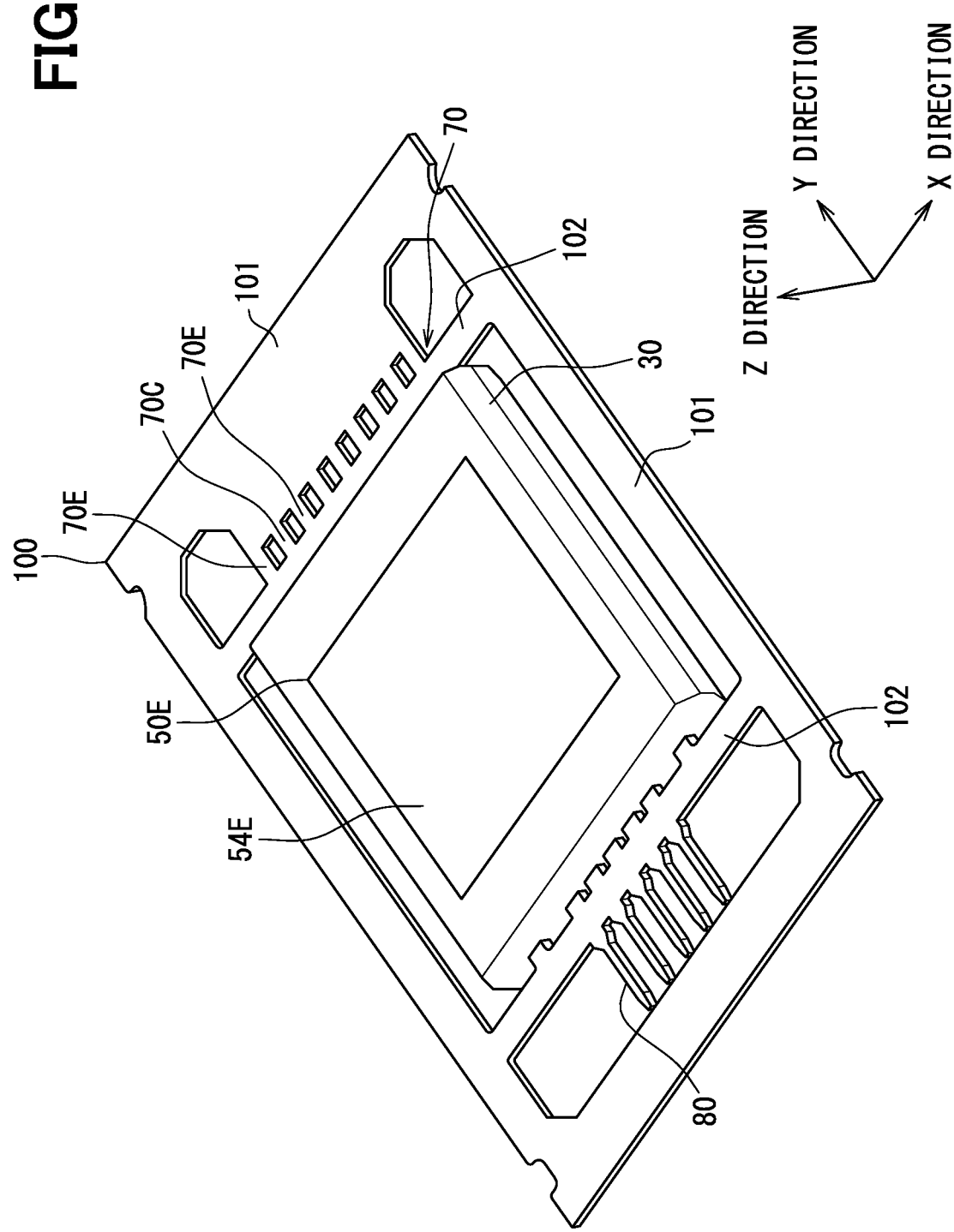
FIG. 6 is a perspective view before an unnecessary portion of a lead frame is cut.
Figure 7:
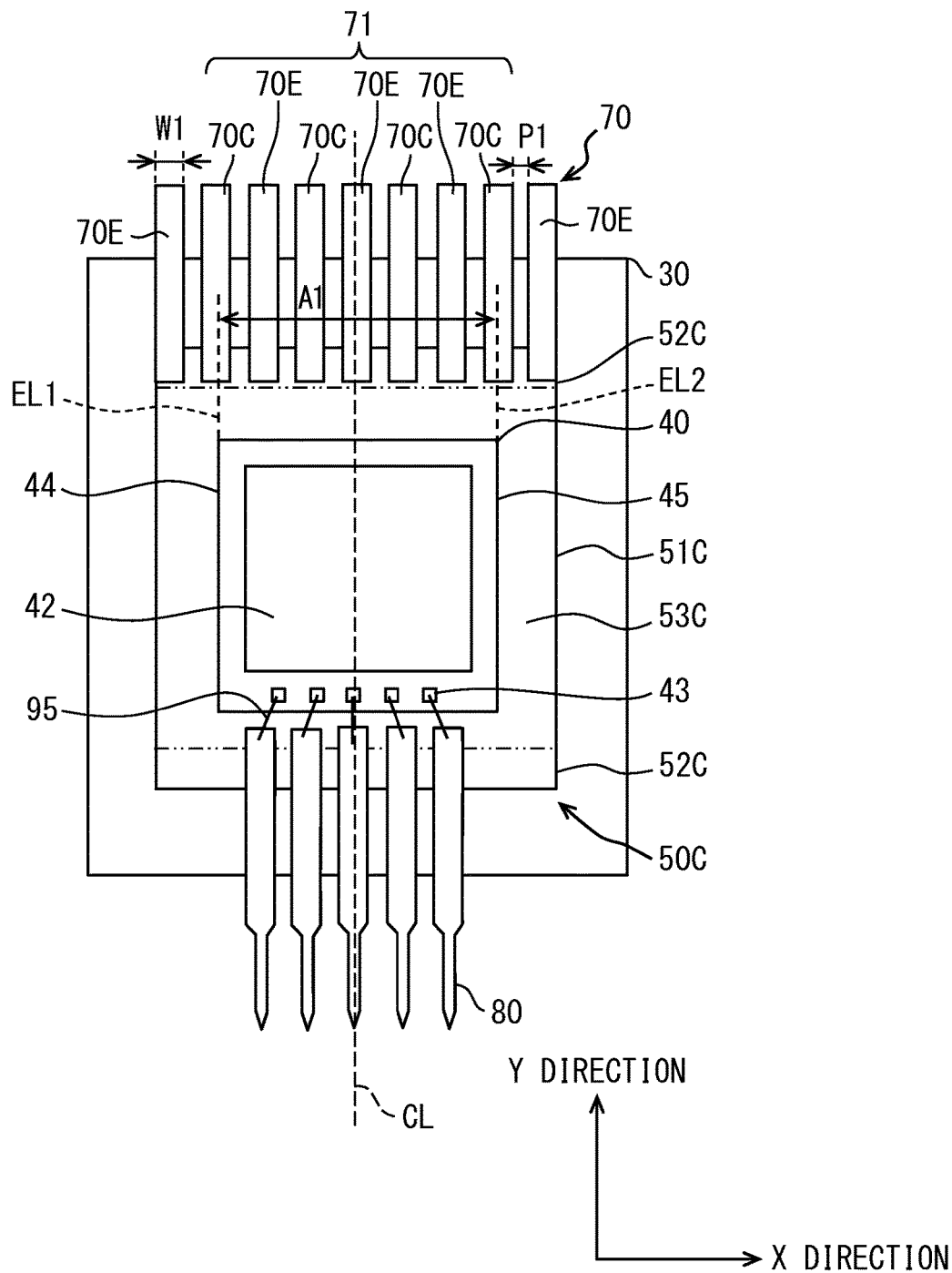
FIG. 7 is a plan view showing a positional relationship between an IGBT and the main terminal.

As shown in FIGS. 2 to 7, the semiconductor device 20 includes a sealing resin body 30, a semiconductor chip 40, a conductive member 50, a terminal 60, a main terminal 70, and a signal terminal 80. FIG. 5 is a view in which the sealing resin body 30 is omitted from FIG. 2. FIG. 6 shows a state where the sealing resin body 30 was molded and an unnecessary portion of a lead frame 100 is not removed. FIG. 7 is a plan view showing a positional relationship between the semiconductor chip 40 and the main terminal 70. In FIG. 7, a part of the sealing resin body 30, a conductive member 50E, and the terminal 60 are omitted.

In a state where the power module 110 including the semiconductor device 20 is placed at the cooler 230 described later, a plate thickness direction of the semiconductor chip 40 is substantially parallel with a Z direction that is a thickness direction of the heat exchange portion 233 of the cooler 230. An arrangement direction of the multiple main terminals 70 and an arrangement direction of multiple signal terminals 80 are substantially parallel with an X direction that is an arrangement direction of the multiple power modules 110. Therefore, also in the following description, the plate thickness direction of the semiconductor chip 40 is shown as the Z direction, and the arrangement direction of the main terminal 70 or the signal terminal 80 is shown as the X direction.

Figure 2:
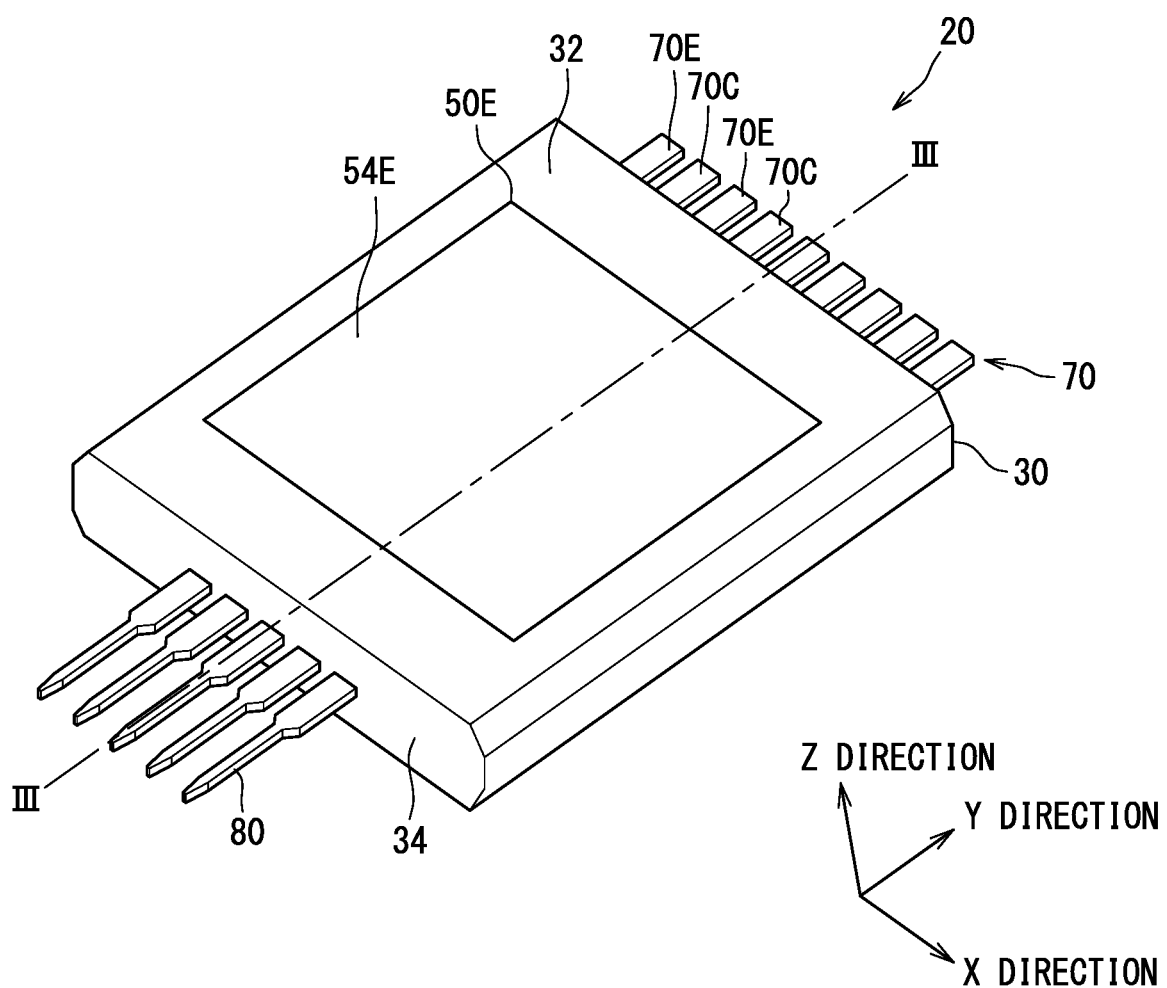
FIG. 2 is a perspective view showing a semiconductor device.

The sealing resin body 30 is made of, for example, an epoxy resin. The sealing resin body 30 is formed by, for example, a transfer molding method. As shown in FIGS. 2 to 4, the sealing resin body 30 has a first surface 31 and a second surface 32 opposite to the first surface 31 in the plate thickness direction of the semiconductor chip 40 in parallel to the Z direction. The first surface 31 and the second surface 32 are, for example, flat surfaces. The sealing resin body 30 has a lateral surface connecting the first surface 31 and the second surface 32. In the present example, the sealing resin body 30 has a substantially rectangular shape in a plan view.

The semiconductor chip 40 is provided by forming the element on a semiconductor substrate such as Si, SiC, or GaN. The semiconductor device 20 includes one semiconductor chip 40. On the semiconductor chip 40, elements (switching element and diode) configuring one arm is formed. That is, an RC (reverse conducting)-IGBT fi formed as the element. For example, when the element is used as the upper arm 10U, the element formed on the semiconductor chip 40 functions as the switching element Q1 and the diode D1. When the element is used as the lower arm 10L, the element formed on the semiconductor chip 40 functions as the switching element Q2 and the diode D2.

The element has a vertical structure so that the main current flows in the Z direction. The element has the gate electrode (not shown). The gate electrode has a trench structure. As shown in FIG. 3, the semiconductor chip 40 has a main electrode on each surface in the Z direction. Specifically, the semiconductor chip 40 has, as the main electrode, a collector electrode 41 on one surface, and has, as the main electrode, an emitter electrode 42 on a back surface opposite to the one surface. The collector electrode 41 also serves as a cathode electrode of the diode, and the emitter electrode 42 also serves as an anode electrode of the diode. The collector electrode 41 is formed on almost the entire of the one surface. The emitter electrode 42 is formed on a part of the back surface.

As shown in FIG. 3 and FIG. 7, the semiconductor chip 40 has a pad 43 that is an electrode for signal and is placed on the back surface where the emitter electrode 42 is formed. The pad 43 is formed at a position different from the emitter electrode 42. The pad 43 is electrically separated from the emitter electrode 42. The pad 43 is formed at an end on the side opposite to the formation region of the emitter electrode 42 in the Y direction.

In the present example, the semiconductor chip 40 has five pads 43. Specifically, the five pads 43 are provided for a gate electrode, a Kelvin emitter for detecting a potential of the emitter electrode 42, a current sense, an anode potential of a temperature sensor (temperature-sensitive diode) for detecting a temperature of the semiconductor chip 40, and a cathode potential. The five pads 43 are collectively formed on one end side in the Y direction in the semiconductor chip 40 having a substantially rectangular planar shape, and are formed side by side in the X direction.

The conductive member 50 electrically relays the semiconductor chip 40 and the main terminal 70. That is, the conductive member 50 functions as a wiring for the main electrode. In the present example, the conductive member also functions to radiate a heat of the semiconductor chip 40 (element) to the outside of the semiconductor device 20.

Therefore, the conductive member 50 is also referred to as a heat sink. The conductive member 50 is formed of at least a metal material such as Cu for securing an electrical conductivity and a thermal conductivity.

The conductive members 50 are placed in pairs so as to sandwich the semiconductor chip 40. Each of the conductive members 50 is placed so as to encompass the semiconductor chip 40 in a projection view from the Z direction. The semiconductor device 20 has, as the pair of the conductive members 50, a conductive member 50C placed close to the collector electrode 41 of the semiconductor chip 40 and a conductive member 50E placed close to the emitter electrode 42. The conductive member 50C electrically relays the collector electrode 41 and a main terminal 70C described later. The conductive member 50E electrically relays the emitter electrode 42 and a main terminal 70E described later.

As shown in FIG. 3, FIG. 5, and FIG. 7, the conductive member 50C has a main portion 51C that is a thick portion in the Z direction and an extension portion 52C that is a portion thinner than the main portion 51C. The main portion 51C has a substantially planar shape having a substantially constant thickness. The main portion 51C has a mounting surface 53C close to the semiconductor chip 40 in the Z direction and a heat radiation surface 54C opposite to the mounting surface 53C. The extension portion 52C extends from the end of the main portion 51C in the Y direction. The extension portion 52C extends in the Y direction with the same length in the X direction, that is, the same width as the main portion 51C. A surface of the extension portion 52C close to the semiconductor chip 40 is substantially flush with the mounting surface 53C of the main portion 51C. An opposite surface far from the semiconductor chip 40 is sealed by the sealing resin body 30. The extension portion 52C may be provided at, at least, the end close to the arrangement position of the main terminal 70. In the present example, the extension portion 52C is placed at each of the both ends of the main portion 51C. In FIG. 7, a boundary between the main portion 51C and the extension portion 52C is shown by a long dashed double-dotted line.

As shown in FIG. 3 and FIG. 5, the conductive member 50E has a main portion 51E that is a thick portion in the Z direction and an extension portion 52E that is a portion thinner than the main portion 51E. The main portion 51E has the substantially planar shape having the substantially constant thickness. The main portion 51E has a mounting surface 53E close to the semiconductor chip 40 in the Z direction and a heat radiation surface 54E opposite to the mounting surface 53C. The extension portion 52E extends from the end of the main portion 51E in the Y direction. The extension portion 52E extends in the Y direction with the same length in the X direction, that is, the same width as the main portion 51E. A surface of the extension portion 52E close to the semiconductor chip 40 is substantially flush with the mounting surface 53E of the main portion 51E. An opposite surface far from the semiconductor chip 40 is sealed by the sealing resin body 30. The extension portion 52E may be provided at, at least, the end close to the arrangement position of the main terminal 70. In the present example, the extension portion 52E is placed at each of the both ends of the main portion 51E. In the present example, common parts are employed as the conductive members 50C and 50E.

The mounting surface 53C in the main portion 51C of the conductive member 50C is connected to the collector electrode 41 of the semiconductor chip 40 via a solder 90. The connection method is not limited to solder joining. Most of the conductive member 50C is covered with the sealing resin body 30. The heat radiation surface 54C of the conductive member 50C is exposed from the sealing resin body 30. The heat radiation surface 54C is substantially flush with the first surface 31. In the surface of the conductive member 50C, a portion other than a connection portion with the solder 90, the heat radiation surface 54C, and a portion that continues from the main terminal 70 is covered with the sealing resin body 30.

The terminal 60 is placed between the semiconductor chip 40 and the conductive member 50E. The terminal 60 has a substantially rectangular shape, and the planar shape (planar substantially rectangular shape) substantially conform with the emitter electrode 42. Since the terminal 60 is positioned in the middle of the electric conductive path between the emitter electrode 42 of the semiconductor chip 40 and the conductive member 50E and the thermal conductive path, the terminal 60 is formed of at least the metal material such as Cu for securing the electric conductivity and the thermal conductivity. The terminal 60 is placed to face the emitter electrode 42 and is connected to the emitter electrode 42 via a solder 91. The connection method is not particularly limited to solder joining. The terminal 60 may be configured as a part of the lead frame 100 described later.

The mounting surface 53E in the main portion 51E of the conductive member 50E is electrically connected to the emitter electrode 42 of the semiconductor chip 40 via a solder 92. Specifically, the conductive member 50E and the terminal 60 are connected via the solder 92. The emitter electrode 42 and the conductive member 50E are electrically connected via the solder 91, the terminal 60, and the solder 92. Most of the conductive member 50E are covered with the sealing resin body 30. The heat radiation surface 54E of the conductive member 50E is exposed from the sealing resin body 30. The heat radiation surface 54E is substantially flush with the second surface 32. In the surface of the conductive member 50E, a portion other than a connection portion with the solder 92 and portions that continue from the heat radiation surface 54E and the main terminal 70 are covered with the sealing resin body 30.

The main terminals 70 are terminals via which the main current flows among external connection terminals for electrically connecting the semiconductor device 20 and an external device. The semiconductor device 20 includes the multiple main terminals 70. The main terminal 70 is connected to the corresponding conductive member 50. By processing the same metal member, the main terminal 70 may be integrally placed with the conductive member 50. The main terminal 70 as the different member may be connected, and thereby may continue from the conductive member 50. In the present example, as shown in FIG. 6, the main terminal 70 is configured as a portion of the lead frame 100 together with the signal terminal 80, and is a member different from the conductive member 50. As shown in FIG. 3, the main terminal 70 is connected to the corresponding conductive member 50 in the sealing resin body 30.

As shown in FIG. 3 and FIG. 4, each of the main terminals 70 extends from the corresponding conductive member 50 in the Y direction, and protrudes from one lateral surface 33 of the sealing resin body 30 to the outside. The main terminal 70 extends from the inside of the sealing resin body 30 to the outside. The main terminal 70 is a terminal electrically connected to the main electrode of the semiconductor chip 40. The semiconductor device 20 includes, as the main terminals 70, a main terminal 70C electrically connected to the collector electrode 41 and a main terminal 70E electrically connected to the emitter electrode 42. The main terminal 70C is also referred to as the collector terminal, and the main terminal 70E is also referred to as the emitter terminal.

The main terminal 70C is connected to the conductive member 50C. Specifically, the main terminal 70C is connected to a surface of one extension portion 52C via a solder 93, the one surface being close to the semiconductor chip 40. The connection method is not particularly limited to solder joining. The main terminal 70C extends in the Y direction from the conductive member 50C and protrudes outward from the lateral surface 33 of the sealing resin body 30. The main terminal 70E is connected to the conductive member 50E. Specifically, the main terminal 70C is connected to one surface of one extension portion 52E via a solder 94, the one surface being close to the semiconductor chip 40. The connection method is not particularly limited to solder joining. The main terminal 70E extends from the conductive member 50E in the Y direction that is the same direction as that of the main terminal 70C, and protrudes outward from the same lateral surface 33 as that of the main terminal 70C, as shown in FIGS. 3 and 4. Details of the main terminals 70C and 70E will be described later.

The signal terminals 80 are connected to the respective pads 43 of the semiconductor chip 40. The semiconductor device 20 includes the multiple signal terminals 80. In the present example, the multiple signal terminals are connected via a bonding wire 95. The signal terminal 80 is connected to the bonding wire 95 inside the sealing resin body 30. Five signal terminals 80 connected to the pads 43 extend in the Y direction, and protrude from the lateral surface 33 and a lateral surface 34 opposite to the lateral surface 33 in the sealing resin body 30 to the outside. The signal terminal 80 is configured as a part of the lead frame 100. The signal terminal 80 may be integrally placed with the conductive member 50C together with the main terminal 70C by processing the same metal member.

The lead frame 100 includes an outer peripheral frame portion 101 and a tie bar 102 in a state before cutting, as shown in FIG. 6. Each of the main terminals 70 and each of the signal terminals 80 are fixed to the outer peripheral frame portion 101 via the tie bar 102. After the sealing resin body 30 is molded, an unnecessary portion of the lead frame 100 such as the outer peripheral frame portion 101 or the tie bar 102 is removed. Thereby, the main terminal 70 and the signal terminal 80 are electrically separated. The semiconductor device 20 is obtained. As the lead frame 100, either a material having a constant thickness or a deformed material having a non-constant thickness can be employed.

In the semiconductor device 20 configured as described above, the sealing resin body 30 integrally seals a part of each of the semiconductor chip 40 and the conductive member 50 and a part of each of the terminal 60, the main terminal 70, and the signal terminal 80. That is, elements configuring one arm are sealed. Therefore, the semiconductor device 20 is also referred to as "1-in-1 package".

The heat radiation surface 54C of the conductive member 50C is substantially flush with the first surface 31 of the sealing resin body 30. The heat radiation surface 54E of the conductive member 50E is substantially flush with the second surface 32 of the sealing resin body 30. The semiconductor device 20 has a double-sided heat radiation structure in which the heat radiation surfaces 54C and 54E are both exposed from the sealing resin body 30. The semiconductor device 20 can be formed, for example, by cutting the conductive member 50 together with the sealing resin body 30. The heat radiation surfaces 54C and 54E can also be formed by molding the sealing resin body 30 so as to be in contact with a cavity wall surface of a mold for molding the sealing resin body 30.

Next, the main terminal 70 will be described in detail.

The main terminal 70 includes at least one of the main terminal 70C or the main terminal 70E. The main terminal 70C and the main terminal 70E are arranged in the X direction that is the plate width direction of the main terminal 70 so that plate surfaces of the main terminal 70C and the main terminal 70E do not face each other and lateral surfaces of the main terminal 70C and the lateral surface of the main terminal 70E face each other. The semiconductor device 20 includes multiple lateral surface facing portions formed by the adjacent main terminals 70C and 70E. The plate surface is a surface in the plate thickness direction of the main terminal 70 among the surfaces of the main terminal 70. The lateral surface is a surface that connects the plate surfaces and is along the extension direction of the main terminal 70. The remaining surfaces of the main terminal 70 are both end surfaces in the extension direction, that is, a protrusion tip surface and a rear end surface. At least a part of the lateral surfaces configuring the lateral surface facing portion may face with each other in the plate thickness direction of the main terminal 70. For example, the lateral surfaces may be placed so as to shift in the plate thickness direction. However, it is more effective to face each other all over. It is sufficient that, at least, the facing surfaces face each other. It is preferable that the surfaces are substantially parallel to each other. A completely parallel state is more preferable.

An area of the lateral surface of the main terminal 70 is smaller than that of the plate surface. The main terminals 70C and the 70E are placed so as to be adjacent to each other. By being adjacent to each other, the main terminal 70C and the main terminal 70E are alternately arranged in a configuration including the multiple main terminals 70C and 70E. The main terminals 70C and 70E are arranged in order.

As shown in FIG. 7, a main terminal group 71 includes three or more main terminals 70 continuously arranged in the X direction. The main terminals 70C and 70E are arranged next to each other, the main terminal group 71 includes both of the main terminals 70C and 70E, and at least one of the number of main terminals 70C or the number of main terminals 70E is two or more. At least a part of each main terminal 70 configuring the main terminal group 71 is placed in a predetermined region A1. The region A1 is a region between, in the X direction, an extension line EL1 virtually extending from one end surface 44 of the semiconductor chip 40 and an extension line EL2 virtually extending from an end surface 45 opposite to the end surface 44. In the X direction, a length between the extension lines EL1 and EL2 conforms with a width of the semiconductor chip 40, that is, an element width.

In the present example, the main terminals 70C and 70E extend in the same direction (Y direction) over their entire length. The main terminal 70 has a straight plane shape, and does not have an extension portion in the X direction. The thickness of the main terminal 70C is thinner than that of the main portion 51C, and, for example, is almost same as that of the extension portion 52C. The thickness of the main terminal 70E is thinner than that of the main portion 51E, and, for example, is almost same as that of the extension portion 52E. The thickness of the main terminal 70 is, overall, substantially constant, and the main terminals 70C and 70E have substantially the same thickness. A width W1 of the main terminals 70 is, overall, substantially constant, and the main terminals 70C and 70E have the same width. An interval P1 between the adjacent main terminals 70 in the X direction is also the same for all the main terminals 70. The interval P1 is also referred to as an inter-terminal pitch.

Each of the main terminals 70 has two bent portions in the sealing resin body 30. Thereby, the main terminal 70 has a substantially crank shape in a ZY plane. In the main terminal 70, a portion close to the tip as compared with the bent portion has a flat plate shape, and a part of the flat plate shaped portion protrudes from the sealing resin body 30. In the protrusion portion from the sealing resin body 30, that is, the flat plate shaped portion, the main terminals 70C and 70E are placed at substantially the same positions in the Z direction, as shown in FIGS. 3 and 4. In the flat plate shaped portion, the thickness directions of the main terminals 70C and 70E substantially conform with the Z direction. Thereby, almost the entire region of the lateral surface of the main terminal 70C and almost the entire region of the lateral surface of the main terminal 70E face each other in the Z direction. Further, the extension lengths of the flat shaped portions of the main terminals 70C and 70E are substantially the same. The main terminals 70C and the main terminal 70E are placed at substantially the same positions in the Y direction. Thereby, almost the entire regions of the flat shaped portions of the lateral surfaces of the main terminals 70C and 70E face each other.

As shown in FIG. 2, FIGS. 5 to 7, the semiconductor device 20 includes an odd number of main terminals 70, specifically, nine main terminals 70. Four of the nine main terminals 70 are the main terminals 70C, and the remaining five are the main terminals 70E. The main terminals 70C and 70E are alternately placed in the X direction. Thereby, the semiconductor device 20 has eight lateral surface facing portions. At the both ends in the X direction, the main terminals 70E are placed, and the main terminal group 71 includes seven main terminals 70 other than the main terminal 70E placed at the both ends. The main terminal group 71 includes an odd number of (seven) main terminals 70, specifically, four main terminals 70C and three main terminals 70E. The entire region of each of the two main terminals 70E that does not configure the main terminal group 71 is placed outside the region A in the X direction. The number of main terminals 70 that configures the main terminal group 71 is larger than the number of main terminals 70 that does not configure the main terminal group 71.

Among the seven main terminals 70 included in the main terminal group 71, a part of each of the two main terminals 70C positioned at both ends is placed in the region A1 in the X direction. The entire region of each of the remaining five main terminals 70 is placed in the region A1 in the X direction. In such a manner, some of the main terminals 70 configuring the main terminal group 71 are entirely placed in the region A1, and the remaining main terminals 70 are partially placed in the region A1. In particular, in the present example, each of the multiple (five) main terminals 70 configuring the main terminal group 71 is entirely placed in the region A1.

The main terminals 70C and 70E have the same width W1, and the interval P1 between the main terminals 70C and 70E is also the same for all the main terminals 70. A center of the width of the main terminal 70E placed at the center in the X direction among the odd number of main terminals 70 is positioned on a center line CL passing through the center of the semiconductor chip 40. In such a manner, the main terminals 70C and 70E are placed symmetrically with respect to the center line CL passing through the center of the semiconductor chip 40 in the X direction. The multiple main terminals 70C are placed symmetrically with respect to the center line CL, and the main terminal 70E are placed symmetrically with respect to the center line CL. The odd number of main terminals 70 included in the main terminal group 71 are placed symmetrically with respect to the center line CL. The extension direction of the center line CL is orthogonal to the Z direction and the X direction.

Next, the effects of the semiconductor device 20 will be described.

In the semiconductor device 20, at least one of the number of main terminals 70C or the number of main terminals 70E are multiple, and the main terminals 70C and 70E are placed adjacent to each other in the X direction. The lateral surfaces of the adjacent main terminals 70C and 70E face each other. the direction of the main current at the main terminal 70C is opposite to that at the main terminal 70E. In the such a manner, the main terminals 70C and 70E are placed so as to cancel the magnetic fluxes generated when the main current flows. Therefore, it may be possible to reduce the inductance. In particular, in the present example, since the multiple lateral surface facing portions of the main terminals 70C and 70E are provided, it may be possible to effectively reduce the inductance. Since the multiple main terminals 70 having the same type are placed in parallel, it may be possible to reduce the inductance.

The main terminal group 71 includes at least three main terminals 70 continuously arranged. At least a part of each main terminal 70 configuring the main terminal group 71 is placed in the region A1 between, in the X direction, the extension lines EL1 and EL2 that extend from the both end surfaces 44 and 45 of the semiconductor chip 40. That is, the multiple lateral surface facing portions are placed in the region A1. Thereby, it may be possible to simplify the current path between the main terminal 70 configuring the main terminal group 71 and the main electrode of the semiconductor chip 40, specifically, shorten the current path. Therefore, it may be possible to reduce the inductance.

As a result, according to the semiconductor device 20, it may be possible to further reduce the inductance of the main circuit wiring. The multiple main terminals 70 may be arranged in the X direction so that the lateral surfaces face each other. The main terminal group 71 may include at least three main terminals 70. The at least three main terminals 70 may include at least one of the multiple main terminals 70C or the main terminals 70E, and be continuously arranged. Partially, the main terminals 70 having the same type may be continuously arranged. Thereby, since at least one of the multiple main terminals 70C or the multiple main terminal 70E are placed in parallel, it may be possible to reduce the inductance. Since the main terminal group 71 is provided, it may be possible to simplify the current path between the main terminal 70 configuring the main terminal group 71 and the main electrode of the semiconductor chip 40. Thereby, it may be possible to reduce the inductance. Accordingly, the effects in accordance with the present example can be obtained. However, as shown in the present example, since the main terminals 70C and 70E are placed adjacent to each other, it may be possible to further reduce the inductance due to the effect of canceling the magnetic flux.

In the main terminal group 71, the main terminal 70 entirely placed in the region A1 in the X direction is more preferable in respect of the simplification of the current path as compared with the main terminal 70 partially placed in the region A1. In the present example, some of the main terminals 70 configuring the main terminal group 71 are entirely placed in the region A1, and the remaining main terminals 70 are partially placed in the region A1. Since the main terminal group 71 includes the main terminal 70 that is more effective for simplifying the current path, it may be possible to effectively reduce the inductance. In particular, in this example, the multiple main terminal 70 entirely placed in the region are included. Since the multiple main terminals 70 that are more effective for simplifying the current path are included, it may be possible to more effectively reduce the inductance.

In the present example, the number of main terminals 70 is odd. When the number is odd, it is easy to have symmetry in the X direction, and it may be possible to prevent the bias of the current path between the main terminal 70 and the semiconductor chip 40. The arrangement order of the main terminals 70 in the X direction is the same regardless of the viewpoint from the first surface 31 or the viewpoint from the second surface 32. Accordingly, it may be possible to improve freedom of placement of the semiconductor device 20.

In particular, in the present example, the main terminals 70C and 70E are placed symmetrically with respect to the center line CL of the semiconductor chip 40 in the X direction. Thereby, the main current of the semiconductor chip 40 symmetrically flows with respect to the center line CL. The main current flows almost evenly on the left side and the right side with respect to the center line CL. Accordingly, it may be possible to further reduce the inductance. In addition, it may be possible to suppress local heat generation.

Figure 8:
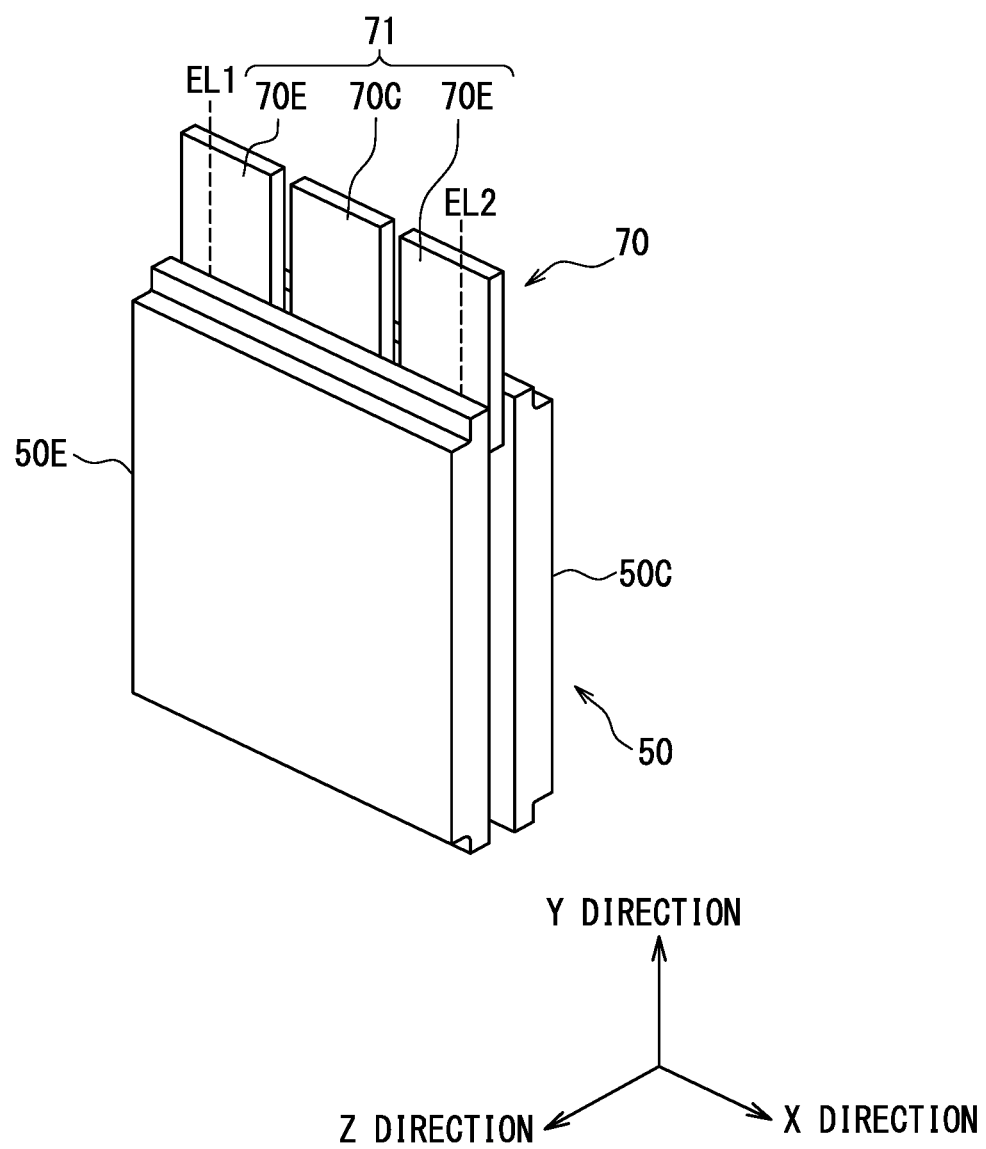
FIG. 8 is a perspective view showing another example of the semiconductor device.
Figure 9:
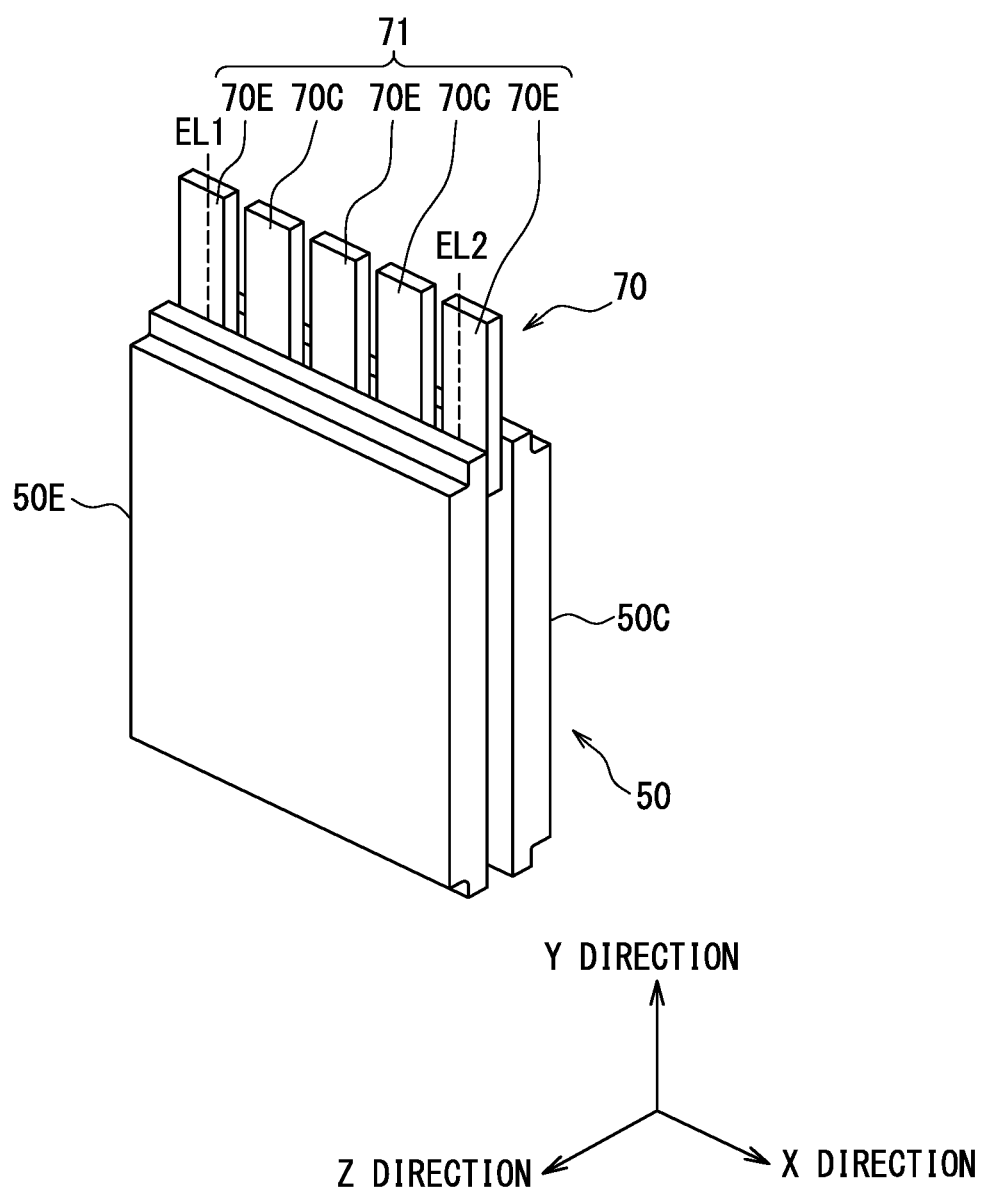
FIG. 9 is a perspective view showing another example of the semiconductor device.

FIGS. 8 to 10 show another example. In FIGS. 8 to 10, for convenience, the sealing resin body 30 and the signal terminal 80 are not shown. In FIGS. 8 to 10, for convenience, the region A1 is not shown, and the extension lines EL1 and EL2 defining the region A1 are shown.

In FIG. 8, the semiconductor device 20 includes three main terminals 70, specifically, one main terminal 70C and two main terminals 70E. That is, the semiconductor device includes two lateral surface facing portions. The main terminal group 71 includes all the main terminals 70. The main terminal 70C placed at the center is entirely placed, in the X direction, in the region A1. The main terminals 70E at the both ends are partially placed in the region A1.

In FIG. 9, the semiconductor device 20 includes five main terminals 70, specifically, two main terminals 70C and three main terminals 70E. That is, the semiconductor device includes four lateral surface facing portions. The main terminal group 71 includes all the main terminals 70. Each of the main terminals 70E at both ends is partially placed in the region A1. Each of the remaining three main terminals 70 is entirely placed in the region A1.

In FIG. 10, the semiconductor device 20 includes seven main terminals 70, specifically, three main terminals 70C and four main terminals 70E. That is, the semiconductor device includes six lateral surface facing portions. The main terminal group 71 includes all the main terminals 70. Each of the main terminals 70E at both ends is partially placed in the region A1. Each of the remaining five main terminals 70 is entirely placed in the region A1.

Figure 11:
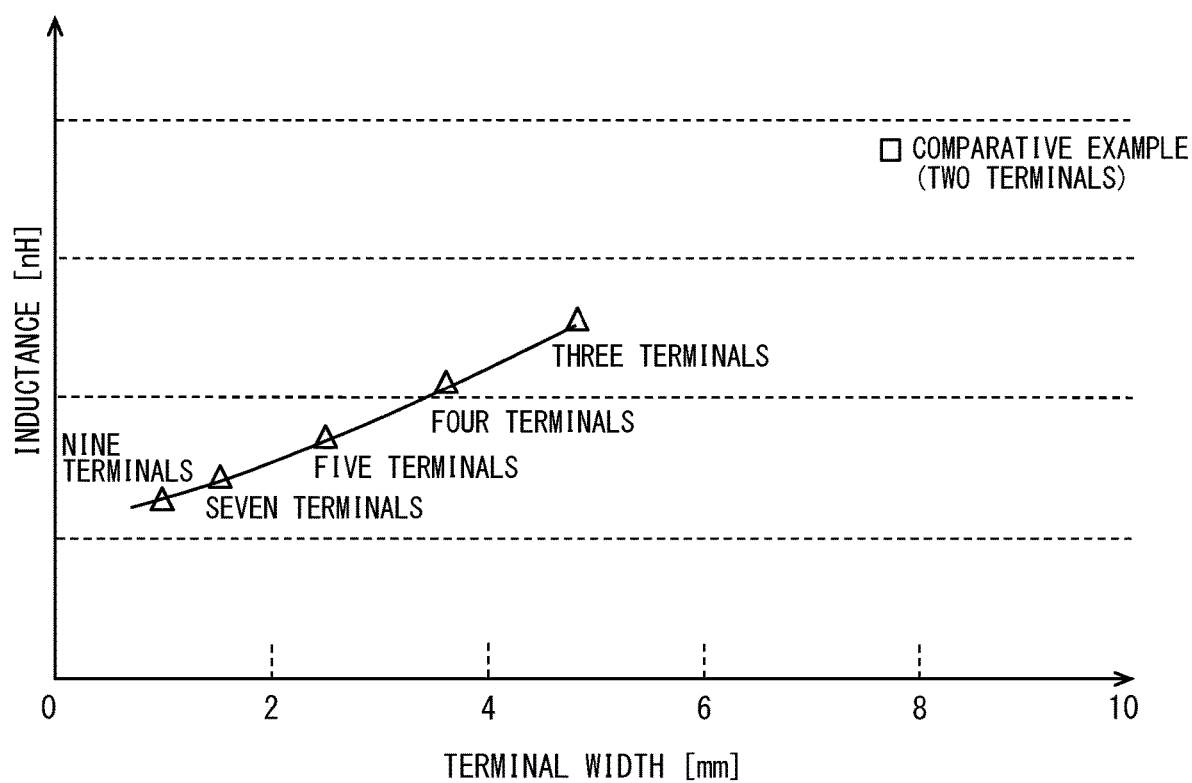
FIG. 11 is a diagram showing a magnetic analysis result of a total inductance of main terminals.

FIG. 11 shows a result obtained by magnetic field analysis for the total inductance of the main terminals of the semiconductor device 20 In this magnetic field analysis (simulation), a length (width) of the conductive member 50 in the X direction was set to 17 millimeters, and the interval P1 of the main terminal 70 was set to 1.0 millimeter. In the main terminals 70 configuring the same semiconductor device 20, the widths W1 are set to be equal to each other. For example, when the number of main terminals 70 is three, the configuration is shown as three terminals in FIG. 11 FIG. 11 shows, as a comparative example, a configuration (two terminals) including only two main terminals. The nine terminals is a result of the same arrangement as the configuration shown in FIG. 7. Similarly, the three terminals, the five terminals, and the seven terminals are results of the same arrangement as the configurations shown in FIGS. 8 to 10.

As the number of terminals increases, the width per terminal becomes narrower and the inductance (self-inductance) increases. However, the number of the lateral surface facing portions increases. The number of the main terminals 70 configuring the main terminal group 71 increases as the number of terminals increases up to the predetermined number of terminals. Therefore, it may be possible to reduce the inductance. As shown in FIGS. 8 to 10, when the number of terminals is three, five, or seven, the main terminal group 71 includes all the main terminal 70. That is, all the main terminals 70 are placed in the region A1. When the number of terminals is nine, as shown in FIG. 7, the main terminal group 71 includes seven main terminals 70.

From the results of FIG. 11, when the main terminal group 71 includes there or more main terminals 70, it is clear that the total inductance of the main terminals can be reduced as compared with the comparative example while the increase in the size is prevented. It is considered that, when the number of terminals is three or more, the effect of reducing the inductance exceeds the increase in inductance due to the decrease in the width, and the inductance is reduced. In particular, when the main terminal group 71 includes five or more main terminals 70, the inductance can be reduced by half or less as compared with the comparative example. That is, it is clearly effective in reducing the inductance.

The nine terminals include the seven main terminals 70 configuring the main terminal group 71 and the two main terminals 70 placed outside the region A1. Although the two main terminals 70 are placed outside the region A1 in such a manner, more main terminals 70 than main terminals 70 that do not configure the main terminal group 71, that is, most of the main terminals 70 are placed in the region A1. In addition, the number of lateral surface facing portions is also two more than that of the seven terminals. Accordingly, the inductance lower than that of the seven terminals is shown.

In the example described above, the example of the configuration in which the main terminals 70E are placed at both ends, that is, the configuration in which the number of main terminals 70E is larger than the number of main terminals 70C has been shown. However, it is not limited to this. In the configuration of the odd number of main terminals 70, the number of main terminals 70C may be larger than the number of main terminals 70E.

The example in which the lengths of the protrusion portions of all the main terminal 70 from the sealing resin body 30 are same has been shown. However, it is not limited to this. In consideration of connectivity with the bus bar or the like, the protrusion portions of the adjacent main terminals 70C and 70E may be different from each other. In another example shown in FIG. 12, the main terminal 70C is longer than the main terminal 70E.

Figure 12:
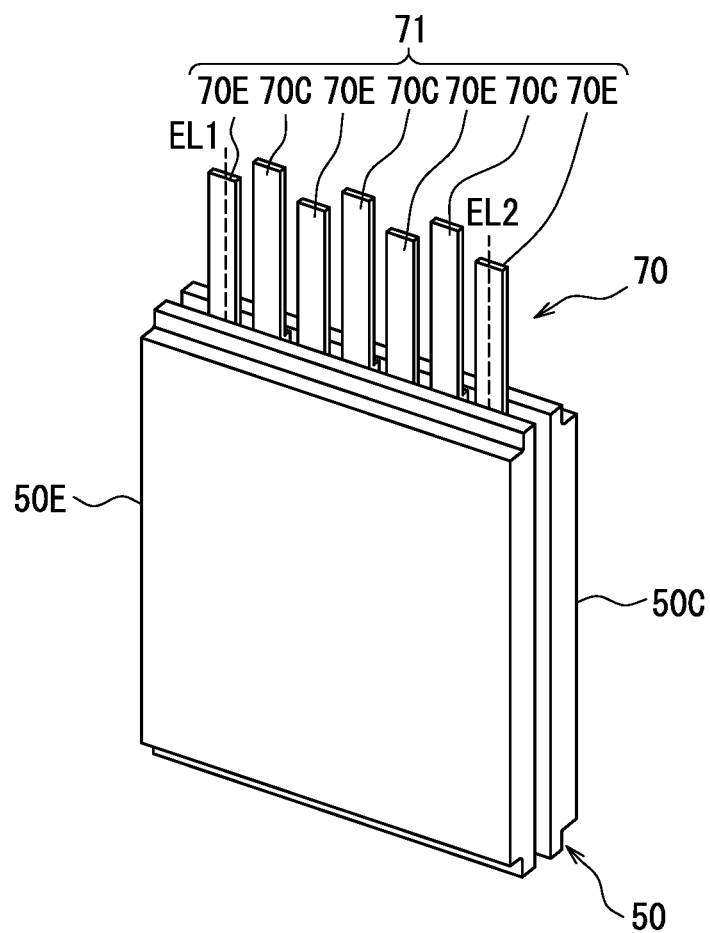
FIG. 12 is a perspective view showing another example of the semiconductor device.
Figure 13:
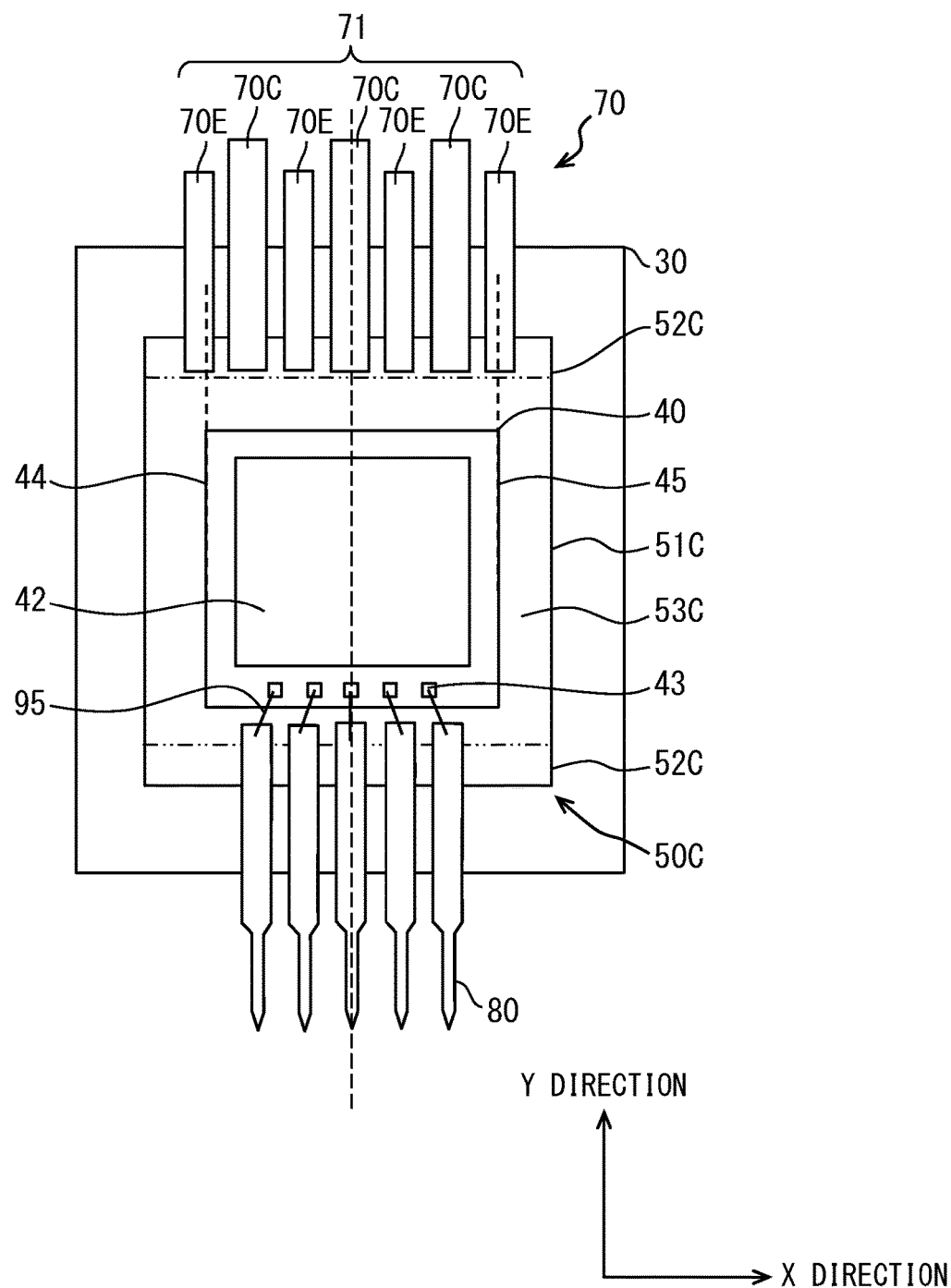
FIG. 13 is a plan view showing another example of the semiconductor device and corresponding to FIG. 7.

In another example shown in FIG. 13, the number of main terminals 70C is smaller than the number of main terminals 70E. A cross-sectional area of the main terminal 70C is larger than a cross-sectional area of the main terminal 70E. Thereby, the total impedance of the main terminal 70C and the total impedance of the main terminal 70E are substantially matched. Accordingly, it may be possible to suppress the heat generation of a small number of main terminals 70C. In FIG. 13, the cross-sectional area of the main terminal 70C is made larger than the cross-sectional area of the main terminal 70E by increasing the width. However, the thickness of the main terminal 70C may be thicker than that of the main terminal 70E. Both of the width and the thickness may be adjusted. In FIG. 13, the length of the small number of the main terminal 70C in the extension direction is longer than the length of the main terminal 70E. When the length is long, the cross-sectional area is large. Therefore, it may be possible to ensure the rigidity of the main terminal 70. FIG. 12 and FIG. 13 show the example of the seven terminals. However, it is not limited to this.

The example in which, at the protrusion portion from the sealing resin body 30, the adjacent main terminals 70C and 70E face each other entirely in the extension direction. However, it is not limited to this. At a part of the protrusion portion, the lateral surfaces may not face each other. For example, the protrusion tip portion of at least one of the main terminal 70C or the main terminal 70E is bent, and thereby the lateral surface may not face at the protrusion tip portion. Even when the extension lengths are the same, the connectivity with the bus bar or the like can be improved. However, the effect of reducing the inductance is reduced.

The example in which the number of main terminals 70 is odd and the number of main terminals 70 configuring the main terminal group 71 is odd has been shown. However, it is not limited to this. The main terminal group 71 may include an even number of (four or more) main terminals 70.

It is sufficient that the semiconductor device 20 includes at least one semiconductor chip 40. For example, in a configuration in which the semiconductor device 20 includes the multiple semiconductor chips 40 and these semiconductor chips 40 are connected in parallel between the main terminals 70C and 70E, the above described arrangement of the main terminals 70 may be applied to each semiconductor chip 40.

Figure 14:
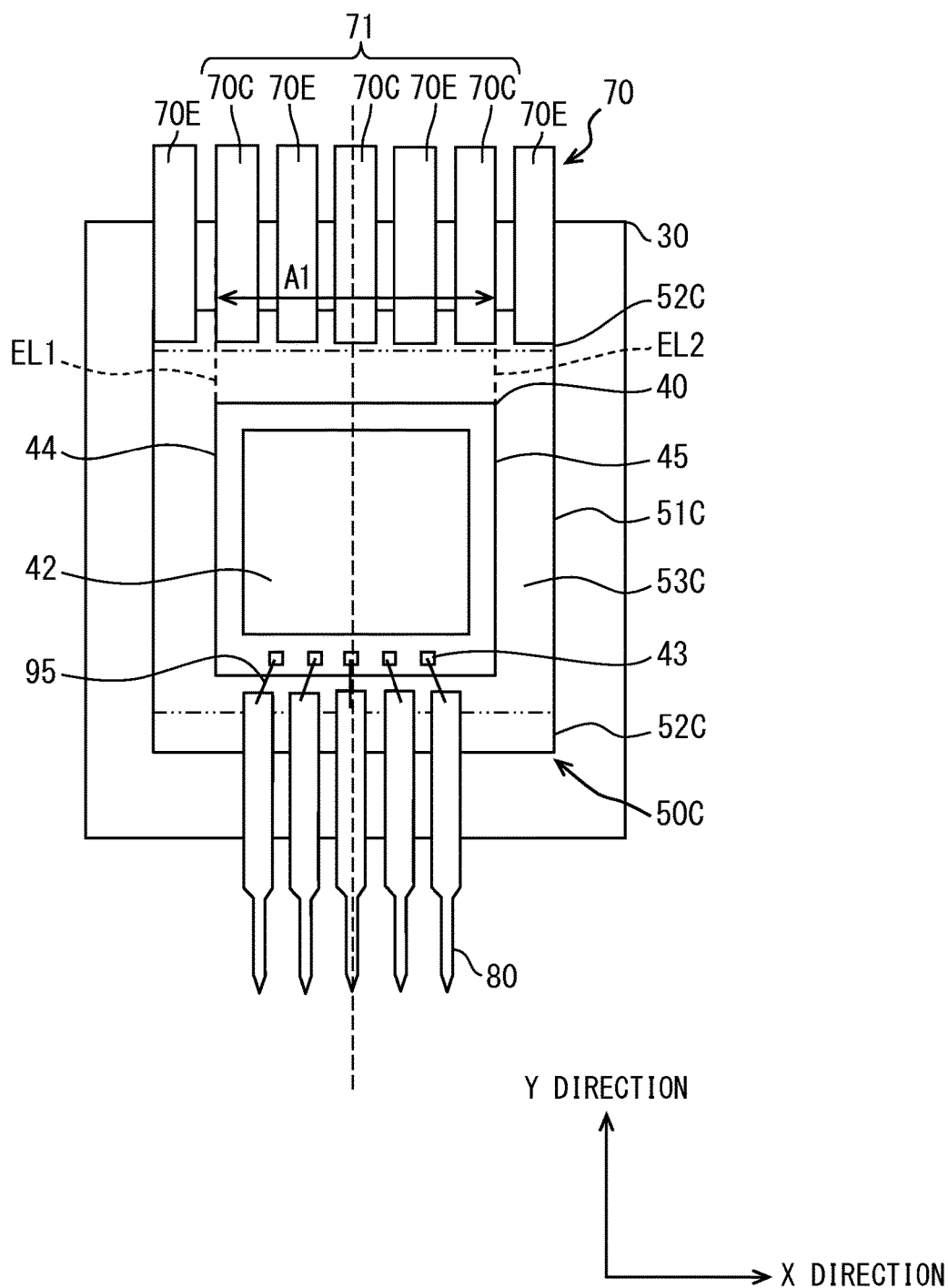
FIG. 14 is a plan view showing another example of the semiconductor device and corresponding to FIG. 7.

All the main terminals 70 configuring the main terminal group 71 are entirely in the region A1. In another example shown in FIG. 14, the main terminal group 71 includes five main terminals 70 among the seven main terminals 70. The five main terminals 70 configuring the main terminal group 71 are entirely placed in the region A1. Thereby, it may be possible to simplify the current path with the main electrode of the semiconductor chip 40.

An even number of (four or more) of main terminals 70 may be provided. In another example shown in FIG. 15, the semiconductor device 20 includes two main terminals 70C and two main terminal 70E. The main terminals 70C and the main terminals 70E are alternately placed. The width W1 and the thickness of the four main terminals 70 are equal to each other. That is, the cross-sectional areas orthogonal to the extension direction are equal to each other. The extension length in the Y direction of the four main terminals 70 is also equal to each other. All the main terminals 70 configure the main terminal group 71. The two main terminals 70C and 70E placed at both ends are partially placed in the region A1 in the X direction. The two main terminals 70C and 70E at the center are entirely placed in the region A1 in the X direction.

Even in the configuration, the multiple lateral surface facing portions of the main terminals 70C and 70E are provided. Therefore, it may be possible to effectively reduce the inductance. Since the main terminal group 71 is provided, it may be possible to simplify the current path between the main terminal 70 configuring the main terminal group 71 and the main electrode of the semiconductor chip 40, and reduce the inductance. As a result, the inductance of the main circuit wiring can be further reduced. FIG. 11 also shows the result of the four terminals. From the results of FIG. 11, even when the number of terminals is four, it is clear that the total inductance of the main terminals can be reduced as compared with the comparative example while the increase in the size is prevented.

Figure 15:
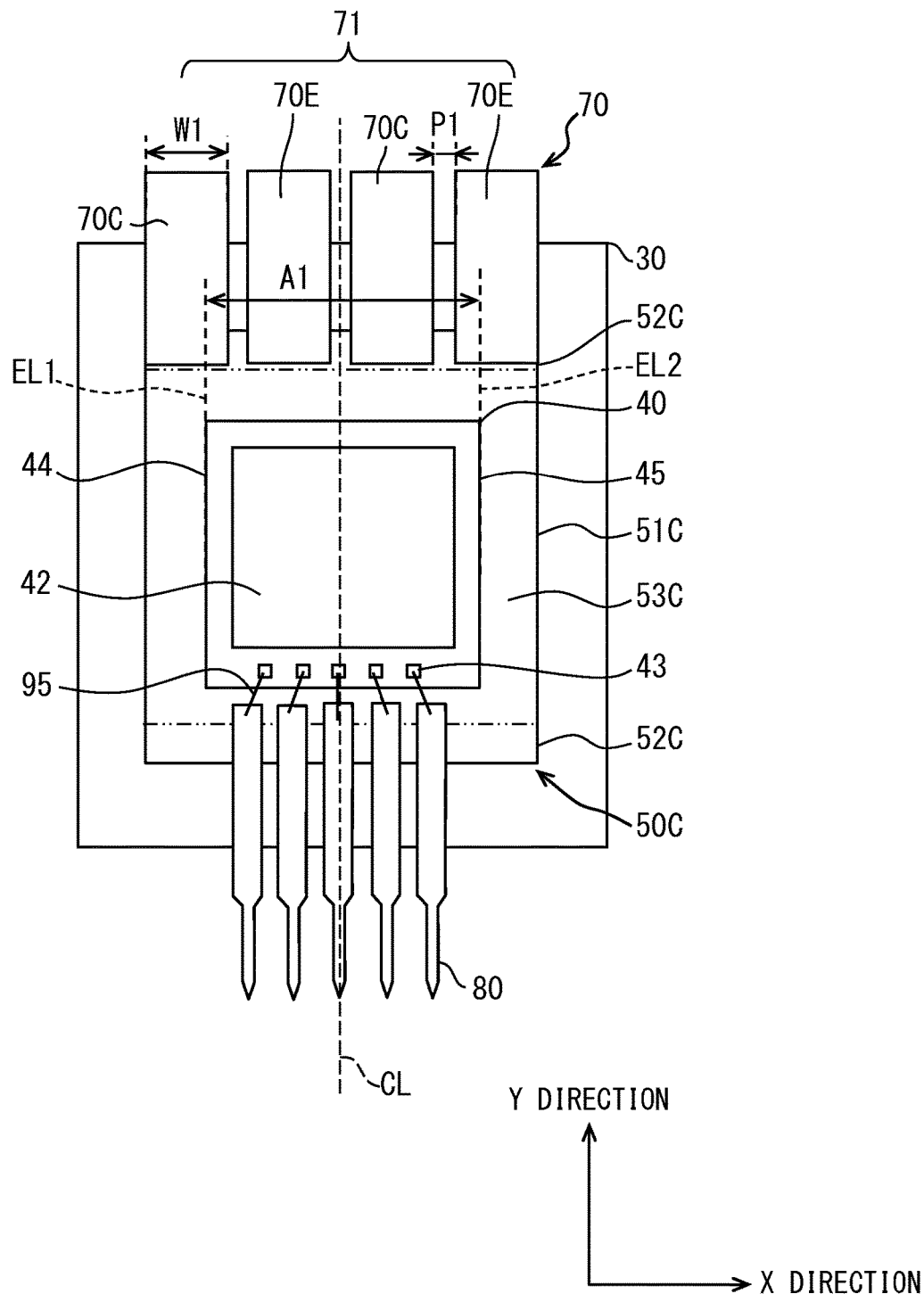
FIG. 15 is a plan view showing another example of the semiconductor device and corresponding to FIG. 7.

In FIG. 15, all the main terminals 70 configure the main terminal group 71. Therefore, it may be possible to effectively reduce the inductance. Even when the number of main terminals 70 is an even number, it is sufficient that three or more continuously arranged main terminals 70 configure the main terminal group 71. Accordingly, in the configuration including the four main terminals 70, three main terminals 70 configure the main terminal group 71, and the remaining one main terminal 70 may be placed outside the region A1. As described above, when the number of main terminal 70 is the even number, the odd number of (three or more) main terminals 70 may configure the main terminal group 71.

When the number of main terminals 70 is the even number, the number of main terminals 70C and the number of main terminals 70E are same. Therefore, the main currents flowing at the main terminals 70C and 70E become equal. Thereby, it may be possible to suppress the variation in heat generation. In the example shown in FIG. 15, the extension lengths of the main terminals 70C and 70E are equal, and the cross-sectional areas are equal. Thereby, the impedances of the main terminals 70C and 70E are substantially same. Accordingly, it may be possible to effectively prevent the variation in heat generation.

The even number is not limited to four. The even number may be four or more. For example, a configuration including six main terminals 70 or a configuration including eight main terminals 70 may be employed. Similarly to the odd number, the protrusion portions may be different between the adjacent main terminals 70C and 70E. Further, the cross-sectional area of a main terminal having the longer protrusion portion among the main terminals 70C and 70E may be larger than the cross-sectional area of a main terminal having the shorter protrusion portion. Thereby, it may be possible to ensure the rigidity. Further, the impedances of the main terminal 70C and the main terminal 70E can be set to be equal to each other. At a part of the protrusion portion, the lateral surfaces may not face each other.

Figure 16:
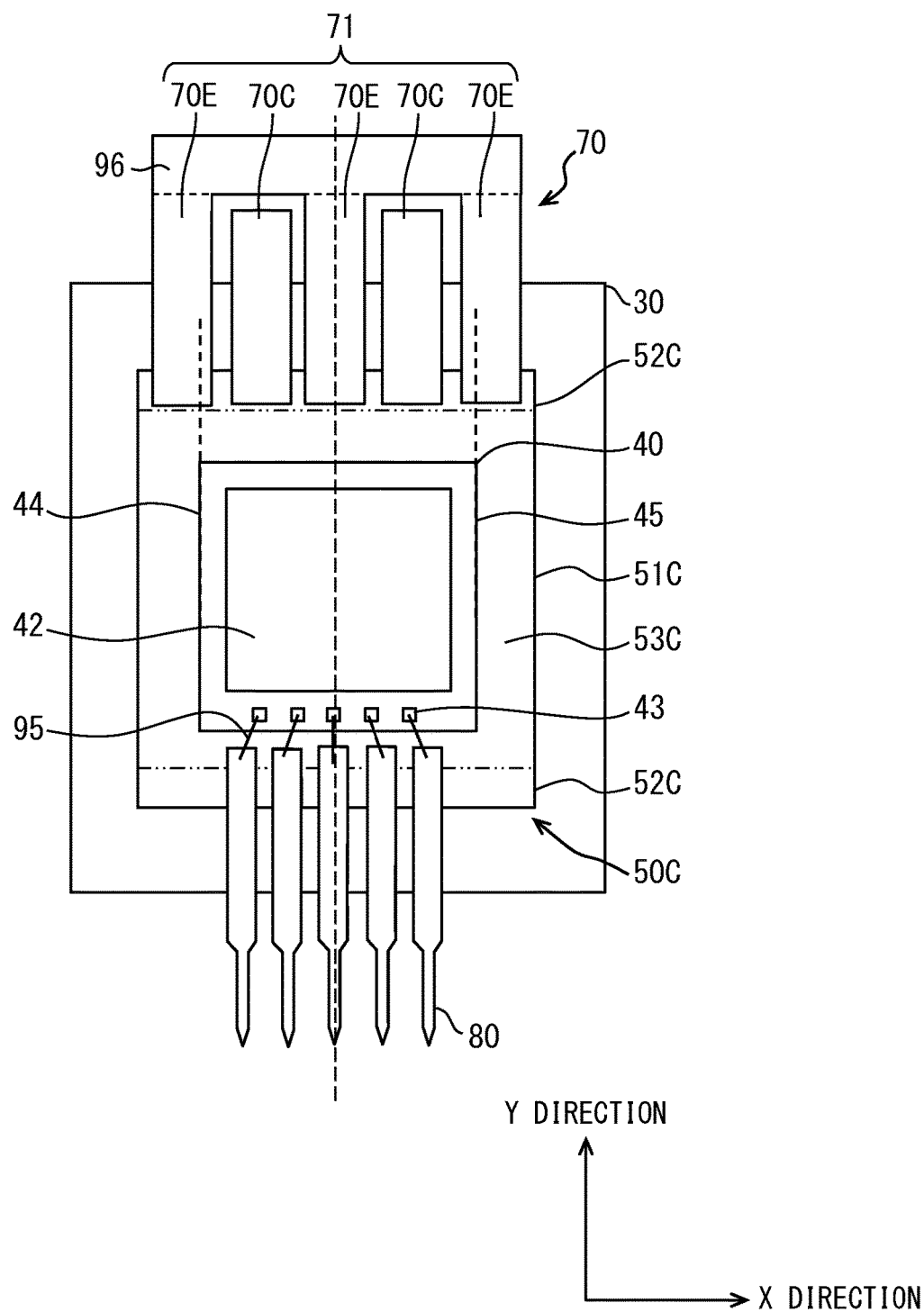
FIG. 16 is a plan view showing another example of the semiconductor device and corresponding to FIG. 7.

As a part of the lead frame, a connection portion is further provided with at least one of the main terminal 70C or the main terminal 70E. At at least one of the main terminals 70C or 70E, the same main terminals may be connected to each other by the connection portion. In another example shown in FIG. 16, the semiconductor device 20 includes five main terminals 70, specifically, two main terminals 70C and three main terminals 70E. The lead frame 100 has a connection portion 96 that connects the main terminals 70E to each other. The protrusion length in the main terminal 70E from the sealing resin body 30 is longer than that in the main terminal 70C. The connection portion 96 connects the protrusion tip portion of the main terminal 70E. The connection portion 96 extends in the X direction, and is placed apart from the main terminal 70C in the Y direction. The connection portion 96 is placed at the same position as that of the protrusion portions of the main terminals 70C and 70E in the Z direction.

In such a manner, the main terminal 70 (main terminal 70E) at the same potential is connected by the connection portion 96, and thereby it may be possible to reduce the number of connection points with the bus bar. That is, it may be possible to improve the connectivity. In particular, in FIG. 16, a large number of main terminals 70E are connected. Thereby, in the configuration in which the same lead frame 100 is provided with the main terminals 70C and 70E and the connection portion 96, it may be possible to reduce the connection point. Instead of the main terminal 70E, the main terminal 70C may be connected to the connection portion 96. Of the main terminals 70C and 70E, the small number of terminals may be connected. The number of main terminals 70 and the arrangement are not limited to the example shown in FIG. 16. When the connection portion 96 is provided with one of the main terminal 70C and the main terminal 70E, the connection portion 96 can be placed so as to continue from the protrusion portion of the main terminals 70C and the 70E. It may be combined with a configuration including the even number of main terminals 70.

Each of the main terminals 70C and 70E may be connected by the connection portion. In another example shown in FIG. 17 and FIG. 18, the conductive members 50C and 50E include the main portion 51C and does not include the extension portion 52C, and the conductive member 50E includes the main portion 51E and does not include the extension portion 52E. On the same lead frame, the conductive member 50C, the main terminal 70C, and the signal terminal 80 are placed. On a lead frame different from the lead frame including the main terminal 70C, the conductive member 50E and the main terminal 70E are provided. The main terminal 70C extends from the conductive member 50C, and the main terminal 70E extends from the conductive member 50E. FIG. 18 is a cross-sectional view of the semiconductor device 20 along the XVIII-XVIII of FIG. 17.

Figure 17:
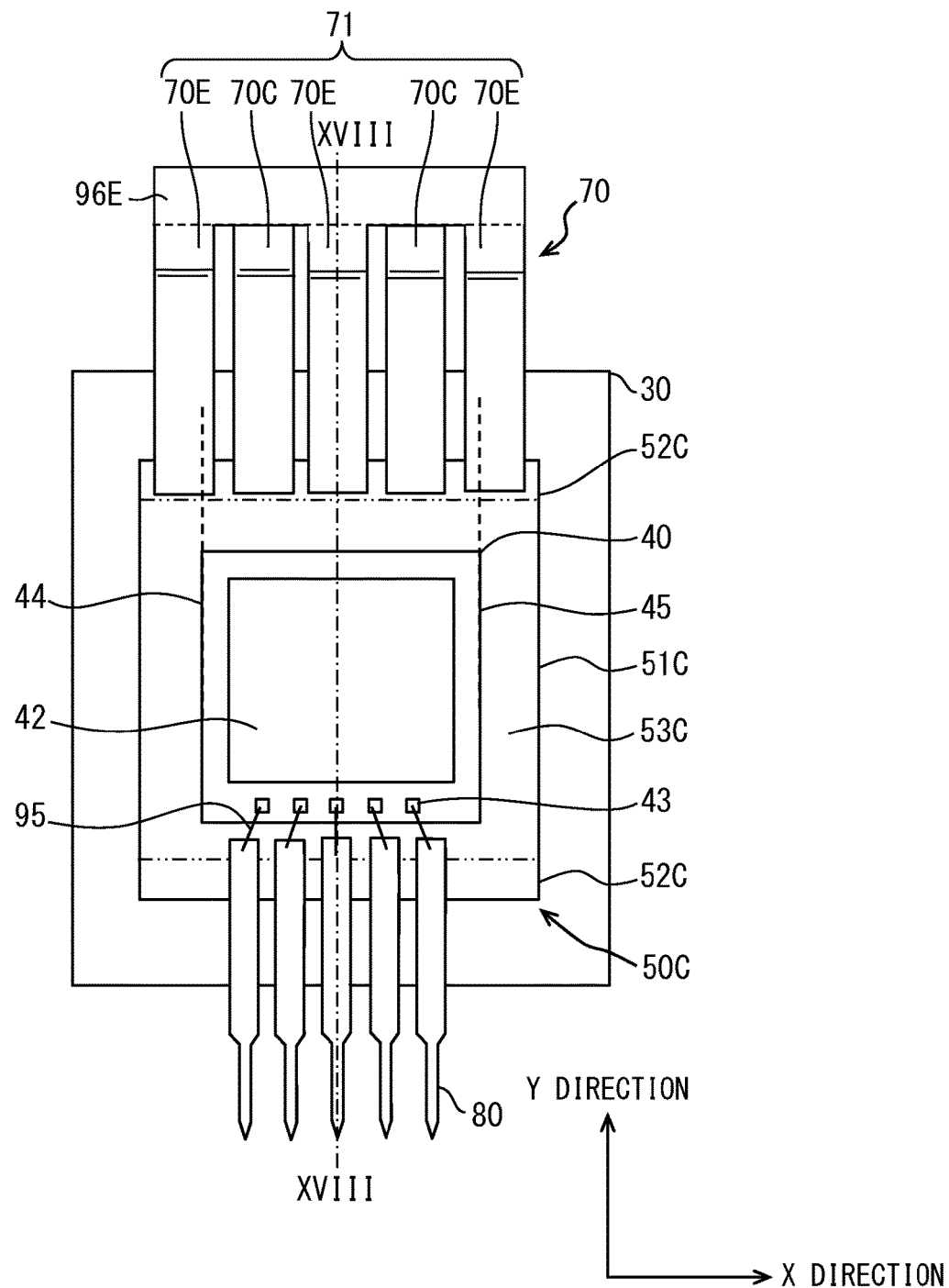
FIG. 17 is a cross-sectional view showing another example of the semiconductor device and corresponding to FIG. 3.
Figure 18:
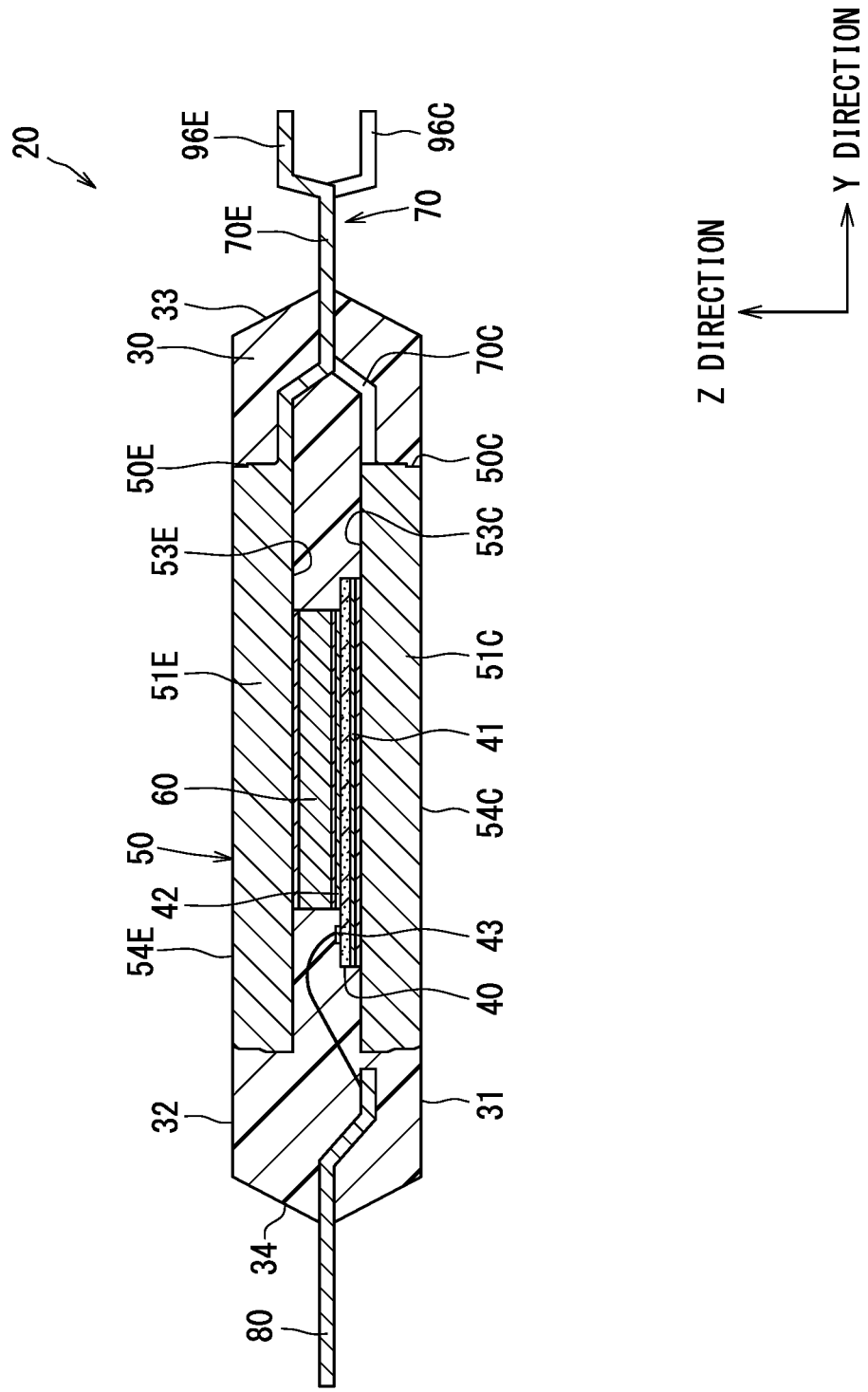
FIG. 18 is a cross-sectional view taken along a XVIII-XVIII line of FIG. 17.

In FIG. 17 and FIG. 18, the connection portion 96C is placed on the lead frame close to the main terminal 70C, and the connection portion 96E is placed on the lead frame close to the main terminal 70E. The connection portion 96C connects the main terminals 70C to each other at the protrusion tip portions. The connection portion 96E connects the main terminals 70E to each other at the protrusion tip portions. The protrusion portion of each of the main terminals 70C and 70E has a bent portion. Thereby, the connection portions 96C and 96E are separated from each other in the Z direction. That is, the connection portions 96C and 96E are placed at different positions in the Z direction. Accordingly, even when the extension lengths are same, the main terminals 70C and the main terminal 70E are respectively connected by the connection portions 96C and 96E. It may be possible to further reduce the number of connection points.

Figure 19:
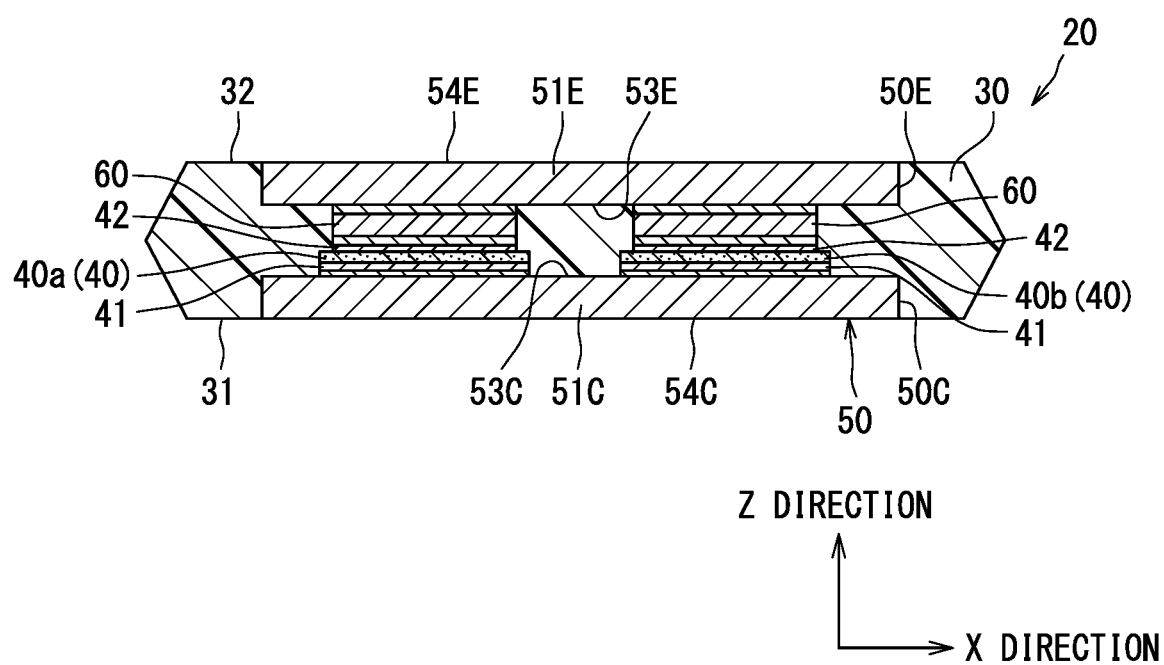
FIG. 19 is a cross-sectional view showing another example of the semiconductor device.
Figure 20:
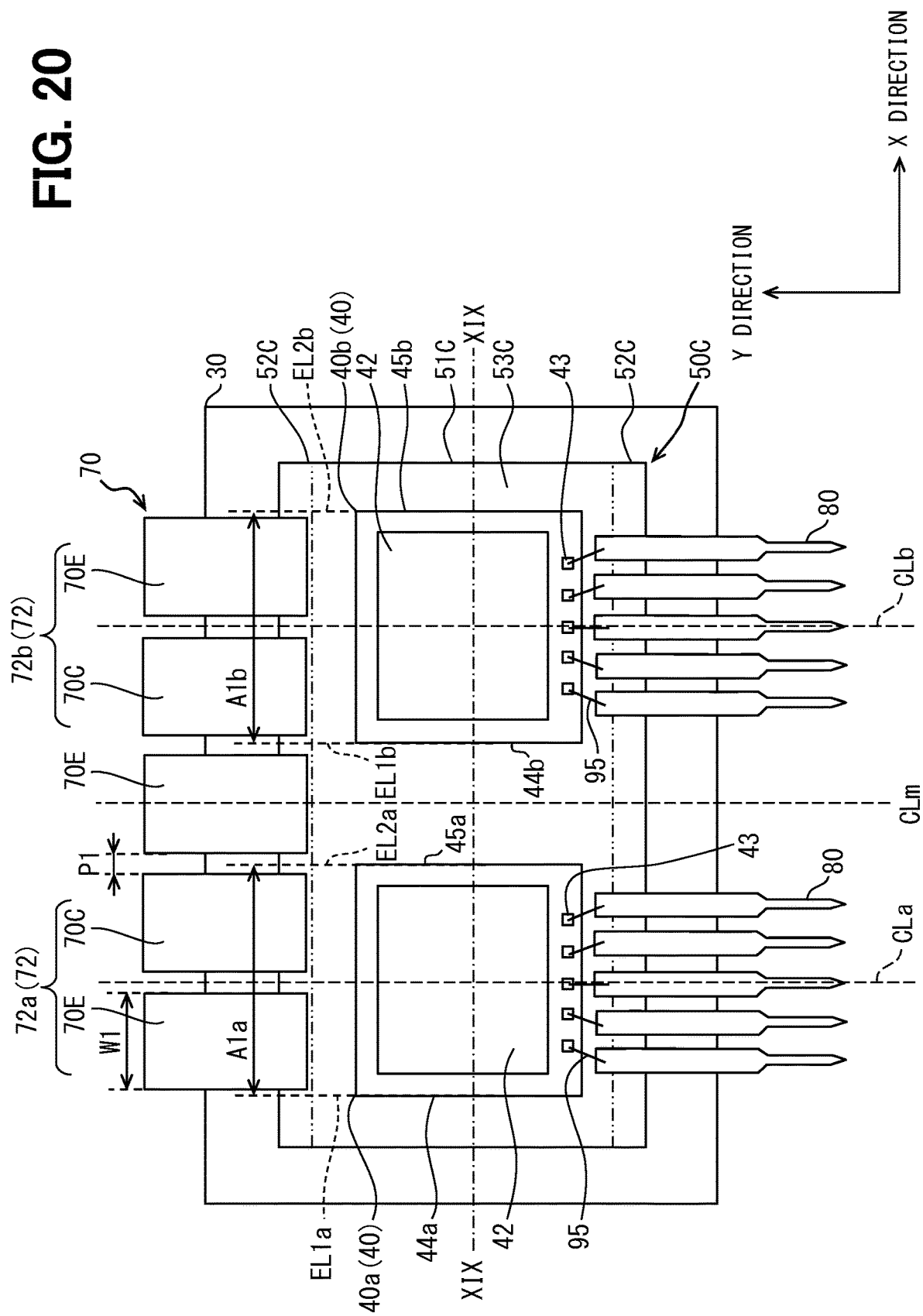
FIG. 20 is a plan view showing a positional relationship between the IGBT and the main terminal and corresponding to FIG. 7.

In another example shown in FIG. 19 and FIG. 20, the semiconductor device 20 includes multiple semiconductor chips 40 connected to each other in parallel. Specifically, the semiconductor device 20 includes, as the semiconductor chip 40, a semiconductor chip 40a and a semiconductor chip 40b. FIG. 19 is a cross-sectional view of the semiconductor device 20 corresponding to an XIX-XIX line shown in FIG. 20. The collector electrodes 41 of the semiconductor chips 40a and 40b are connected to the mounting surface 53C of the same conductive member 50C. The emitter electrodes 42 of the semiconductor chips 40a and 40b are connected to the mounting surface 53E of the same conductive member 50E via the individually placed terminal 60. In the present embodiment, two semiconductor chips 40a and 40b have substantially the same planar shape, specifically, the substantially rectangular planar shape, and has the same size and the same thickness. The semiconductor chips 40a and 40b are positioned at substantially the same height in the Z direction, and placed horizontally in the X direction.

As shown in FIG. 20, a main terminal group 72 includes two or more main terminals 70 continuously arranged in the X direction. The semiconductor device 20 includes, as the main terminal group 72, a main terminal group 72a corresponding to the semiconductor chip 40a and a main terminal group 72b corresponding to the semiconductor chip 40b. At least a part of each main terminal 70 configuring the main terminal group 72a is placed in a region A1a between, in the X direction, extension lines EL1a and EL2a that extend from both end surfaces 44a and 45a of the semiconductor chip 40a. At least a part of each main terminal 70 configuring the main terminal group 72b is placed in a region A1b between, in the X direction, extension lines EL1b and EL2b that extend from both end surfaces 44b and 45b of the semiconductor chip 40b.

The semiconductor device 20 includes five main terminals 70. Specifically, the five main terminals 70 are two main terminals 70C and three main terminals 70E. The widths W1 of the main terminals 70 are equal to each other, the thicknesses of the main terminals 70 are equal to each other, and the intervals P1 of the main terminals 70 are equal to each other. The main terminal 70E in the middle is placed outside the regions A1a and A1b. The main terminal group 72a includes two main terminals 70C and 70E placed closer to the semiconductor chip 40a than the main terminal 70E in the middle in the X direction. The main terminal group 72b includes two main terminals 70C and 70E placed closer to the semiconductor chip 40b than the main terminal 70E in the middle.

Further, the main terminals 70C and 70E configuring the main terminal group 72a are entirely placed in the region A1a. Similarly, the main terminals 70C and 70E configuring the main terminal group 72b are entirely placed in the region A1b. The five main terminals 70 are symmetrically placed with respect to a center line CLm passing through an elemental center of the two semiconductor chips 40. The elemental center is a center position between the centers in the arrangement direction of the semiconductor chips 40a and 40b, the center line CLm is a virtual line that is orthogonal to the arrangement direction and passes through the elemental center line CL.

In such a manner, in the semiconductor device 20 connected to the multiple semiconductor chips 40 in parallel, the main terminal 70C and the main terminal 70E are alternately arranged. The lateral surfaces of the adjacent main terminals 70C and 70E face each other. In such a manner, the multiple lateral surface facing portions of the main terminals 70C and 70E, specifically, four multiple lateral surface facing portions are provided. Therefore, it may be possible to effectively reduce the inductance. At least a part of each of the main terminals 70C and 70E configuring the main terminal group 72a is placed in the region Ala. Accordingly, it may be possible to simplify the current path between the main terminals 70C and 70E configuring the main terminal group 72a and the main electrode of the semiconductor chip 40a, and thereby reduce the inductance. Similarly, at least a part of each of the main terminals 70C and 70E configuring the main terminal group 72b is placed in the region Alb. Accordingly, it may be possible to simplify the current path between the main terminals 70C and 70E configuring the main terminal group 72b and the main electrode of the semiconductor chip 40b, and thereby reduce the inductance. As a result, the inductance of the main circuit wiring can be further reduced.

The odd number of main terminals 70 are symmetrically placed with respect to the center line CLm of the two semiconductor chips 40. In other words, the lateral surface facing portions are symmetrically placed with respect to the center line CLm. Therefore, the main currents of the semiconductor chips 40a and 40b symmetrically flow with respect to the center line CLm. That is, the inductance for the semiconductor chip 40a and the inductance for the semiconductor chip 40b are substantially equal. In such a manner, since the inductances are equal to each other, it may be possible to prevent current imbalance.

Although the example in which the two semiconductor chips 40 are connected in parallel, it is not limited to this. It can be also applied to a configuration in which three or more semiconductor chip 40 are connected in parallel. The number of main terminals 70 is also not limited. It is sufficient that each main terminal group 72 includes two or more main terminals 70 including the main terminals 70C and 70E. For example, seven main terminals 70 may be provided, and each of the main terminal groups 72a and 72b may include three main terminals 70. The connection portion 96 (86C, 86E) shown in FIGS. 16 to 18 may be combined.

The example in which the switching element and the diode are integrally formed on the same semiconductor chip 40 has been shown. However, it is not limited to this. The switching element and the diode may be formed on different tips. As the semiconductor device 20 having a both surface heat radiation structure, the example including the terminal 60 has been shown. However, it is not limited to this. A configuration that does not include the terminal 60 may be employed. For example, instead of the terminal 60, a protrusion portion protruding toward the emitter electrode 42 may be provided on the conductive member 50E. In addition, the example in which the heat radiation surfaces 42C and 42E are exposed from the sealing resin body 30 has been shown. However, the heat radiation surfaces 54C and 54E may not be exposed from the sealing resin body 30. For example, the heat radiation surfaces 54C and 54E may be covered with an insulation member (not shown). The sealing resin body 30 may be molded in a state where the insulation material is attached to the heat radiation surfaces 54C and 54E.

(Power Module)

One example of the power module 110 applicable to the electric power conversion device 5 of the present embodiment will be described. The power module 110 configures a set of parallel circuits 11.

Figure 26:
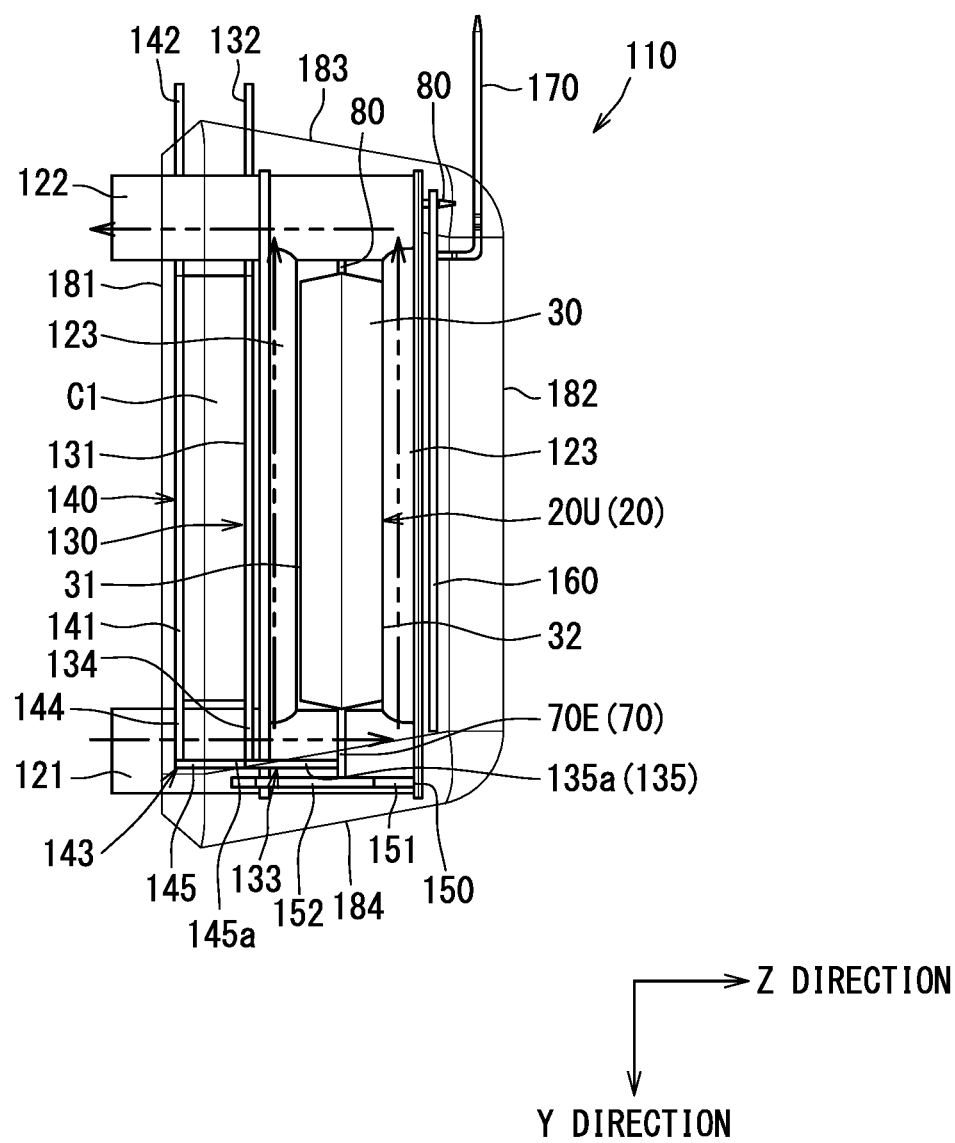
FIG. 26 is a plan view when
Figure 27:
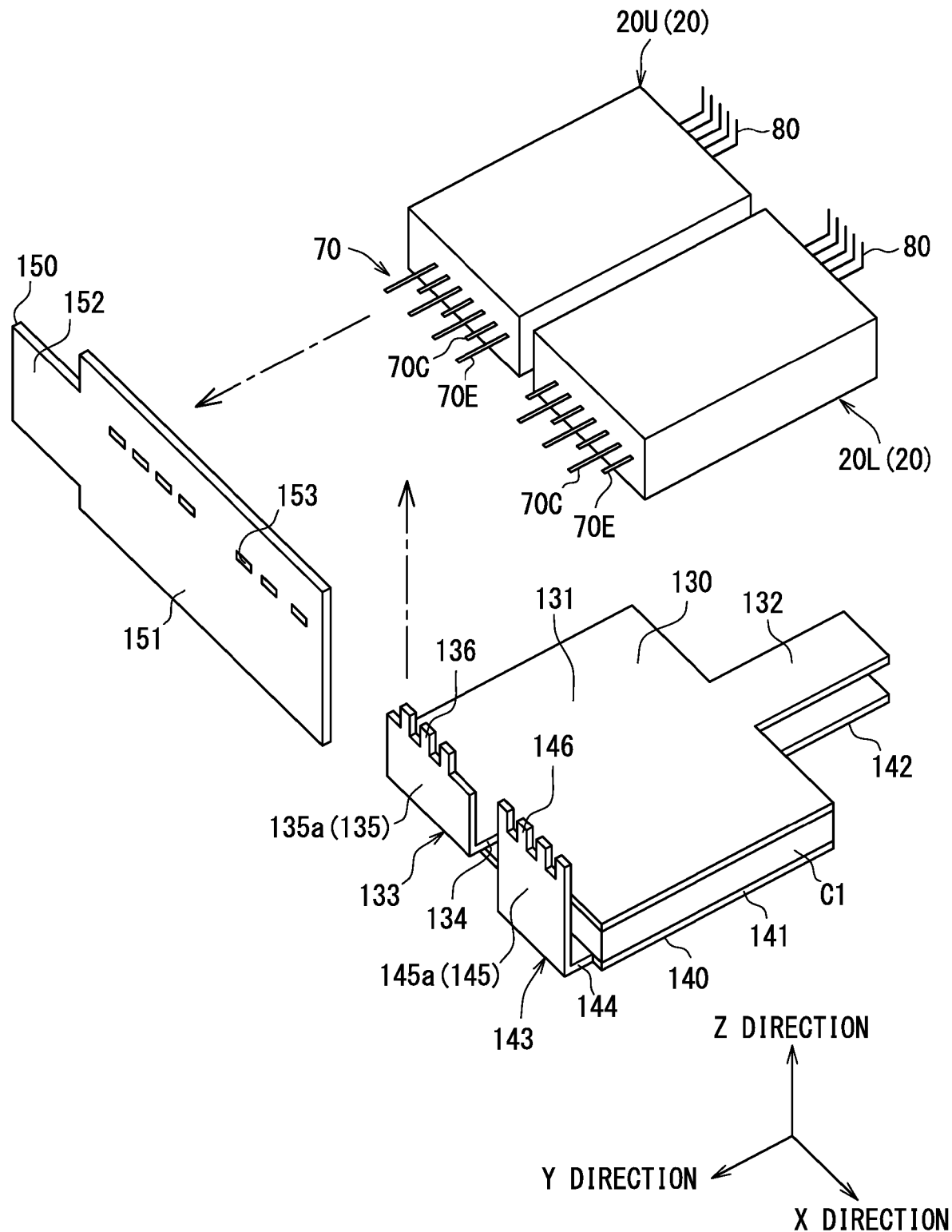
FIG. 27 is a view for illustrating connection among the semiconductor device, a smoothing capacitor, and each bus bar.

As shown in FIGS. 21 to 27, the power module 110 includes the semiconductor device 20, a cooler 120, the capacitor C1, a P bus bar 130, an N bus bar 140, an output bus bar 150, a drive substrate 160, and an external connection terminal 170, and a protective member 180. Although FIG. 21 and FIGS. 23 to 26 are plan views, internal elements are shown by solid lines in order that the internal elements of the protective member 180 are easily understood. FIG. 27 is a schematic view for illustrating the connection of the semiconductor device 20, the capacitor C1, and each of the bus bars 130, 140, and 150.

The semiconductor device 20 has the 1-in-1 package structure. The power module 110 includes two semiconductor devices 20. One semiconductor device 20 configures the upper arm 10U, and the other configures the lower arm 10L. That is, the semiconductor devices 20 are a semiconductor device 20U configuring the upper arm 10U and a semiconductor device 20L configuring the lower arm 10L. The basic configurations of the semiconductor devices 20U and 20L are almost the same as each other. Each of the semiconductor devices 20U and 20L includes seven main terminals 70, specifically, three main terminals 70C and four main terminals 70E. The main terminals 70C and 70E are alternately arranged in the X direction. Hereinafter, the semiconductor chip 40 included in the semiconductor device 20U and configuring the upper arm 10U is referred to as a semiconductor chip 40U. The semiconductor chip 40 included in semiconductor device 20L and configuring the lower arm 10L is referred to as a semiconductor chip 40L.

The semiconductor device 20L has the same structure shown in FIG. 12. The main terminal 70C has the longer protrusion length from the sealing resin body 30 than that of the main terminal 70E. The configuration of the semiconductor device 20U is opposite to that of the semiconductor device 20L. The main terminal 70E has the longer protrusion length from the sealing resin body 30 than that of the main terminal 70C. In such a manner, in the semiconductor device 20U, the main terminal 70E is longer. In the semiconductor device 20L, the main terminal 70C is longer. The main terminal 70C of the semiconductor device 20U and the main terminal 70E of the semiconductor device 20L have the same length. The main terminal 70E of the semiconductor device 20U and the main terminal 70C of the semiconductor device 20L have the same length.

The semiconductor devices 20U and 20L are arranged in the X direction, the predetermined gap is provided between the semiconductor devices 20U and 20L. That is, the semiconductor devices 20U and 20L are arranged in the plate thickness direction of the semiconductor chip 40, that is, the direction orthogonal to the Z direction. The first surfaces 31 of the sealing resin bodies 30 of the semiconductor devices 20U and 20L are arranged on the same side in the Z direction. The second surfaces 32 are arranged on the same side. The first surfaces 31 of the semiconductor devices 20U and 20L have a substantially flush positional relationship in the Z direction with each other, and the second surfaces have the substantially flush positional relationship in the Z direction with each other.

For each of the semiconductor devices 20U and 20L, the protrusion portion of the signal terminal 80 from the sealing resin body 30 has a substantially L shape. The protrusion portion of the signal terminal 80 has one bent portion of approximately 90 degrees. In the protrusion portion of the signal terminal 80, a portion from the root of the sealing resin body 30 to the bent portion extends in the Y direction. A portion from the bent portion to the protrusion tip extends in the Z direction and extends towards the side opposite to the capacitor C1.

The cooler 120 mainly cools the semiconductor device 20. The cooler 120 is formed of a material having excellent thermal conductivity, for example, an aluminum-based material. The cooler 120 includes a supply pipe 121, a discharge pipe 122, and a heat exchange portion 123. The cooler 120 is also referred to as an in-module cooler since the cooler 120 is placed in the power module 110.

The heat exchange portion 123 is configured by a pair of plates 124 and 125. The plates 124 and 125 are formed of the metal plate having the substantially rectangular plane shape. At least one of the plate 124 or 125 is pressed to have a shape bulging in the Z direction, for example, have a pot bottom shape having a shallow bottom. In the present example, the plate 124 has the pot bottom shape. Outer peripheral edges of the plates 124 and 125 are fixed by swage or the like, and the entire circumference are joined to each other by brazing or the like. Thereby, a flow path 126 is formed between the plates 124 and 125.

The heat exchange portion 123 has a flat tubular body as a whole. The cooler 120 has two heat exchange portions 123. The heat exchange portions 123 are arranged in two stages in the Z direction. The two semiconductor devices 20U and 20L are sandwiched by the two heat exchange portions 123 in a state where the two semiconductor devices 20U and L are arranged in the X direction. The two heat exchange portions 123 are placed so that the plates 124 face each other. One of the heat exchange portions 123 is placed close to the first surface 31 of the semiconductor device 20. The other of the heat exchange portions 123 is placed close to the second surface 32. In a configuration in which the heat radiation surfaces 54C and 54E are exposed from the sealing resin body 30, an electric insulation member such as a grease, a ceramic plate, a resin member, or the like is placed between the semiconductor device 20 and the plate 124 of the heat exchange portion 123.

The supply pipe 121 is a tubular body including a flow path therein, and extends in the Z direction. The supply pipe 121 is placed at, in the X direction, one end of the heat exchange portion 123 having the substantially rectangular plane shape and, in the Y direction, the end close to the main terminal 70. The supply pipe 121 communicates with each heat exchange portion 123, and the flow path of the supply pipe 121 is connected to the flow path 126 of the heat exchange portion 123. In the Z direction, one end of the supply pipe 121 opens, and the other end is connected to the heat exchange portion 123 of the second stage. The flow path 126 of the heat exchange portion 123 of the first stage is connected to the flow path of the supply pipe 121 in the middle of the extension of the supply pipe 121. The first stage is on the side near the open ends of the supply pipe 121 and the discharge pipe 122, and the second stage is the side far from the open ends. A part of the supply pipe 121 protrudes from the open end of the supply pipe 121 to the outside of the protective member 180.

The discharge pipe 122 is a tubular body including a flow path therein, and extends in the Z direction. The discharge pipe 122 is placed at, in the X direction, an end opposite to the supply pipe 121 with respect to the heat exchange portion 123 having the substantially rectangular plane shape, and the end is close to the signal terminal 80 in the Y direction. The discharge pipe 122 communicates with each heat exchange portion 123, and the flow path of the discharge pipe 122 is connected to the flow path 126 of the heat exchange portion 123. The discharge pipe 122 is open similarly to the supply pipe 121 in the Z direction. The end opposite to the open end is connected to the heat exchange portion 123 of the second stage. The flow path 126 of the heat exchange portion 123 of the first stage is connected to the flow path of the discharge pipe 122 in the middle of the extension of the discharge pipe 122. A part of the discharge pipe 122 protrudes from the open end of the discharge pipe 122 to the outside of the protective member 180.

As shown by a long dashed double-dotted line arrow in FIG. 26, the refrigerant flowing in from the supply pipe 121 expands the flow path 126 in the heat exchange portion 123, and is discharged from the discharge pipe 122. The supply pipe 121 and the discharge pipe 122 are placed at diagonal positions in the substantially rectangular plane shape. In such a manner, by providing the supply pipe 121 and the discharge pipe 122 at the diagonal positions, it may be possible to effectively cool the semiconductor chips 40U and 40L placed between the supply pipe 121 and the discharge pipe 122 in the X direction and the Y direction. Although not shown, an inner fin is placed inside the flow path 126 of the heat exchange portion 123. The inner fin is a metal plate that is bent and formed in a wavy shape. By placing the inner fin, it may be possible to promote the heat transfer between each of the plates 124 and 125 and the refrigerant flowing through the flow path 126.

As the refrigerant flowing through the flow path 126, a phase transition refrigerant such as water or ammonia or a non-phase transition refrigerant such as ethylene glycol can be used. The cooler 120 mainly cools the semiconductor device 20. However, in addition to the cooling function, the cooler 120 may have a warming function when the environmental temperature is low. Then, the cooler 120 may be referred to as a temperature adjusting instrument. The refrigerant is referred to as a heat medium.

The capacitor C1 is placed in the vicinity of a set of the semiconductor devices 20U and 20L of the power module 110. It is sufficient that the capacitor C1 has, at least, a function of supplying the electric charge necessary for the switching. Therefore, the capacitance of the capacitor C1 is set to, for example, 10 µF to 20 µF. The capacitor C1 has the substantially rectangular parallelepiped shape. The capacitor C1 has a flat shape. The thickness, that is, a length in the Z direction is set to be sufficiently smaller than a length in the X direction and a length in the Y direction. In such a manner, the capacitor C1 is set to be small. As the capacitor C1, for example, a film capacitor can be used.

In the present example, the capacitor has a plane rectangular shape in which the length the in the X direction is longer than that in the Y direction. In a projection view in the Z direction, most of the capacitor C1 is placed at a position overlapping with the heat exchange portion 123 of the cooler 120. In the same projection view, most of the capacitor C1 overlaps with most of the semiconductor devices 20U and 20L, specifically, a portion other than the protrusion portion of the main terminal 70 and the protrusion portion of the signal terminal 80. Accordingly, the capacitor C1 and the semiconductor devices 20U and 20L are arranged in the Z direction. The capacitor C1 having the flat rectangular shape is placed at a position where the both ends in the X direction do not overlap with the cooler 120, that is, outside the cooler 120.

The capacitor C1 is placed so that the heat exchange portion 123 is sandwiched by the capacitor C1 and the semiconductor device 20. The capacitor C1 is placed on the opposite side to the semiconductor device 20 with respect to the heat exchange portion 123. In the present example, the capacitor C1 is placed on the opposite side to the semiconductor device 20 with respect to the heat exchange portion 123 of the first stage. That is, the capacitor C1 is placed close to the open ends of the supply pipe 121 and the discharge pipe 122. The capacitor C1 is placed at a position closer to the semiconductor device 20 than the open ends of the supply pipe 121 and the discharge pipe 122 in the Z direction. In the capacitor C1, a surface close to the heat exchange portion 123 in the Z direction has a positive electrode terminal (not shown) for external connection, and a surface opposite to the positive electrode terminal has a negative electrode (not shown).

The P bus bar 130, the N bus bar 140, and the output bus bar 150 are metal plate materials including a metal having excellent conductivity such as copper, for example. In the present example, the thickness of each bus bar is almost uniform. The P bus bar 130, the N bus bar 140, and the output bus bar 150 have substantially the same thickness. As the metal plate material, a plate material of which thicknesses is partially different can be used. The P bus bar 130, the N bus bar 140, and the output bus bar 150 are electrically separated from the cooler 120.

The P bus bar 130 includes a connection portion 131, a common wiring portion 132, and a parallel wiring portion 133. The connection portion 131 is a portion connected to the positive electrode terminal of the capacitor C1. In the present example, in the projection view of the Z direction, the entire portion overlapping with the capacitor C1 is the connection portion 131. Although not shown, the connection portion 131 may be placed at the portion overlapping with the capacitor C1 in the projection view in the X direction or the Y direction, that is, the lateral surface of the capacitor C1.

The common wiring portion 132 extends from one end, in the Y direction, of the connection portion 131. The common wiring portion 132 is a portion that functions as the common wiring 11P in the P bus bar 130. Thereby, the set of upper-lower arm circuits 10 in the power module 110 and the capacitor C1 are not individually connected to the VH line 12H but also are commonly connected. In the X direction, a length of the common wiring portion 132, that is, a width is shorter than that of the connection portion 131. In the X direction, the common wiring portion 132 is connected to a central portion of the connection portion 131. The common wiring portion 132 is substantially flush with the connection portion 131 and extends in the Y direction. A part of the common wiring portion 132 protrudes to the outside of the protective member 180.

The parallel wiring portion 133 functions as, at least, a wiring electrically connecting the positive electrode terminal of the capacitor C1 and the upper arm 10U of the upper-lower arm circuit 10, that is, a wiring connecting the upper-lower arm circuit 10 and the capacitor C1 in parallel. Further, in the present embodiment, the parallel wiring portion 133 also functions as a wiring electrically connecting the upper arm 10U to the common wiring 11P, that is, the common wiring portion 132. The parallel wiring portion 133 extends from the end opposite to the common wiring portion 132 with respect to the connection portion 131.

A width of the parallel wiring portion 133 is narrower than that of the connection portion 131. The parallel wiring portion 133 is extended with a constant width. The parallel wiring portion 133 is placed on one side with respect to a center line CL1 so as not to straddle the center line CL1 bisecting the capacitor C1 in the X direction (see FIG. 23). The parallel wiring portion 133 is connected to the connection portion 131 at a position close to the semiconductor device 20U (semiconductor chip 40U) in the arrangement direction of the semiconductor devices 20U and 20L.

The parallel wiring portion 133 is substantially L-shaped. The parallel wiring portion 133 includes a parallel portion 134 extending from a boundary portion with the connection portion 131 along the Y direction and a bent portion 135 that is bent with respect to the parallel portion 134 and extend along the Z direction. Therefore, the parallel portion 134 is also referred to as a Y direction extension portion. The bent portion 135 is also referred to as a Z direction extension portion. The parallel portion 134 extends in the Y direction towards the opposite side to the common wiring portion 132. The parallel portion 134 is substantially flush with the connection portion 131 and extends in the Y direction.

In the projection view in the Z direction, the parallel portion 134 overlaps with a part of each of the seven main terminals 70C and 70E of the semiconductor device 20U. The parallel portion 134 extends to substantially the same position as the protrusion tip of the main terminal 70C of the semiconductor device 20U, and overlaps with the entire protrusion portion of the three main terminals 70C in the projection view. The four main terminals 70E extend to a position that is more far from the capacitor C1 than a position of the parallel portion 134.

The bent portion 135 extends towards the opposite side to the capacitor C1 in the Z direction. A plate thickness direction of the bent portion 135 is substantially parallel to the Y direction. In the present example, the entire of the bent portion 135 is a facing portion 135a facing the output bus bar 150 in the Y direction. In the plate thickness direction, the surfaces of the facing portion 135a and the output bus bar 150 face each other. At the tip of the facing portion 135a, that is, the tip of the extension of the parallel wiring portion 133, a convex portion 136 is formed so that the main terminal 70C of the semiconductor device 20U is connected. The convex portion 136 is placed for each main terminal 70C. The main terminal 70C is joined by laser welding or the like in a state where the main terminal 70C is placed on a tip surface of the corresponding convex portion 136. When the convex portion 136 is placed in such a manner, the main terminal 70E passes through a concave portion at which the convex portion 136 is not placed. Therefore, the contact between the P bus bar 130 and the main terminal 70E is prevented.

The N bus bar 140 includes a connection portion 141, a common wiring portion 142, and a parallel wiring portion 143. The connection portion 141 is a portion connected to the negative electrode terminal of the capacitor C1. In the present example, in the projection view of the Z direction, the entire portion overlapping with the capacitor C1 is the connection portion 141. Similarly to the connection portion 131, the connection portion 141 may be placed at the portion overlapping with the capacitor C1 in the projection view in the X direction or the Y direction, that is, the lateral surface of the capacitor C1. The capacitor C1 and the connection portions 131 and 141 placed on both surfaces of the capacitor C1 are electrically separated from the cooler 120. Between the capacitor C1 including the connection portions 131 and 141 and the cooler 120, an electric insulation member is placed.

The common wiring portion 142 extends from one end, in the Y direction, of the connection portion 141. The common wiring portion 142 is a portion that functions as the common wiring 11N in the N bus bar 140. Thereby, the set of upper-lower arm circuits 10 in the power module 110 and the capacitor C1 are not individually connected to the N line 13 but also are commonly connected. The width of the common wiring portion 142 is narrower than the width of the connection portion 141, and substantially same as that of the common wiring portion 132. In the X direction, the common wiring portion 142 is connected to a central portion of the connection portion 141. The common wiring portion 142 is substantially flush with the connection portion 141 and extends in the Y direction. A part of the common wiring portion 132 protrudes to the outside of the protective member 180.

The common wiring portions 132 and 142 conform with each other in the projection view in the Z direction. The common wiring portions 132 and 142 are arranged so as to face each other with an interval substantially equal to the thickness of the capacitor C1 in the Z direction. Thereby, it may be possible to reduce the inductance of the main circuit wiring.

The parallel wiring portion 143 functions as, at least, a wiring electrically connecting the negative electrode terminal of the capacitor C1 and the lower arm 10L of the upper-lower arm circuit 10, that is, a wiring connecting the upper-lower arm circuit 10 and the capacitor C1 in parallel. Further, in the present embodiment, the parallel wiring portion 143 also functions as a wiring electrically connecting the lower arm 10L to the common wiring 11N, that is, the common wiring portion 142. The parallel wiring portion 143 extends from an end of the connection portion 141 and the end is opposite to the common wiring portion 142.

A width of the parallel wiring portion 143 is narrower than that of the connection portion 141. The parallel wiring portion 143 is extended with a constant width. The parallel wiring portion 143 placed on the side opposite to the parallel wiring portion 133 with respect to the center line CL1 so as not to straddle the center line CL1 of the capacitor C1. The parallel wiring portion 143 is connected to the connection portion 141 at a position close to the semiconductor device 20L (semiconductor chip 40L) in the arrangement direction of the semiconductor devices 20U and 20L.

The parallel wiring portion 143 is substantially L-shaped. The parallel wiring portion 143 includes a parallel portion 144 extending from a boundary portion with the connection portion 141 along the Y direction and a bent portion 145 that is bent with respect to the parallel portion 144 and extend along the Z direction. The parallel portion 144 extends in the Y direction towards the opposite side to the common wiring portion 142. The parallel portion 144 is substantially flush with the connection portion 141 and extends in the Y direction. The parallel portions 134 and 144 are laterally arranged in the X direction with an interval for ensuring the electrical insulation. The lateral surfaces of the parallel portions 134 and 144 face each other. Thereby, it may be possible to reduce the inductance of the main circuit wiring.

In the projection view in the Z direction, the parallel portion 144 overlaps with at least a part of each of the seven main terminals 70C and 70E of the semiconductor device 20L. The parallel portion 144 extends to substantially the same position as the protrusion tip of the main terminal 70E of the semiconductor device 20L, and overlaps with the entire protrusion portion of the four main terminals 70E in the projection view. The three main terminals 70C extend to a position that is more far from the capacitor C1 than a position of the parallel portion 144. Positions of protrusion tips of the main terminal 70C of the semiconductor device 20U and the main terminal 70E of the semiconductor device 20L are substantially same position in the Y direction. Thereby, positions of the tips of the extension of the parallel portions 134 and 144 are substantially same.

The bent portion 145 extends towards the opposite side to the capacitor C1 in the Z direction. A plate thickness direction of the bent portion 145 is substantially parallel to the Y direction. A position of the extended tip of the bent portion 145 is same as that of the extended tip of the bent portion 135 of the P bus bar 130. The bent portions 135 and 145 are laterally arranged in the X direction with an interval for ensuring the electrical insulation. The lateral surfaces of the bent portions 135 and 145 face each other. Thereby, it may be possible to reduce the inductance of the main circuit wiring.

In the present example, the position of the N bus bar 140 is more far from the semiconductor device 20 in the Z direction than that of the P bus bar 130. A part of the bent portion 145 is a facing portion 145a facing the output bus bar 150 in the Y direction. The plate surfaces of the facing portion 145a and the output bus bar 150 face each other. At the tip of the facing portion 145a, that is, the tip of the extension of the parallel wiring portion 143, a convex portion 146 is formed so that the main terminal 70E of the semiconductor device 20L is connected. The convex portion 146 is placed for each main terminal 70E. The main terminal 70E is joined by laser welding or the like in a state where the main terminal 70E is placed on a tip surface of the corresponding convex portion 146. When the convex portion 146 is placed in such a manner, the main terminal 70C passes through a concave portion at which the convex portion 146 is not placed. Therefore, the contact between the N bus bar 140 and the main terminal 70C is prevented.

The parallel wiring portion 133 and the main terminal 70C of the semiconductor device 20U connects the positive electrode of the capacitor C1 to the collector electrode of the upper arm 10U. The parallel wiring portion 143 and the main terminal 70E of the semiconductor device 20L connects the negative electrode of the capacitor C1 to the emitter electrode of the lower arm 10L. In such a manner, the parallel wiring portion 133, the main terminal 70C of the semiconductor device 20U, the parallel wiring portion 143, and the main terminal 70E of the semiconductor device 20L connect the upper-lower arm circuit 10 and the capacitor C1 in parallel, and the parallel circuit 11 is configured. The common wiring portions 132 and 142 connect the parallel circuit to the VH line 12H and the N line 13 that are an electric power line.

The output bus bar 150 is a bus bar for connecting the connection point between the upper arm 10U and the lower arm 10L to a three-phase winding of the motor generator. The output bus bar 150 is also referred to as an O bus bar. The output bus bar 150 is placed, in the Y direction, not close to the signal terminal 80 but close to the main terminal 70. The output bus bar 150 extends in the X direction without having the bent portion, when the plate thickness direction is the Y direction. The output bus bar 150 configures at least a part of the output wiring 15. In the periphery of the output bus bar 150, a current sensor (not shown) can be placed.

The output bus bar 150 includes a wide width portion 151 having a wide length in the Z direction, that is, a wide width and a narrow width portion 152 having a width narrower than that of the wide width portion 151. The narrow width portion 152 is connected to one end of the wide width portion 151, is substantially flush with the wide width portion 151 and extends in the X direction. The wide width portion 151 is entirely placed inside the protective member 180. The narrow width portion 152 is partially placed inside the protective member 180, and the remaining portion protrudes outside the protective member 180.

The wide width portion 151 is placed so as to substantially conform with, in the X direction, a region between an end of the parallel wiring portion 143 far from the center line CL1 and an end of the parallel wiring portion 133 far from the center line CL1. In the X direction, the supply pipe 121 is placed close to the tip of the wide width portion 151. The wide width portion 151 is provided with the predetermined interval from the bent portions 135 and 145 in the Y direction. For example, in the semiconductor device 20U, the predetermined interval substantially conforms with a length obtained by subtracting a plate thickness of the output bus bar 150 from a length between the protrusion tips of the main terminals 70C and 70E. The wide width portion 151 is placed in a region, in the Z direction, from a position overlapping with the capacitor C1 the plate 125 configuring the heat exchange portion 123 of the second stage.

In the wide width portion 151, multiple penetration holes 153 are formed. The main terminal 70E of the semiconductor device 20U and the main terminal 70C of the semiconductor device 20L are inserted into the penetration holes 153. In the inserted state, the main terminal 70 is connected to the wide width portion 151 (output bus bar 150) by the laser welding or the like. A facing portion 154p for the P bus bar 130 and a facing portion 154n for the N bus bar 140 are configured so as to avoid the penetration holes 153. The facing portion 154p of the output bus bar 150 and the facing portion 135a of the P bus bar 130 face each other with the predetermined interval in the Y direction. The facing portion 154n of the output bus bar 150 and the facing portion 145a of the N bus bar 140 face each other with the predetermined interval in the Y direction.

Since the supply pipe 121 exists, the width of the parallel wiring portion 143 is narrower than that of the parallel wiring portion 133. Thereby, the width of the facing portion 145a is narrower than that of the facing portion 135a. However, in the capacitor C1, since the negative electrode terminal is placed on the side opposite to the heat exchange portion 123, the extension length in the facing portion 145a is obtained. The length of the facing portion 145a in the Z direction is longer than that of the facing portion 135a. Thereby, the facing area of the facing portion 135a and the facing portion 154p is substantially equal to the facing area of the facing portion 145a and the facing portion 154n. It may be possible to reduce the inductance while preventing the size in the X direction from increasing.

The drive substrate 160 is formed by mounting an electronic component (not shown) on a printed substrate. The drive substrate 160 is formed with a drive circuit portion (driver) that receives the drive instruction from the control circuit portion 9. The drive substrate 160 corresponds to a circuit board. The drive substrate 160 has a substantially rectangular planar shape. In the present example, the size of the drive substrate 160 is substantially same as that of the heat exchange portion 123 of the cooler 120 in the X direction. The size is longer than that of the heat exchange portion 123 in the Y direction. In the projection view from the Z direction, the drive substrate 160 is placed so as to overlap with most of the semiconductor devices 20U and 20L. Specifically, they are placed so as to overlap with each other except for a part of the main terminal 70. In the Y direction, a part of the main terminal 70, the bent portions 135 and 145, the output bus bar 150 are placed so as not to overlap with the drive substrate 160. On the side opposite to the main terminal 70, the common wiring portions 132 and 142 protrude outward as compared with the drive substrate 160.

The drive substrate 160 is connected to the signal terminal 80 of the semiconductor device 20. In the present embodiment, multiple penetration holes (not shown) are formed in the drive substrate 160. The signal terminals 80 are inserted into the multiple penetration holes, and mounted. Thereby, a drive signal is output from the drive circuit portion formed on the drive substrate 160 via the signal terminal 80. The signal terminals 80 are arranged in the X direction. The multiple signal terminals 80 are arranged in a line in the X direction, inserted, and mounted near one end of the drive substrate 160 in the Y direction.

The external connection terminal 170 is a terminal for electrically connecting a control substrate 290 described later and the drive substrate 160. In the control substrate 290, the control circuit portion 9 is formed. The drive substrate 160 is connected to the multiple external connection terminals 170. In the present embodiment, multiple penetration holes (not shown) are formed in the drive substrate 160. The external connection terminals 170 are inserted into the multiple penetration holes, and mounted. A part of the external connection terminals 170 transmits the drive instruction of the control circuit portion 9 to the drive circuit portion of the drive substrate 160.

The external connection terminal 170 is substantially L-shaped. The external connection terminal 170 has one bent portion of approximately 90 degrees. Of the external connection terminal 170, a portion from the connection portion with the drive substrate 160 to the bent portion extends in the Z direction, and a portion from the bent portion to the tip extends toward the common wiring portions 132 and 142 in the Y direction. A portion of a predetermined range from the tip protrudes to the outside of the protective member 180.

The protective member 180 protects other elements configuring the power module 110. The protective member 180 forms an outer shell of the power module 110. As the protective member 180, a sealing resin body integrally sealing the other elements, a preformed housing, or the like can be used. When the case is used, in order to improve the protection, a potting material or the like may be used in combination. In the present embodiment, as the protective member 180, the sealing resin body is used. The sealing resin body is formed of a sealing material such as an epoxy resin, and is also referred to as a mold resin or a resin molded body. The sealing resin body is formed by, for example, a transfer molding method.

The protective member 180 has, in the Z direction, a first surface 181, and a second surface 182 opposite to the first surface 181. The first surface 181 and the second surface 182 are planes orthogonal to the Z direction. The protective member 180 of the present embodiment has a substantially truncated square pyramid shape. Therefore, the protective member 180 has four lateral surfaces 183 to 186. When the first surface 181 is a reference surface, each of the lateral surfaces 183 to 186 is also an inclined surface. An angle between each of the lateral surfaces 183 to 186 and the first surface 181 is an acute angle.

Components configuring the power module 110 are the connection portion 141 of the N bus bar 140, the capacitor C1, the connection portion 131 of the P bus bar 130, the heat exchange portion 123 of the first stage, the semiconductor device 20, the heat exchange portion 123 of the second stage, the drive substrate 160 that are arranged in a direction from the first surface 181 to the second surface 182 in this order. The supply pipe 121 and the discharge pipe 122 protrude from the first surface 181 to the outside of the protective member 180. Nothing protrudes from the second surface 182. Although not shown, the drive substrate 160, the heat exchange portion 123 of the first stage, the semiconductor device 20, the heat exchange portion 123 of the second stage, the connection portion 141 of the N bus bar 140, the capacitor C1, the connection portion 131 of the P bus bar 130 may be arranged in a direction from the first surface 181 to the second surface 182 in this order.

Figure 21:
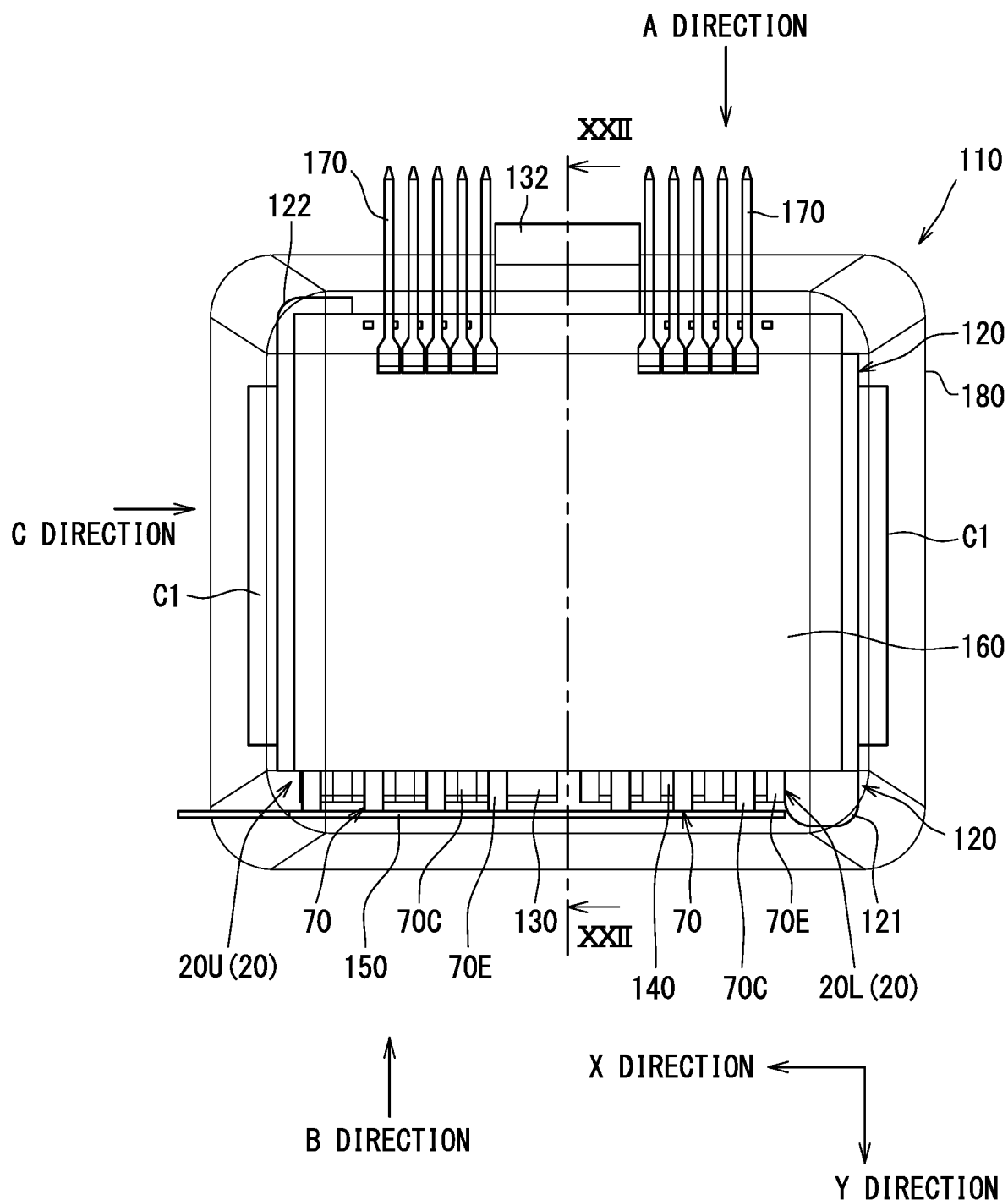
FIG. 21 is a plan view showing a power module.
Figure 22:
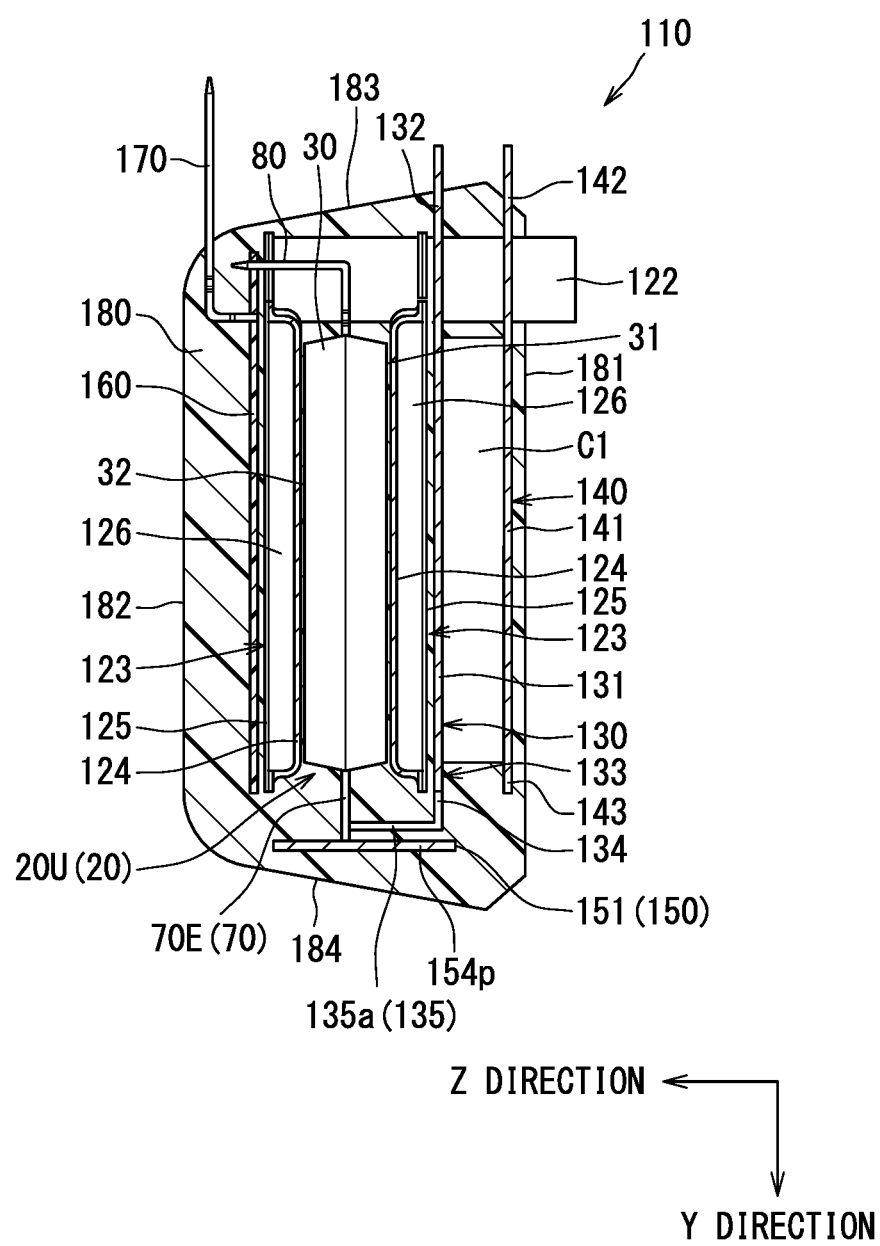
FIG. 22 is a cross-sectional view taken along a XXIII-XXII line of FIG. 21.
Figure 23:
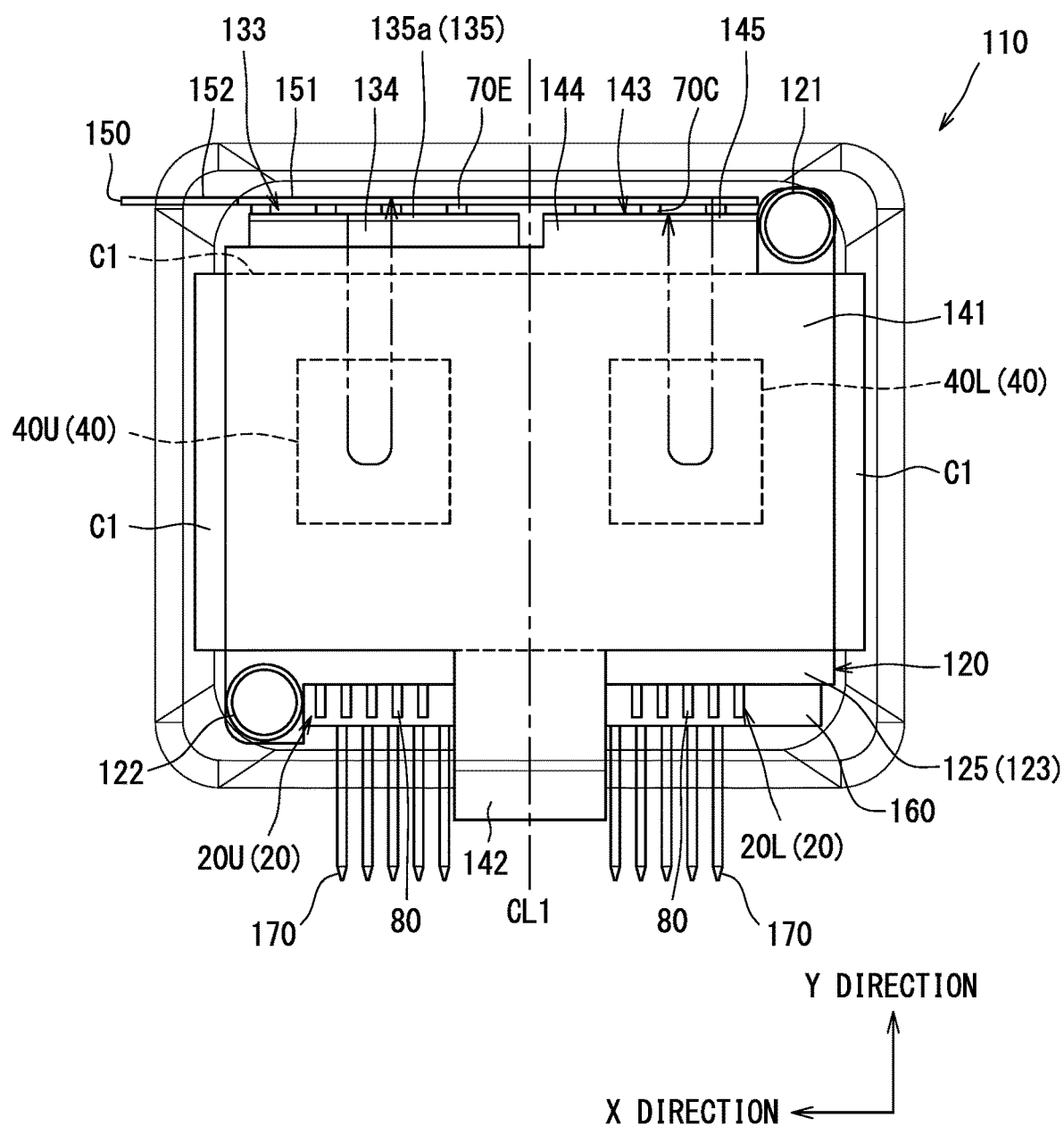
FIG. 23 is a plan view seen from a back surface in FIG. 21.
Figure 24:
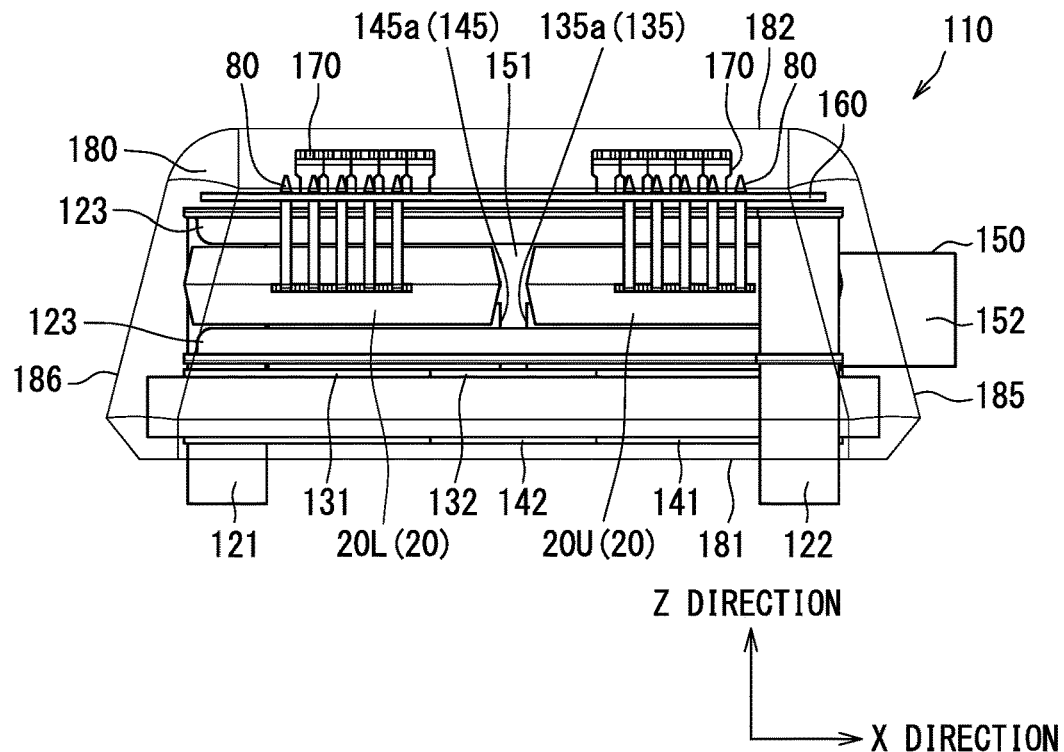
FIG. 24 is a plan view when
Figure 25:
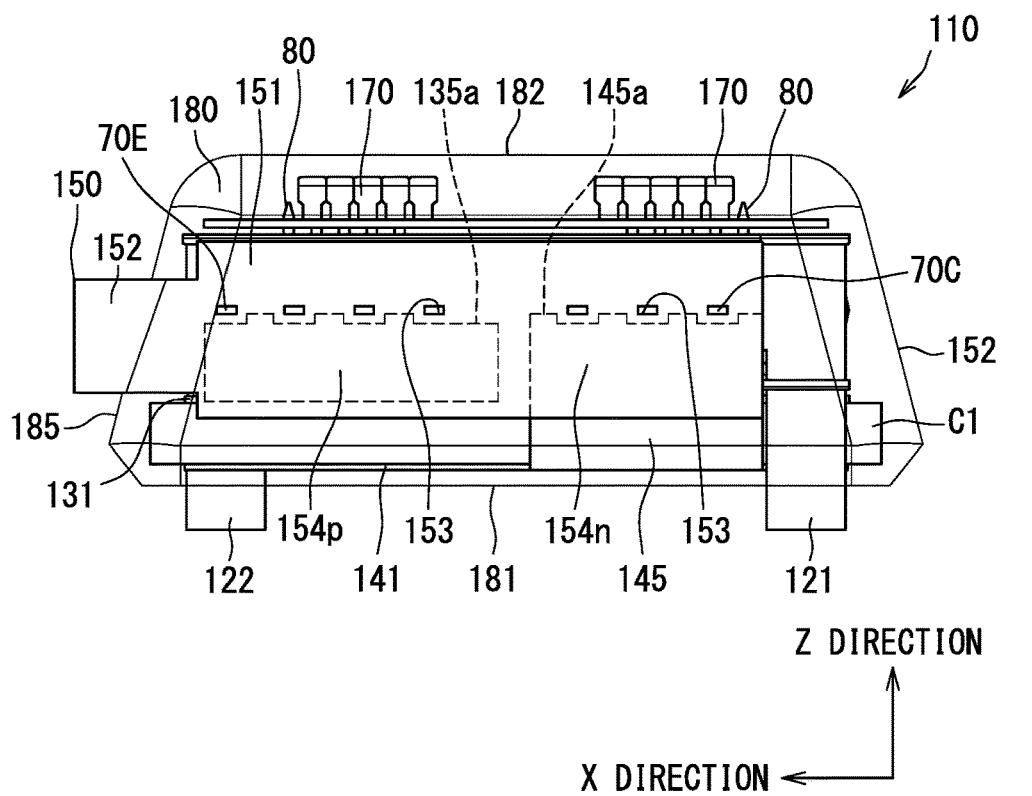
FIG. 25 is a plan view when

The common wiring portions 132 and 142 of the P bus bar 130 and the N bus bar 140 protrude, in the Y direction, from the lateral surface 183 close to the signal terminal 80 to the outside of the protective member 180. From the lateral surface 183, the external connection terminal 170 also protrudes. As shown in FIG. 21, in the X direction, the common wiring portions 132 and 142 are placed between the external connection terminal 170 close to the semiconductor device 20U and the external connection terminal 170 close to the semiconductor device 20L. As shown in FIG. 22, the external connection terminal 170 protrudes at positions close to the second surface 182, and the common wiring portions 132 and 142 protrude at positions near the first surface 181. Nothing protrudes from the lateral surface 183 and the opposite lateral surface 184, that is, the lateral surface 184 close to the main terminal 70. The narrow width portion 152 of the output bus bar 150 protrudes, in the X direction, from a lateral surface 185 close to the semiconductor device 20U to the outside of the protective member 180. Nothing protrudes from a lateral surface 186 opposite to the lateral surface 185, that is, a lateral surface close to the semiconductor device 20L.

In such a manner, only the supply pipe 121 and the discharge pipe 122 protrude from the first surface 181 of the protective member 180. Therefore, at a position close to the first surface 181, a cooler different from the power module 110 is placed. Thereby, when the power module 110 is cooled, the different cooler is easily connected to the supply pipe 121 and the discharge pipe 122. Since the lateral surface from which the common wiring portions 132 and 142 protrude is different from the lateral surface from which the output bus bar 150 protrudes, it may be possible to simplify the connection with the electric power line or the three phase winding.

Here, the surge generated by switching of the upper-lower arm circuit 10 increases as a current change amount (current change rate) per unit time increases or the wiring inductance increases. In the power module 110, the wiring inductance is reduced, and thereby the surge is reduced. Hereinafter, in the structure of the power module 110, a structure that reduces the wiring inductance to enable the surge reduction will be described.

Figure 28:
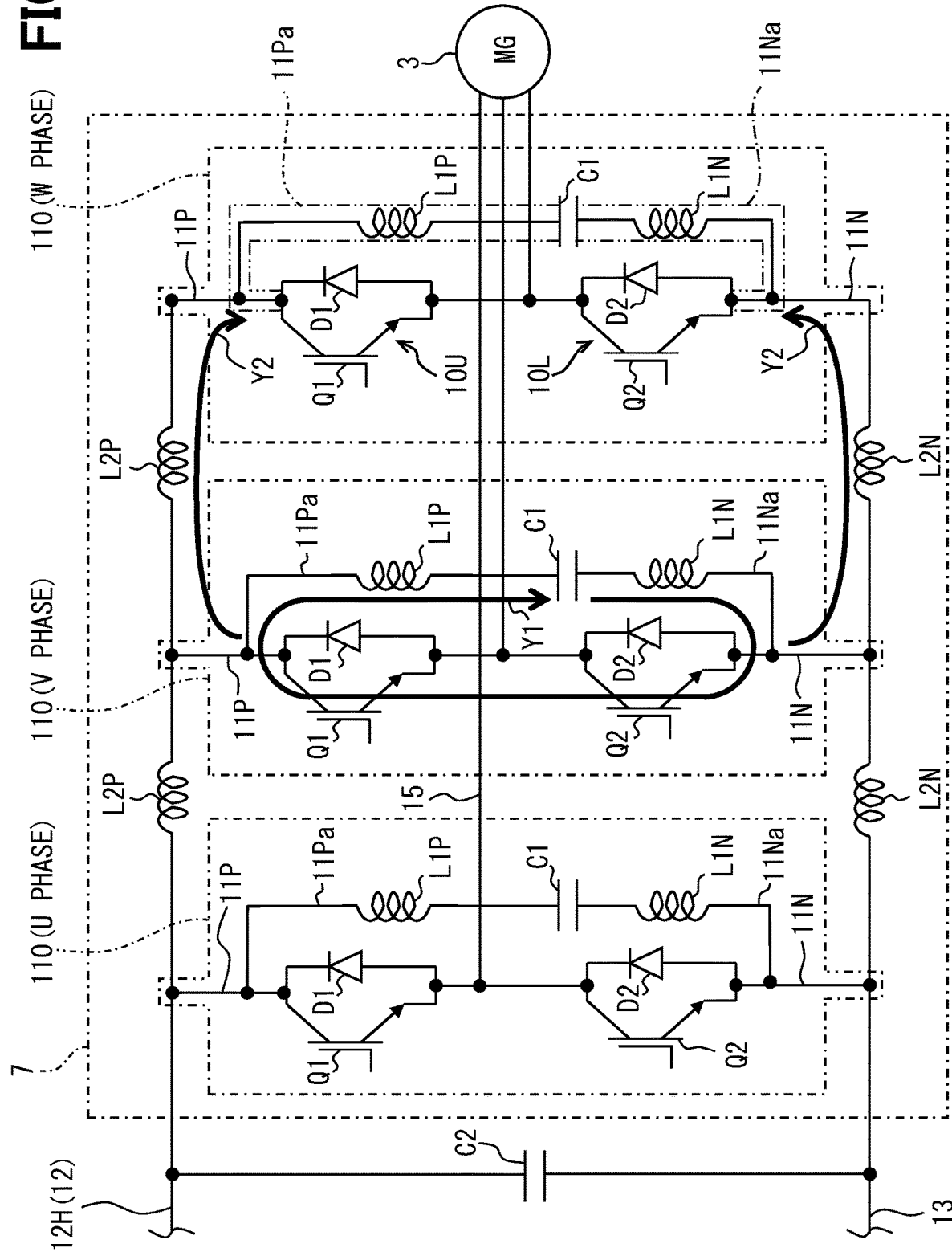
FIG. 28 is an equivalent circuit diagram including a wiring parasitic inductance.

FIG. 28 is a circuit diagram obtained by extracting the inverter 7, the smoothing capacitor C2, and the motor generator 3 from the equivalent circuit diagram of FIG. 1, and shows the wiring inductance parasitic on the circuit. As shown in a dashed dotted line of FIG. 28, the power module 110 of each phase is connected in parallel between the P line 12 and the N line 13, as described above.

The wiring inductance generated between portions connected to each power module 110 in the P line 12 is referred to as an interphase upper inductance L2P. Specifically, the wiring inductance generated at the interphase portion between a connection portion with the common wiring portion 132 for the U phase in the P line 12 and a connection portion with the common wiring portion 132 for the V phase in the P line 12 is the interphase upper inductance L2P. Further, the wiring inductance generated at an interphase portion between a connection portion with the common wiring portion 132 for the V phase in the P line 12 and the connection portion with the common wiring portion 132 for the W phase in the P line 12 is the interphase upper inductance L2P. An impedance generated in proportion to the interphase upper inductance L2P is referred to as an interphase upper impedance.

The wiring inductance generated at a portion connected to each power module 110 in the N line 13 is referred to as an interphase lower inductance L2N. Specifically, the wiring inductance generated at a connection portion with the common wiring portion 142 for the U phase in the N line 13 and the wiring inductance generated at a connection portion with the common wiring portion 142 for the V phase in the N line 13 are the interphase lower inductance L2N. The wiring inductance generated at a connection portion with the common wiring portion 142 for the V phase in the N line 13 and the wiring inductance generated at a connection portion with the common wiring portion 142 for the W phase in the N line 13 are the interphase lower inductance L2N. An impedance generated in proportion to the interphase lower inductance L2N is referred to as an interphase lower impedance.

A wiring inductance of the electric path from the positive electrode terminal of the capacitor C1 to the upper arm 10U inside the power module 110 is referred to as an in-phase upper inductance L1P. Specifically, the inductances generated at the parallel portion 134 of the P bus bar 130 and the bent portion 135 are the in-phase upper inductances L1P. A wiring of a portion where the in-phase upper inductance L1P is formed is referred to as an upper wiring 11Pa. An impedance generated in proportion to the in-phase upper inductance L1P is referred to as an in-phase upper impedance.

A wiring inductance of the electric path from the negative electrode terminal of the capacitor C1 to the lower arm 10L inside the power module 110 is referred to as an in-phase lower inductance L1N. Specifically, the wiring inductances generated at the parallel portion 144 of the N bus bar 140 and the bent portion 145 are the in-phase lower inductances L1N. A wiring of a portion where the in-phase lower inductance L1N is formed is referred to as a lower wiring 11Na. An impedance generated in proportion to the in-phase lower inductance L1N is referred to as an in-phase lower impedance.

Although each impedance has been described by taking the impedance as an example of the inverter 7 in FIG. 28, each impedance also corresponds to the inverter 8 and the converter 6 as follows. That is, the power module 110 placed at a first phase among the phases is referred to as a first power module, and the power module 110 placed at a second phase is referred to as a second power module. An impedance of an electric path from the positive electrode terminal of the capacitor C1 to the upper arm 10U in the first power module corresponds to the in-phase upper impedance. An impedance of an electric path from the positive electrode terminal of the capacitor C1 in the first power module to the upper arm 10U in the second power module corresponds to the interphase upper impedance. An impedance of an electric path from the negative electrode terminal of the capacitor C1 to the lower arm 10L in the first power module corresponds to the in-phase lower impedance. An impedance of an electric path from the negative electrode terminal of the capacitor C1 in the first power module to the lower arm 10L in the second power module corresponds to the interphase lower impedance.

A length of the wiring for forming the interphase upper inductance L2P is longer than a length of the wiring for forming the in-phase upper inductance L1P. Therefore, the interphase upper inductance L2P is larger than the in-phase upper inductance L1P, and the interphase upper impedance is larger than the in-phase upper impedance. A length of the wiring for forming the interphase lower inductance L2N is longer than a length of the wiring for forming the in-phase upper inductance L1P. Therefore, the interphase lower inductance L2N is larger than the in-phase lower inductance L1N, and the interphase lower impedance is larger than the in-phase lower impedance. Each of the interphase upper inductance L2P and the interphase lower inductance L2N is larger than a value obtained by adding the in-phase lower inductance L1N to the in-phase upper inductance L1P.

An arrow Y1 in FIG. 28 indicates a path in which the surge voltage is absorbed by the capacitor C1 in a closed loop circuit formed in the parallel circuit 11 in the V phase. This surge voltage is generated when the switching elements Q1 and Q2 in the V phase are turned on and turned off. Similarly, also in the U phase and the W phase, the surge voltage is absorbed by the capacitor C1 as shown by the arrow Y1. The surge voltage generated and absorbed in the same phase in such a manner is also referred to as a self-surge voltage in the following description.

The closed loop circuit is a circuit formed by the parallel circuit 11. In the closed loop circuit, the positive electrode terminal of the capacitor C1, the upper wiring 11Pa, the upper-lower arm circuit 10, the lower wiring 11Na, and the negative electrode of the capacitor C1 are connected in series in this order. The closed loop circuit does not include the electric power line. The closed loop circuit is referred to as a path in which the surge voltage is absorbed as described above, and is also referred to as a path in which the electric charges required for the switching of the switching elements Q1 and Q2 are supplied from the capacitor C1 to the switching elements Q1 and Q2.

The closed loop circuit is a circuit that does not include the common wirings 11P and 11N. In other words, the P bus bar 130 is branched into a portion shown by a long dashed double-dotted line in FIG. 28 for forming the upper wiring 11Pa and a portion for forming the common wiring 11P. The common wiring 11P of the P bus bar 130 is also referred to as an upper electric power wiring that connects the P line 12 and the upper wiring 11Pa. The N bus bar 140 is branched into a portion shown by a long dashed double-dotted line in FIG. 28 for forming the lower wiring 11Na and a portion for forming the common wiring 11N. The common wiring 11N of the N bus bar 140 is also referred to as a lower electric power wiring that connects the N line 13 and the lower wiring 11Na.

An arrow Y2 in FIG. 28 indicates a path when the self-surge voltage generated in the V phase propagates from the closed loop circuit in the V phase to the closed loop circuit in the W phase via the electric power line. The surge voltage that interferes with the multiple upper-lower arm circuits 10 in such a manner is also referred to as an interference surge voltage in the following description. Similarly to the interference surge voltage propagating between the V phase and the W phase, the interference voltage may occur between the V phase and the U phase or between the W phase and the U phase. However, since the interphase upper inductance L2P is sufficiently larger than the in-phase upper inductance L1P, the interference surge voltage propagated from another phase to the own phase hardly occurs. The interference surge voltage is extremely smaller than the self-surge voltage.

When the electric charge is supplied to the upper-lower arm circuit 10 connected in parallel, the electric charge is instantaneously supplied from the smoothing capacitor C2 to the capacitor C1. Thereby, the capacitor C1 can supply the electric charge again.

Next, the effect of the power module 110 will be described.

The power module 110 includes the upper-lower arm circuit 10, the capacitor C1, the upper wiring 11Pa, the lower wiring 11Na, the common wiring 11P as the upper electric power wiring, and the common wiring 11N as the lower electric power wiring. The upper wiring 11Pa connects the positive electrode terminal of the capacitor C1 and the upper arm 10U. The lower wiring 11Na connects the negative electrode of the capacitor C1 and the lower arm 10L. The common wirings 11P and 11N respectively connect the upper wiring 11Pa and the lower wiring 11Na to the electric power lines.

Accordingly, the power module 110 forms the closed loop circuit that does not include the electric power line. Therefore, when the electric charge required for the switching of the upper-lower arm circuit 10 is supplied from the capacitor C1, the electric charge supply path does include the electric power line. Therefore, the wirings of the path, that is, the upper wiring 11Pa and the lower wiring 11Na can be shortened. On the other hand, when the capacitor C1 is abolished contrary to the present embodiment, the electric charge required for the switching is supplied from the smoothing capacitor C2. Then, since the electric power path for supplying the electric charges from the smoothing capacitor C2 to the upper-lower arm circuit 10 includes the electric power line, the electric path cannot be sufficiently shortened.

As described above, according to the power module 110, it may be possible to easily shorten the wiring length that is one factor of the surge voltage occurrence as compared with the configuration in which the capacitor C1 is abolished. Therefore, the wiring inductances L1P and L1N related to the self-surge voltage can be reduced, and the self-surge voltage generated at the upper-lower arm circuit 10 can be reduced. Moreover, since the closed loop circuit does not include the electric power line, it is difficult for the self-surge voltage to be superimposed on the self-surge voltage. Therefore, it may be possible to prevent the other upper-lower arm circuits 10 from interfering with the self-surge voltage via the electric power line.

The power module 110 capable of reducing the surge voltage as described above is placed in each phase. Therefore, it may be possible to promote the prevention of the self-surge voltage interference between the upper-lower arm circuits 10 via the electric power line.

Further, in the present example, the upper arm 10U has the multiple main terminals 70C connected to the upper wiring 11Pa. The lower arm 10L has the multiple main terminals 70E connected to the lower wiring 11Na. Therefore, the self-surge voltages of the adjacent main terminals 70C and 70E act so as to cancel each other, and it may be possible to reduce the in-phase upper inductance L1P and the in-phase lower inductance L1N. Thereby, the reduction of the self-surge voltage is promoted.

Further, in the present example, the output bus bar 150 (that is, output wiring 15) connecting the main terminal 70E of the upper arm 10U and the main terminal 70C of the lower arm 10L is provided. The output bus bar 150 has the facing portions 154p and 154n facing the upper wiring 11Pa and the lower wiring 11Na. Therefore, between the facing portions 154p and 154n of the output bus bar 150 and the upper wiring 11Pa and the lower wiring 11Na, the self-surge voltages act so as to cancel each other, and it may be possible to reduce the in-phase upper inductance L1P and the in-phase lower inductance L1N. Thereby, the reduction of the self-surge voltage is promoted. In particular, in the present example. in a configuration including the semiconductor device 20 having the 1-in-1 package structure, the P bus bar 130 and the N bus bar 140 face the output bus bar 150 in the Y direction. In the projection view in the Y direction, the output bus bar 150 and the semiconductor device 20 overlap each other. In the Y direction, the facing portion 135a of the P bus bar 130 is placed between the semiconductor chip 40U and the output bus bar 150. Similarly, in the Y direction, the facing portion 145a of the N bus bar 140 is placed between the semiconductor chip 40L and the output bus bar 150. Accordingly, the current path from the P bus bar 130 to the output bus bar 150 via the semiconductor chip 40U and the current path from the output bus bar 150 to the N bus bar 140 via the semiconductor chip 40L are shown by the long dashed double-dotted line arrow in FIG. 23. Accordingly, it may be possible to reduce the area of a current loop as compared with a 2-in-1 package in which two semiconductor chips configuring the upper-lower arm circuit 10 are provided in one package. Thereby, it may be possible to further reduce the self-surge voltage.

Further, in the present example, the interphase upper impedance is larger than the in-phase upper impedance. The interphase lower impedance is larger than the in-phase lower impedance. Therefore, as shown by an arrow Y2 of FIG. 28, it may be possible to prevent the surge voltage from propagating over the closed loop circuit of each phase and interfering with the circuit.

Further, in the present example, the smoothing capacitor C2 is connected to the upper-lower arm circuit 10 in parallel, and smooths the voltage of the electric power line. According to this, it may be possible to prevent the voltage of the electric power line from fluctuating. Since the electric charge is instantaneously supplied from the smoothing capacitor C2 to the capacitor C1, it may be possible to suppress the capacitance of the capacitor C1. Thereby, it may be possible to reduce the size of the capacitor C1.

As the semiconductor device 20, the example in which two semiconductor devices 20 having the 1-in-1 package structure has been shown. However, the semiconductor device 20 is not limited to this. A semiconductor device having the 2-in-1 package structure in which the two arms (upper arm 10U and lower arm 10L) configuring the upper-lower arm circuit 10 is packaged in element units can be used.

The arrangement of the main terminals 70 is not limited to the example described above. When the semiconductor device 20 has the 1-in-1 package, it is sufficient that the main terminals 70 includes at least one main terminal 70C and at least one main terminal 70E. The main terminals 70 having the same potential may be divided into multiple terminals. For example, the main terminal 70C may be divided into multiple terminals. By parallelizing the multiple terminals. it may be possible to reduce the entire inductance of the divided terminals. When the semiconductor device 20 has the 2-in-1 package, it is sufficient that at least one main terminal 70C close to the upper arm 10U, at least one main terminal 70E close to the lower arm 10L, and at least one output terminal are provided.

Figure 29:
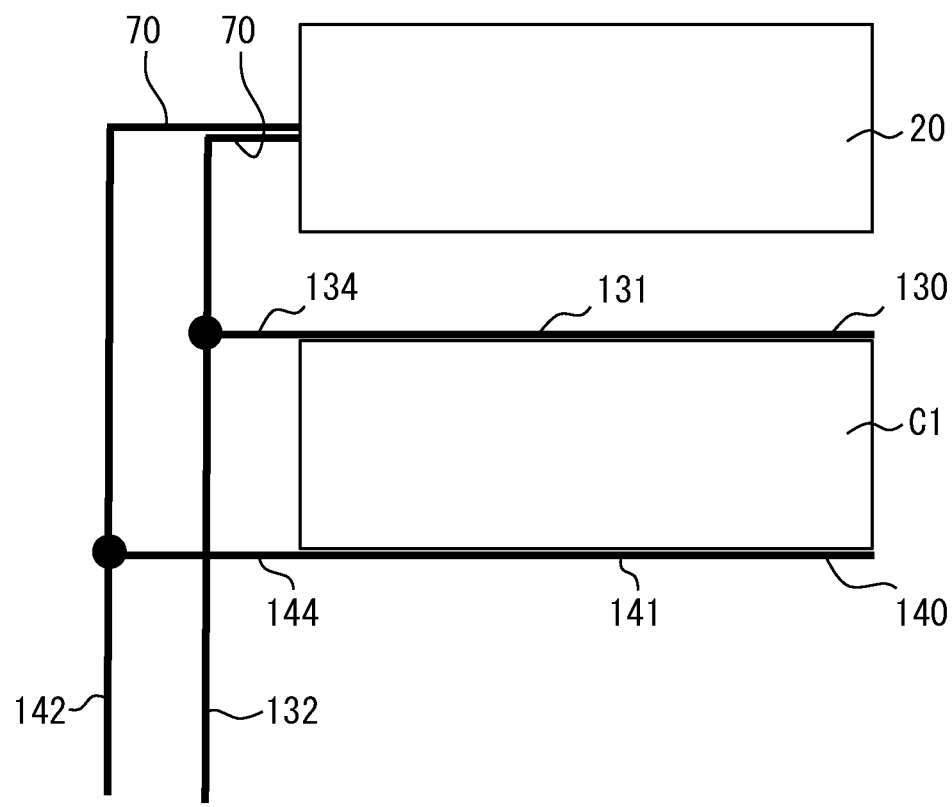
FIG. 29 is a schematic diagram showing another example of FIG. 27.

In an example shown in FIG. 27, the common wiring portions 132 and 142 extend to the opposite sides of the connection portions 131 and 141 with respect to the parallel portions 134 and 144. On the other hand, as shown in FIG. 29, the common wiring portions 132 and 142 may extend to the parallel portions 134 and 144 with respect to the connection portions 131 and 141. The upper arm 10U and the lower arm 10L have the different extension directions of the common wiring portions 132 and 142. For example, the common wiring portions 132 and 142 may not be placed so as to face each other.

Although, in the example shown in FIG. 27, the upper arm 10U and the lower arm 10L have the multiple main terminals 70C and 70E, the upper arm 10U and the lower arm 10L may include one main terminal 70C and one main terminal 70E. Although, in the example shown in FIG. 27, the main terminal 70C and the main terminal 70E are alternately arranged, the multiple main terminals 70C may be arranged or the multiple main terminals 70E may be arranged.

Contrary to the example shown in FIG. 27, the interphase upper impedance may be smaller than the in-phase upper impedance. The interphase lower impedance may be smaller than the in-phase lower impedance.

As another example of the power module 110, at least one of the cooler 120 of the power module 110, the drive substrate 160, or the protective member 180 may be abolished. The smoothing capacitor C2 may be the abolished electric power conversion device 5. The capacitor C1 may be placed outside the protective member 180. The structure of the cooler 120 may not be limited to the example described above. A part of the semiconductor device 20 configuring the upper-lower arm circuit 10 may be inserted into the flow path 126 inside the cooler 120, and immersed in the refrigerant. In this configuration, the capacitor C1 may be placed on the cooler 120, and connected to the semiconductor device 20. By immersion, it may be possible to suppress the surge voltage while cooling the semiconductor device 20 from both sides.

(Electric Power Conversion Device)

Figure 30:
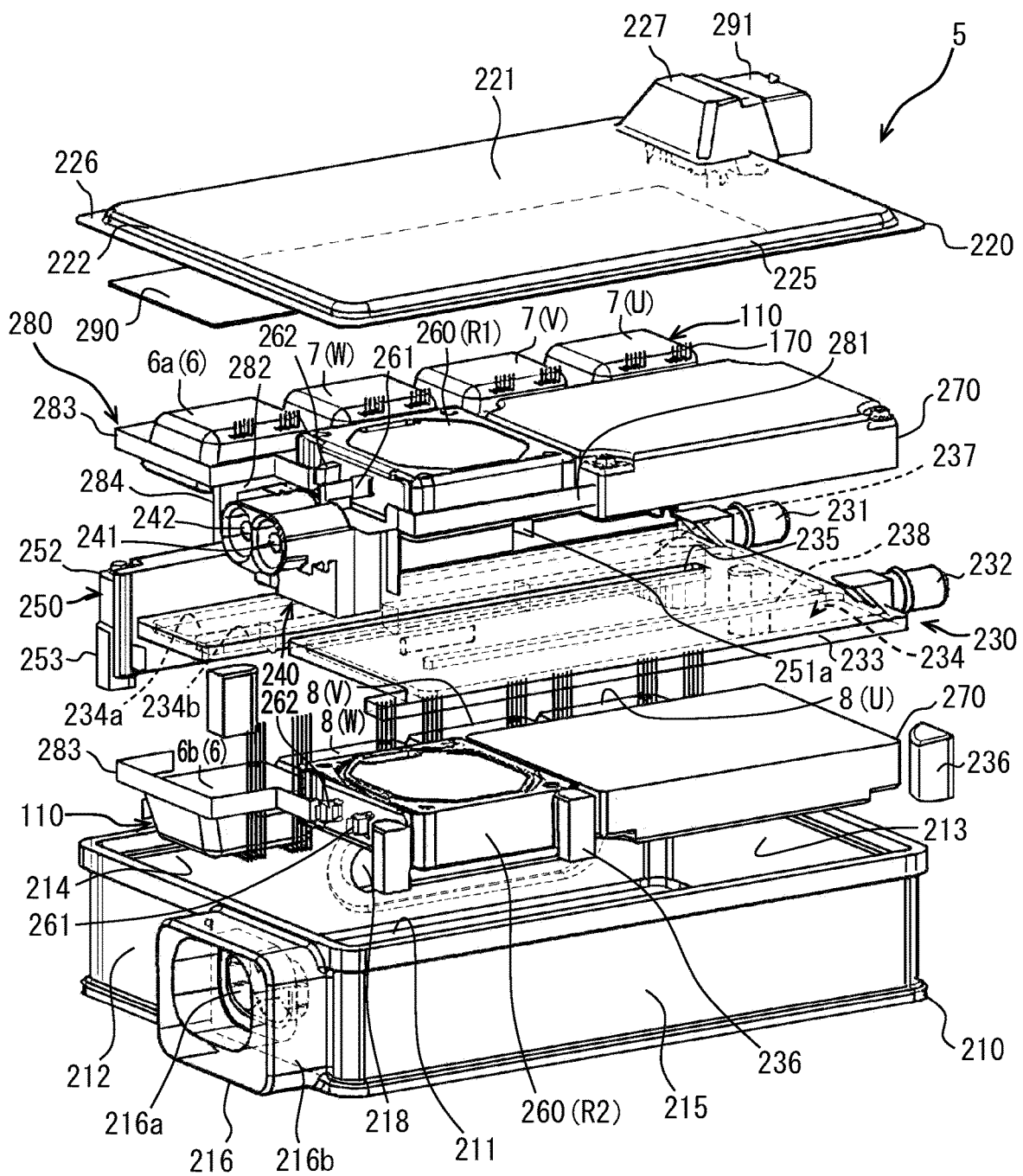
FIG. 30 is a perspective view showing the disassembled electric power conversion device according to the first embodiment.
Figure 31:
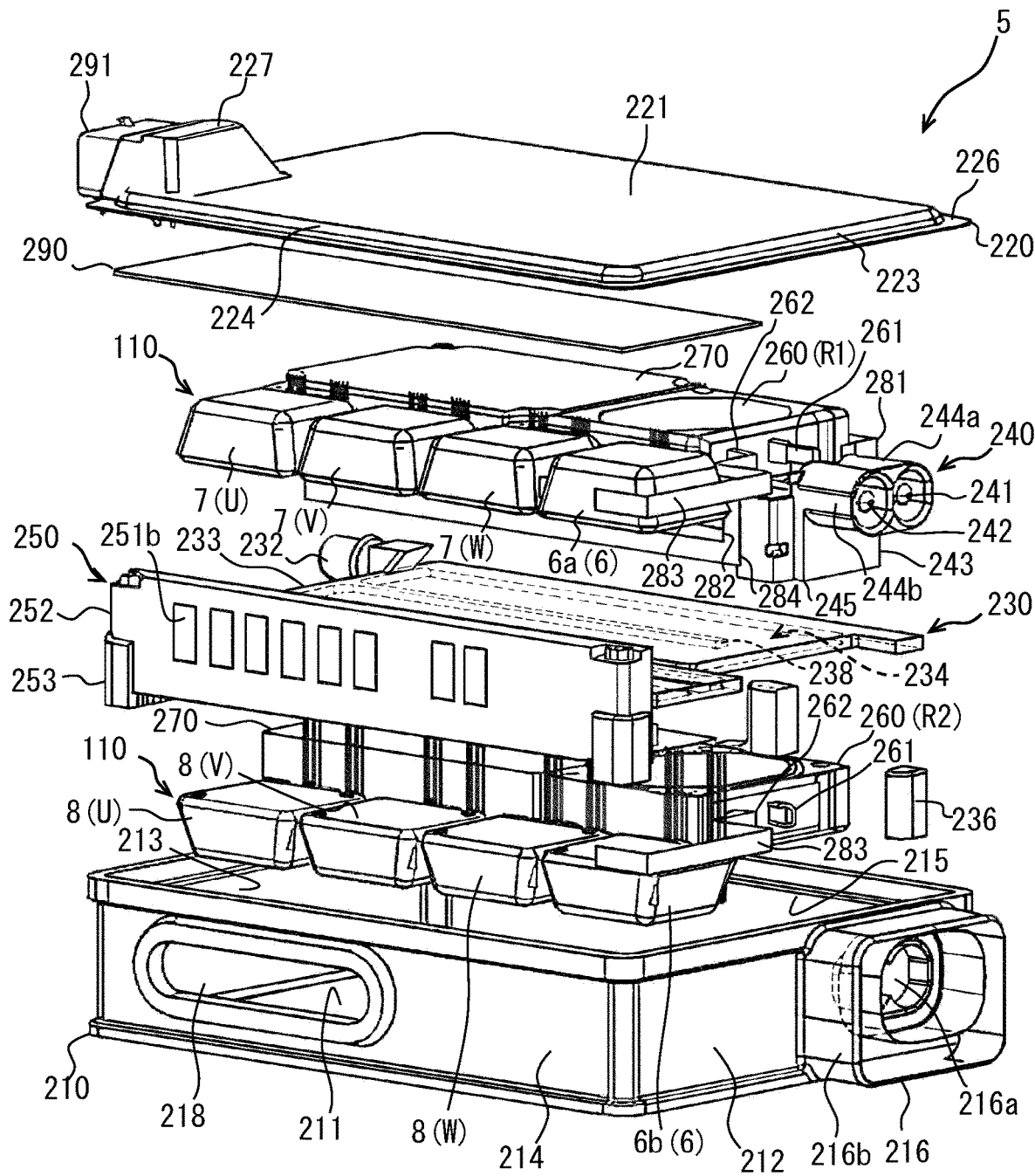
FIG. 31 is a perspective view showing the disassembled electric power conversion device.

As shown in FIGS. 30 to 44, the electric power conversion device 5 includes a case 210 and a cover 220 that configure a housing, the cooler 230, the multiple power modules 110, an input terminal block 240, an output terminal block 250, a reactor 260, a capacitor unit 270, a bus bar 280, and the control substrate 290. FIG. 30 and FIG. 31 are exploded perspective views. In FIG. 30 and FIG. 31, for convenience, penetration holes 217a and 217b described later are omitted. Holes to which the supply pipe 121 of the cooler 120 of the power module 110 and the discharge pipe 122 are attached are also omitted. The perspective views shown in FIGS. 32 to 35, elements housed in the case 210 and the cover 220 are shown by solid lines. Also in plan views shown in FIGS. 36 to 41, the elements housed in the case 210 and the cover 220 are shown by solid lines.

In an internal space of the housing configured by assembling the case 210 and the cover 220, at least a part of each of the other elements is housed. As both of configuration materials of the case 210 and the cover 220, metal materials or resin materials can be used. As one of the configuration material of the case 210 or the configuration material of the cover 220, the metal material can be used, and, as the other, the resin material can be used. In the present example, both of the case 210 and the cover 220 are formed by a die casting method with use of the metal material, specifically, an aluminum-based material.

The case 210 has a box shape whose one surface is open. The case 210 has a bottom wall 211 having a substantially rectangular plane with the X direction as the longitudinal direction, and the lateral walls 212 to 215 connected to four edges of the bottom wall 211. The lateral walls 212 to 215 are erected in the Z direction with respect to the bottom wall 211, and have the substantially rectangular annular plane shape so as to surround an inner surface of the bottom wall 211.

Figure 36:
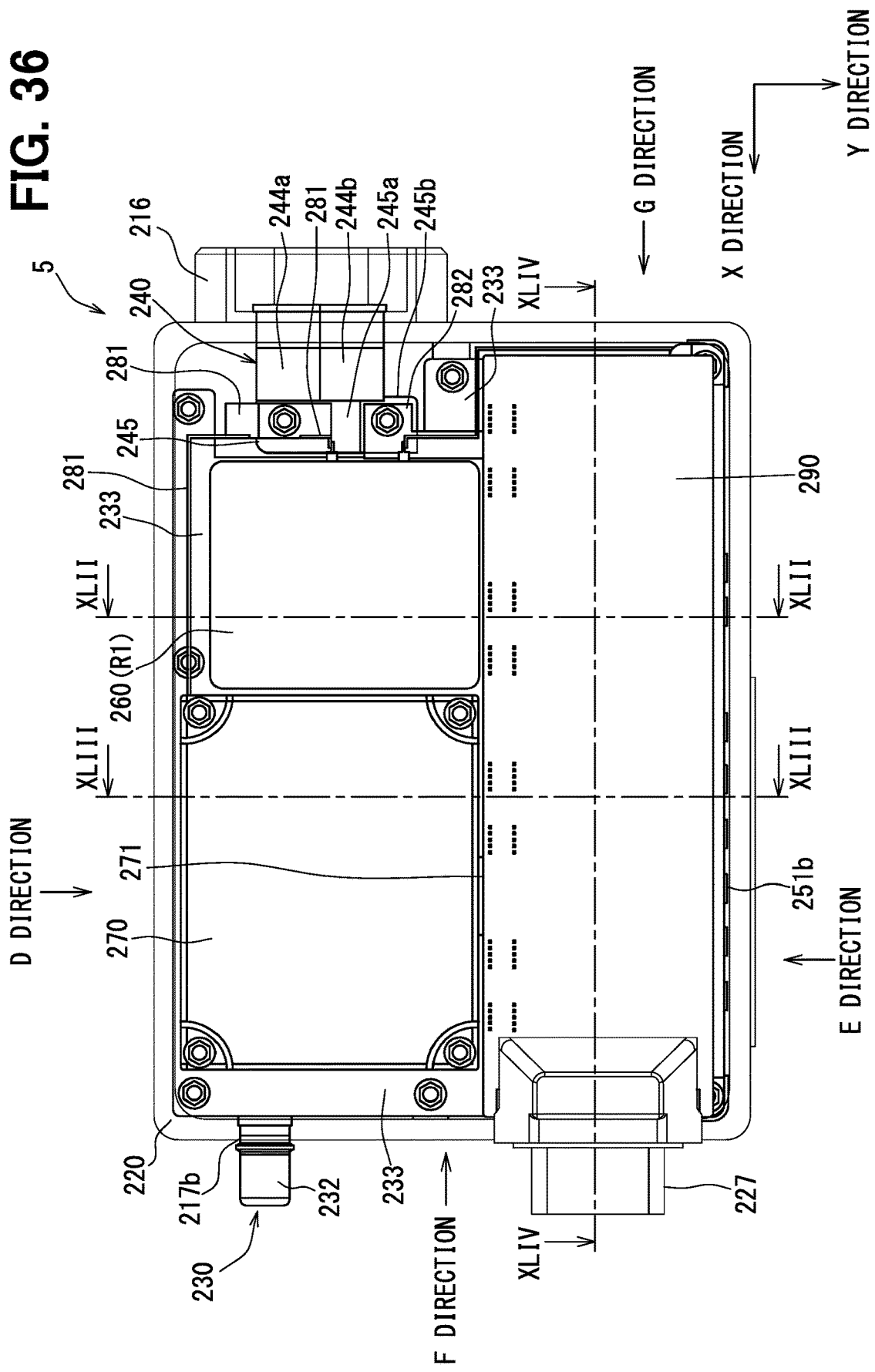
FIG. 36 is a plan view showing the electric power conversion device.

As shown in FIGS. 30, 31, 36, and the like, an attachment portion 216 is formed on the lateral wall 212 in the X direction. The attachment portion 216 has a penetration hole 216a penetrating the lateral wall 212. The input terminal block 240 is fixed to the case 210 in a state of being inserted into the penetration hole 216a. The penetration hole 216a has a substantially 8-shaped in the ZY cross section. That is, the penetration hole 216a has a shape in which two penetration hole arranged in the Y direction are connected and formed into one hole.

The attachment portion 216 has an accommodation portion 216b that accommodates at least a part of the terminal portion close to the direct current power source 2. The accommodation portion 216b has a cylinder shape, and extends in the X direction from the outer surface of the lateral wall 212. The accommodation portion 216b is placed so that the cylinder portion encompass the penetration hole 216a in the projection view from the X direction. The terminal portion of the direct current power source 2 is electrically connected to the terminal portion of the input terminal block 240 in a state of being fixed to the accommodation portion 216b. The accommodation portion 216b is fitted with the housing of the terminal portion close to the direct current power source 2, for example. The attachment portion 216 including the penetration hole 216a is placed in a region closer to one end than a central portion of the lateral wall 212 in the Y direction, specifically, a region close to the lateral wall 215.

Figure 32:
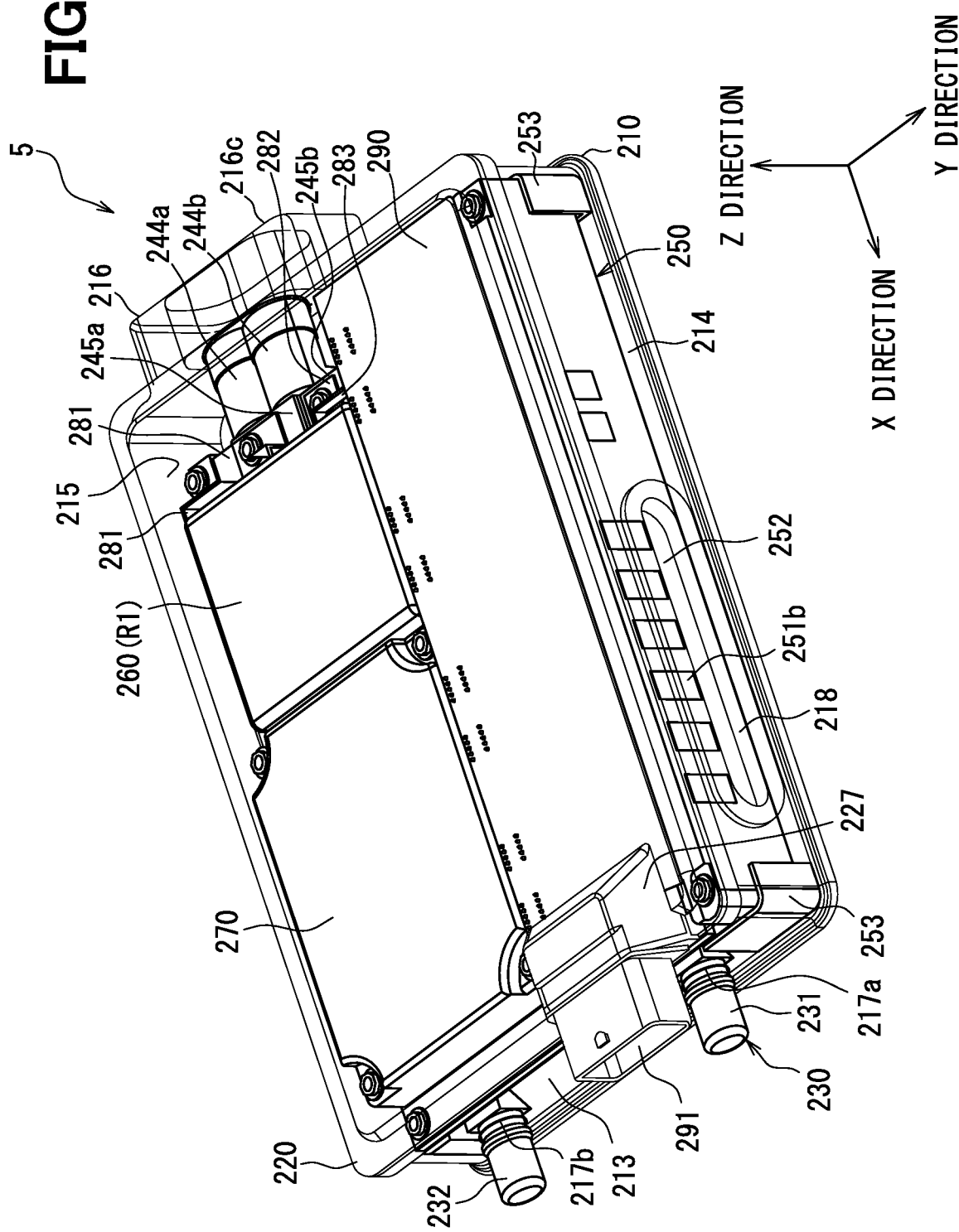
FIG. 32 is a perspective view showing the electric power conversion device.
Figure 33:
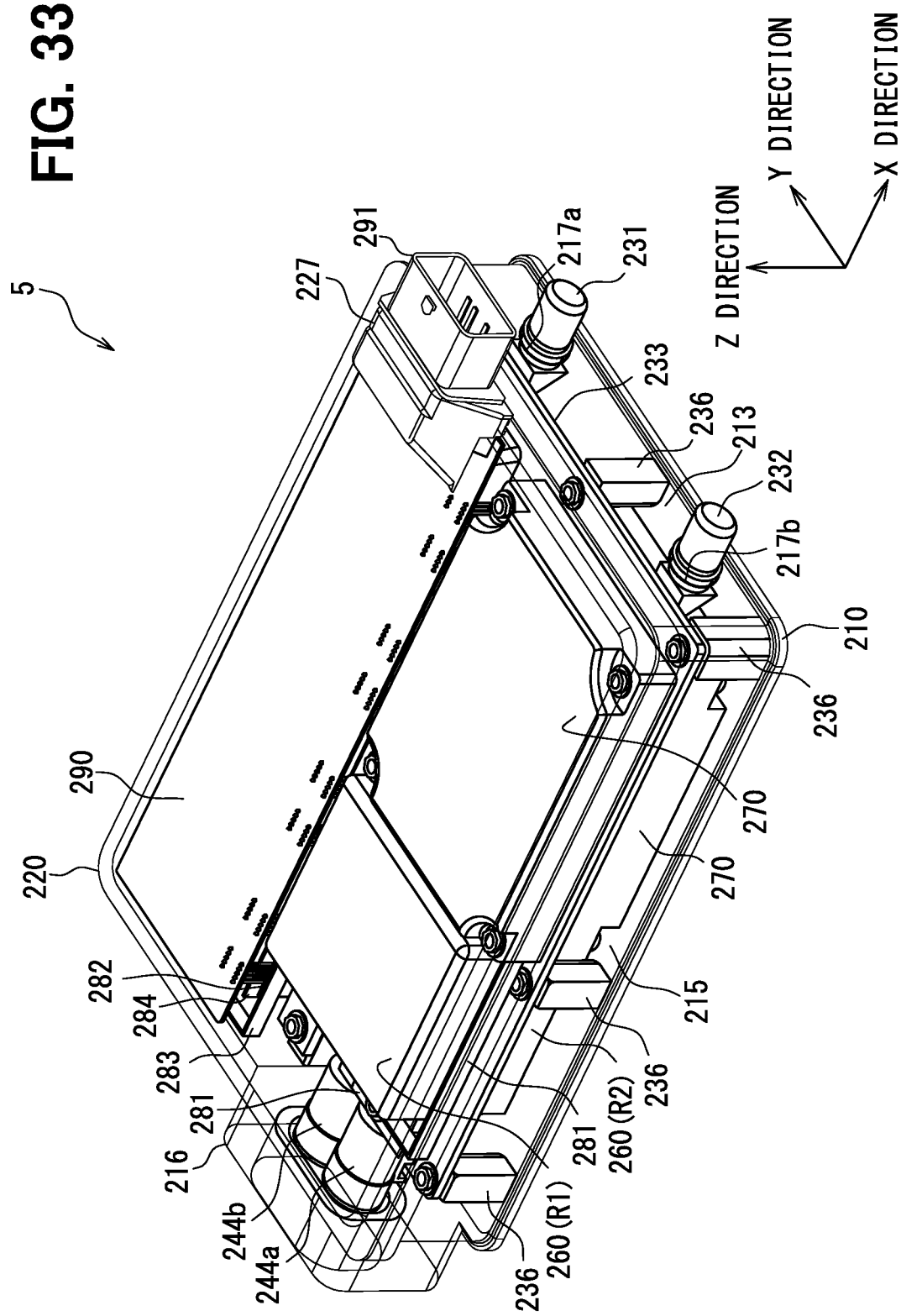
FIG. 33 is a perspective view showing the electric power conversion device.
Figure 34:
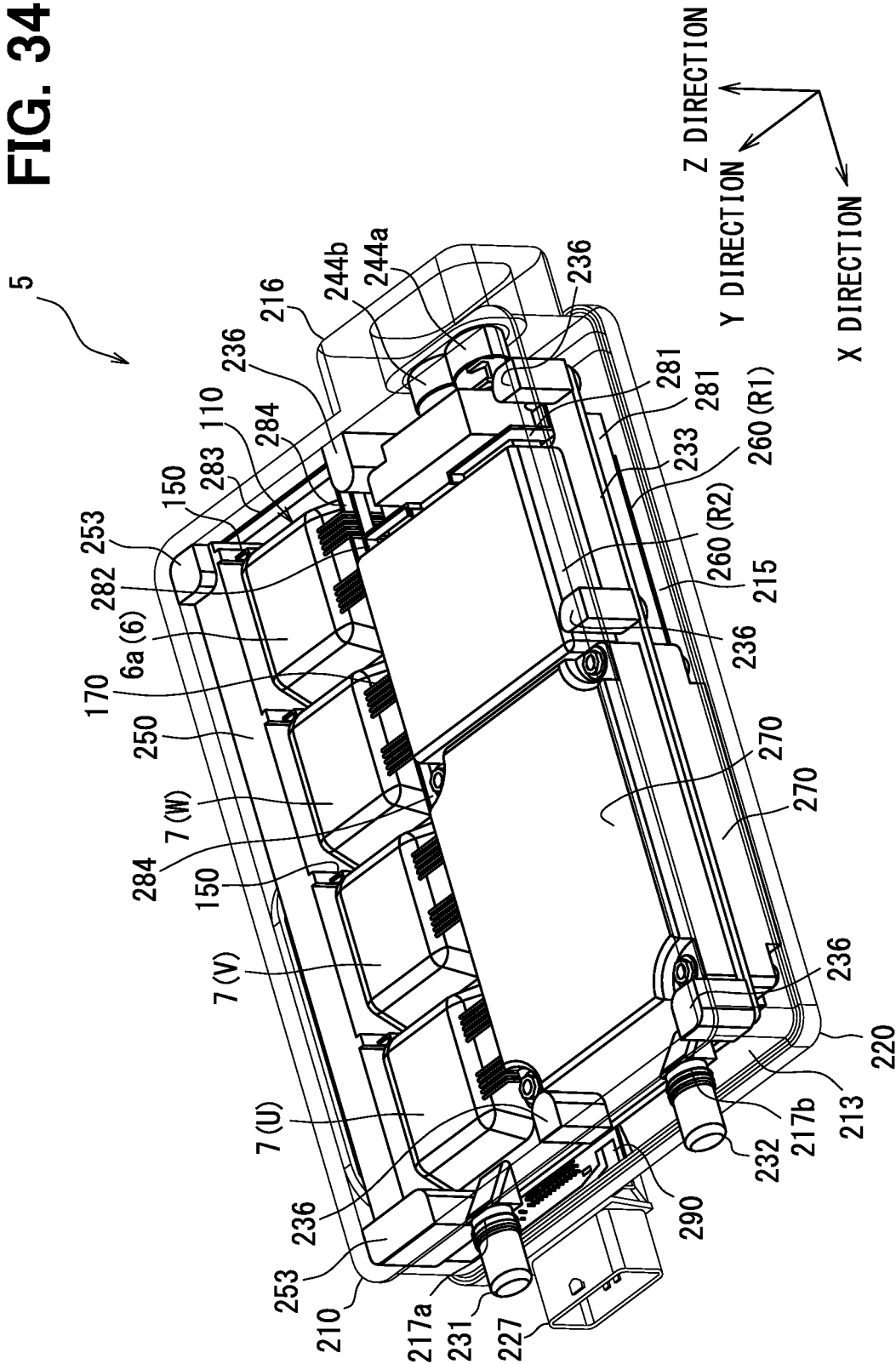
FIG. 34 is a perspective view showing the electric power conversion device.

At the lateral wall 212 and an opposite lateral wall 213, as shown in FIGS. 32 to 34 or the like, penetration holes 217a and 217b are formed. A supply pipe 231 of the cooler 230 is inserted into the penetration hole 217a, and a waterproof portion (not shown) is formed between the supply pipe 231 and the periphery of the opening of the penetration hole 217a. A discharge pipe 232 of the cooler 230 is inserted into the penetration hole 217b, and a waterproof portion (not shown) is formed between the discharge pipe 232 and the periphery of the opening of the penetration hole 217b.

Positions of the two penetration holes 217a and 217b are same in the Z direction. The penetration holes 217a and 217b are separated from each other in the Y direction. The penetration hole 217a is placed in a region closer to one end than a central portion of the lateral wall 213 in the Y direction, specifically, a region close to a lateral wall 214. The penetration hole 217b is placed in a region closer to the other end than a central portion of the lateral wall 213, specifically, a region close to the lateral wall 215.

Figure 35:
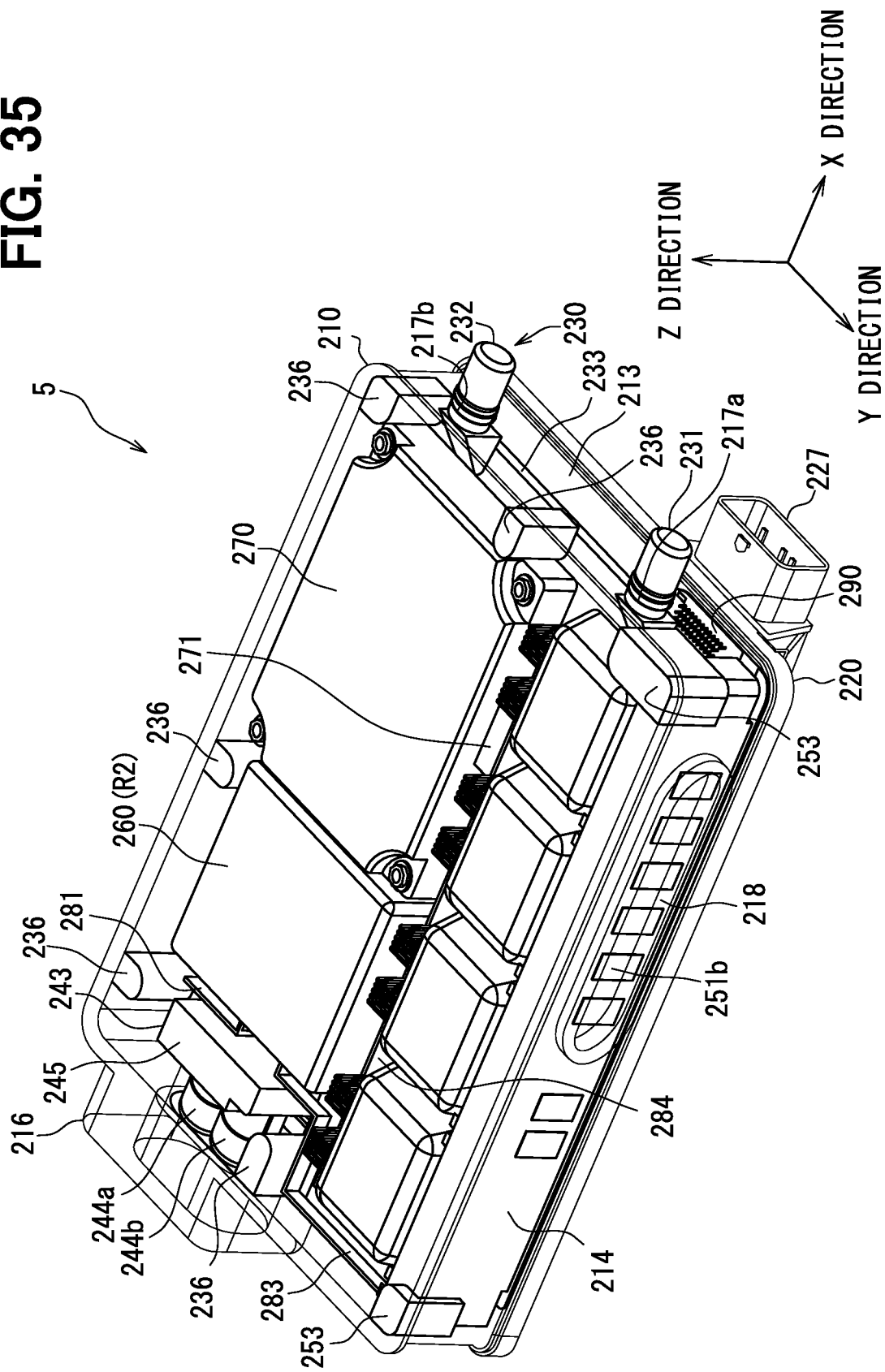
FIG. 35 is a perspective view showing the electric power conversion device.

As shown in FIGS. 31 and 35, and the like, an opening portion 218 is formed on the lateral wall 214 in the Y direction. The opening portion 218 penetrates the lateral wall 214 in the Y direction, and has a hole of which length in the X direction is longer than that in the Z direction. The opening portion 218 is placed for connecting the terminal of the output terminal block 250 and the three phase windings of the motor generators 3 and 4 that are loads. The opening portion 218 is formed at a position close to the lateral wall 213 in the X direction. The penetration hole or the like is not formed at the lateral wall 215 positioned opposite to the lateral wall 214.

The cover 220 has a box shape whose bottom is shallow as compared with that of the case 210. The cover 220 has a bottom wall 221 having a substantially rectangular plane with the X direction as the longitudinal direction, lateral walls 222 to 225 connected to four edges of the bottom wall 221, and a flange portion 226. The bottom wall 221 faces the bottom wall 211 of the case 210 in the Z direction. The lateral walls 222 to 225 are erected in the Z direction with respect to the bottom wall 221, and have the substantially rectangular annular plane shape so as to surround an inner surface of the bottom wall 221. The lateral walls 222 to 225 correspond to the lateral walls 212 to 215 of the case 210. For example, the lateral wall 223 is placed close to the lateral wall 213 in the X direction, and the lateral wall 224 is placed close to the lateral wall 214 in the Y direction.

The flange portion 226 is an outer peripheral edge of the cover 220, and is connected to an opposite end of the lateral walls 222 to 225 to the bottom wall 221. The flange portion 226 extends from the lateral walls 222 to 225 to the outside opposite to the accommodation space in the Y direction. In a state where the flange portion 226 and the ends of the lateral walls 212 to 215 in the case 210, specifically, the ends opposite to the bottom wall 211 face each other, the case 210 and the cover 220 are assembled by fastening. Between the case 210 and the outer peripheral edge of the cover 220, a sealing member (not shown), for example, an O ring, or a liquid adhesive before curing, or the like is placed, and the waterproof sealing portion is formed.

On the cover 220, a recess 227 is formed. The recess 227 is placed so as to associate the control substrate 290 with a connector 291 described later. The recess 227 is provided with including the lateral wall 223, and the opening portion of the wall side 223 is connected to the opening portion of the box-shaped cover 220 close to the one surface. In such a manner, the recess 227 opens not only one surface but also the lateral wall 223. The recess 227 is recessed in a direction away from the bottom wall 211. The recess 227 provides an open space having a substantially trapezoidal plane shape on the lateral wall 223. The recess 227 is placed in a region closer to the lateral wall 224 than the central portion of the lateral wall 223 in the Y direction. In the projection view from the Z direction, the opening portion of the recess 227 in the lateral wall 223 is placed at a position overlapping the penetration hole 217a.

The cooler 230 mainly cools the elements inside the housing configuring the electric power conversion device 5. The cooler 230 is formed of, for example, a material having excellent thermal conductivity, for example, an aluminum-based material. As shown in FIG. 30, FIG. 31, and the like, the cooler 230 includes the supply pipe 231, the discharge pipe 232, and the heat exchange portion 233. Most of the cooler 230 is placed inside the case 210, and a part of the cooler 230 protrudes from the case 210 to the outside.

The supply pipe 231 is a tubular body including a flow path therein, and extends in the X direction. The supply pipe 231 is placed close to, in the Y direction, one end of the plate-shaped heat exchange portion 233 whose thickness direction is the Z direction, specifically, is placed close to the lateral wall 215 of the case 210. One end of the supply pipe 231 opens, and the other end is connected to the heat exchange portion 233. The flow path of the supply pipe 231 communicates with a flow path 234 of the heat exchange portion 233. A part of the supply pipe 231 protrudes out of the case 210 via the penetration hole 217a placed at the lateral wall 213 of the case 210. Between the wall surface of the penetration hole 217a and the supply pipe 231, a waterproof seal portion is formed of a seal member (not shown).

The discharge pipe 232 is a tubular body including a flow path therein, and extends in the X direction. The discharge pipe 232 is placed at a position away from the supply pipe 231 in the Y direction, and, specifically, placed close to the wall surface 214 of the case 210. One end of the discharge pipe 232 opens, and the other end is connected to the heat exchange portion 233 similarly to the supply pipe 231. The flow path of the discharge pipe 232 communicates with the flow path 234 of the heat exchange portion 233. A part of the discharge pipe 232 protrudes out of the case 210 via the penetration hole 217b placed at the lateral wall 213 of the case 210. Between the wall surface of the penetration hole 217b and the discharge pipe 232, a waterproof seal portion is formed of a seal member (not shown).

The heat exchange portion 233 has the flow path 234 in which the refrigerant flows. One end of the flow path 234 is connected to the supply pipe 231, and the other end opposite to the end connected to the supply pipe 231 is connected to the discharge pipe 232. The refrigerant flowing in from the supply pipe 231 flows through the flow path 234 inside the heat exchange portion 233, and is discharged from the discharge pipe 232. The heat exchange portion 233 has a first surface 233a and a second surface 233b opposite to the first surface 233a in the Z direction. In the present example, the electric power conversion device 5 includes the multiple power modules 110, and each of the power modules 110 is placed on the first surface 233a and the second surface 233b. The electric power conversion device 5 includes the power module 110 placed on the first surface 233a and the power module 110 placed on the second surface 233b. In such a manner, the power module 110 is placed on both of surfaces of the heat exchange portion 233. The power module 110 is placed adjacent to the heat exchange portion 233.

The heat exchange portion 233 has the flat plate shape. A length of the heat exchange portion 233 in the Z direction, that is, a thickness is substantially constant, at least, at a portion where the flow path 234 is formed. In the present example, the length in the Z direction is sufficiently smaller than the minimum length in a direction orthogonal to the Z direction, that is, the minimum length in the X direction and the minimum length of the Y direction. That is the heat exchange portion 233 has a thin plate shape.

Figure 37:
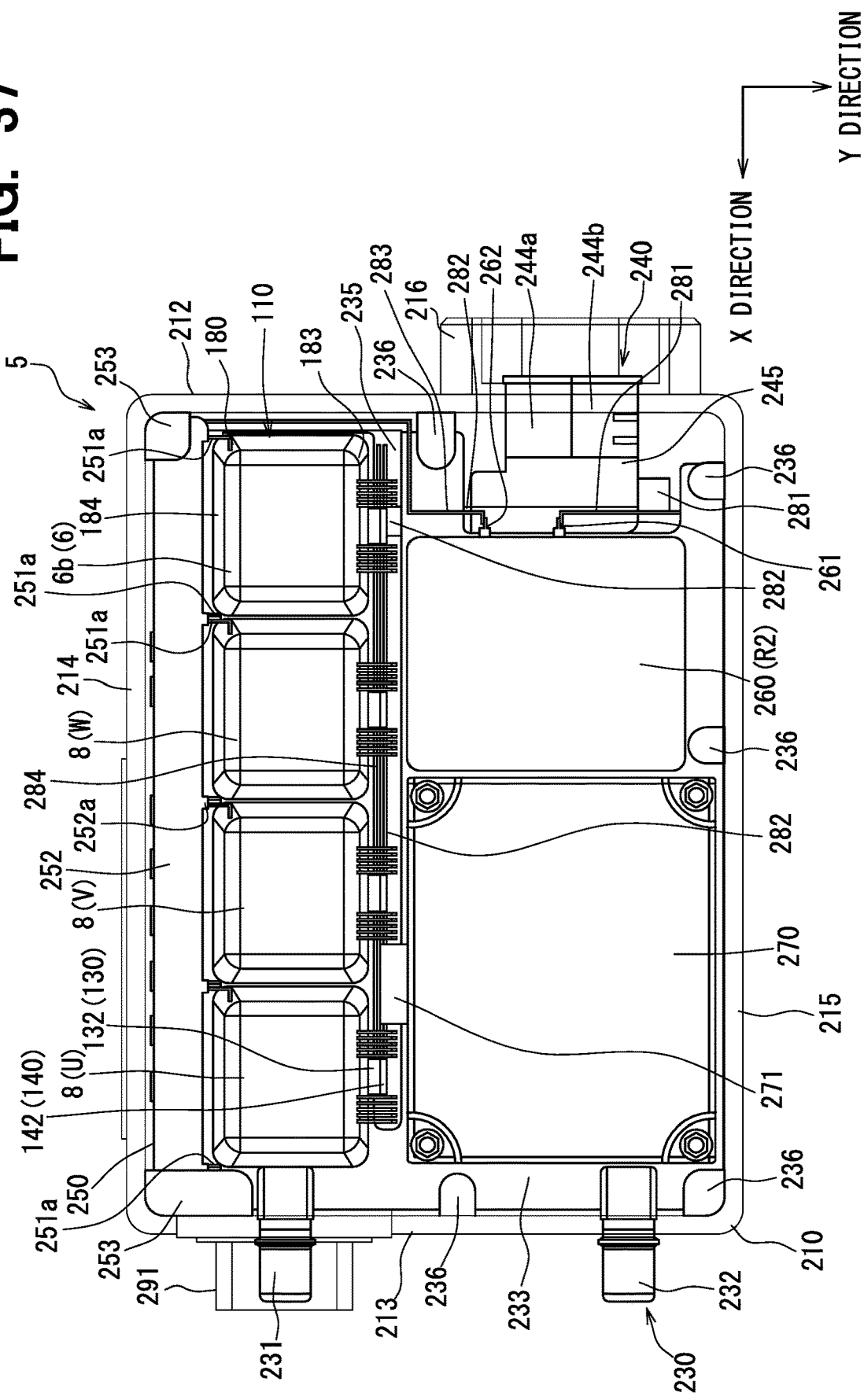
FIG. 37 is a plan view seen from a bottom wall of a case in FIG. 36.
Figure 38:
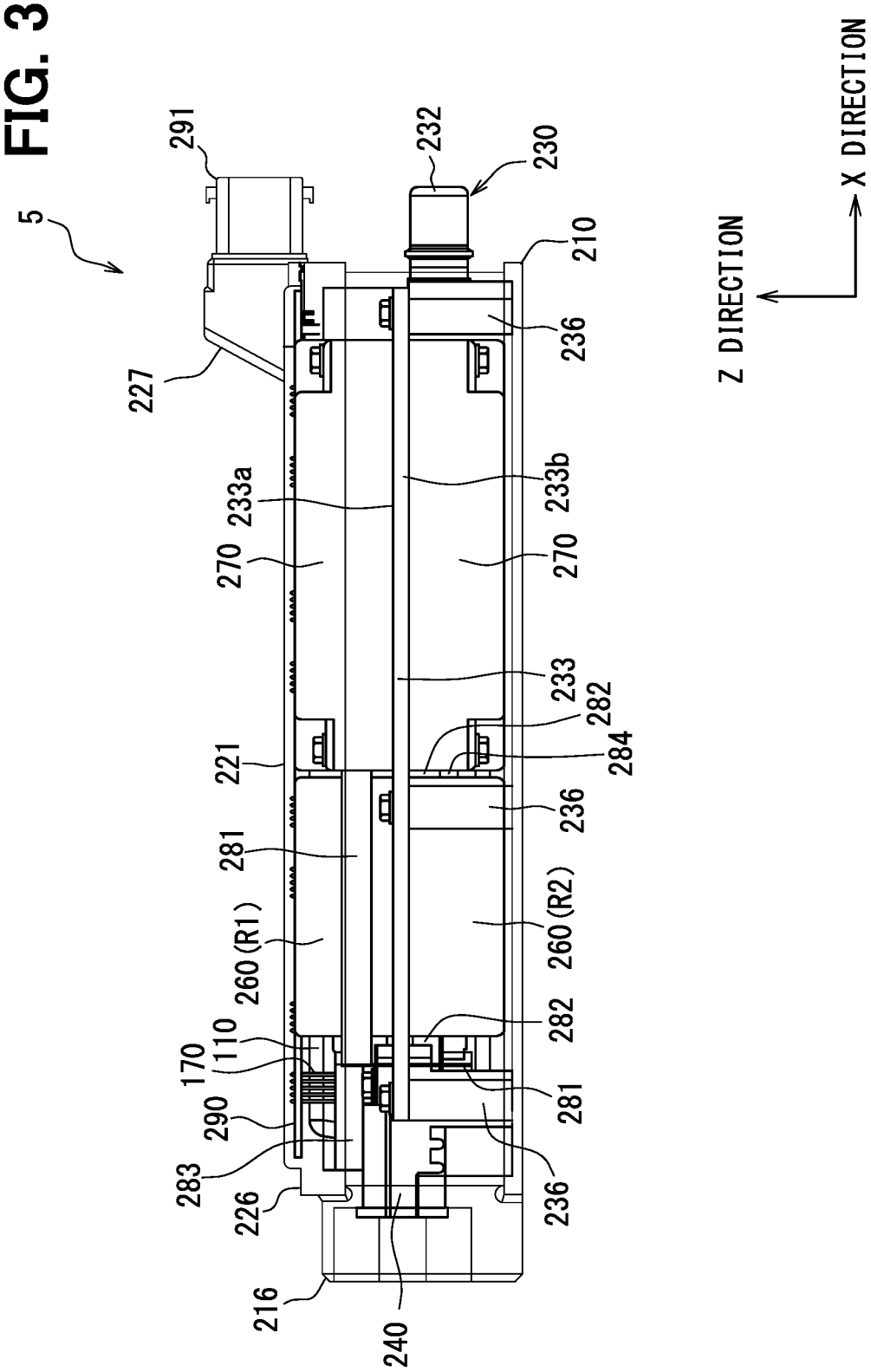
FIG. 38 is a plan view when
Figure 39:
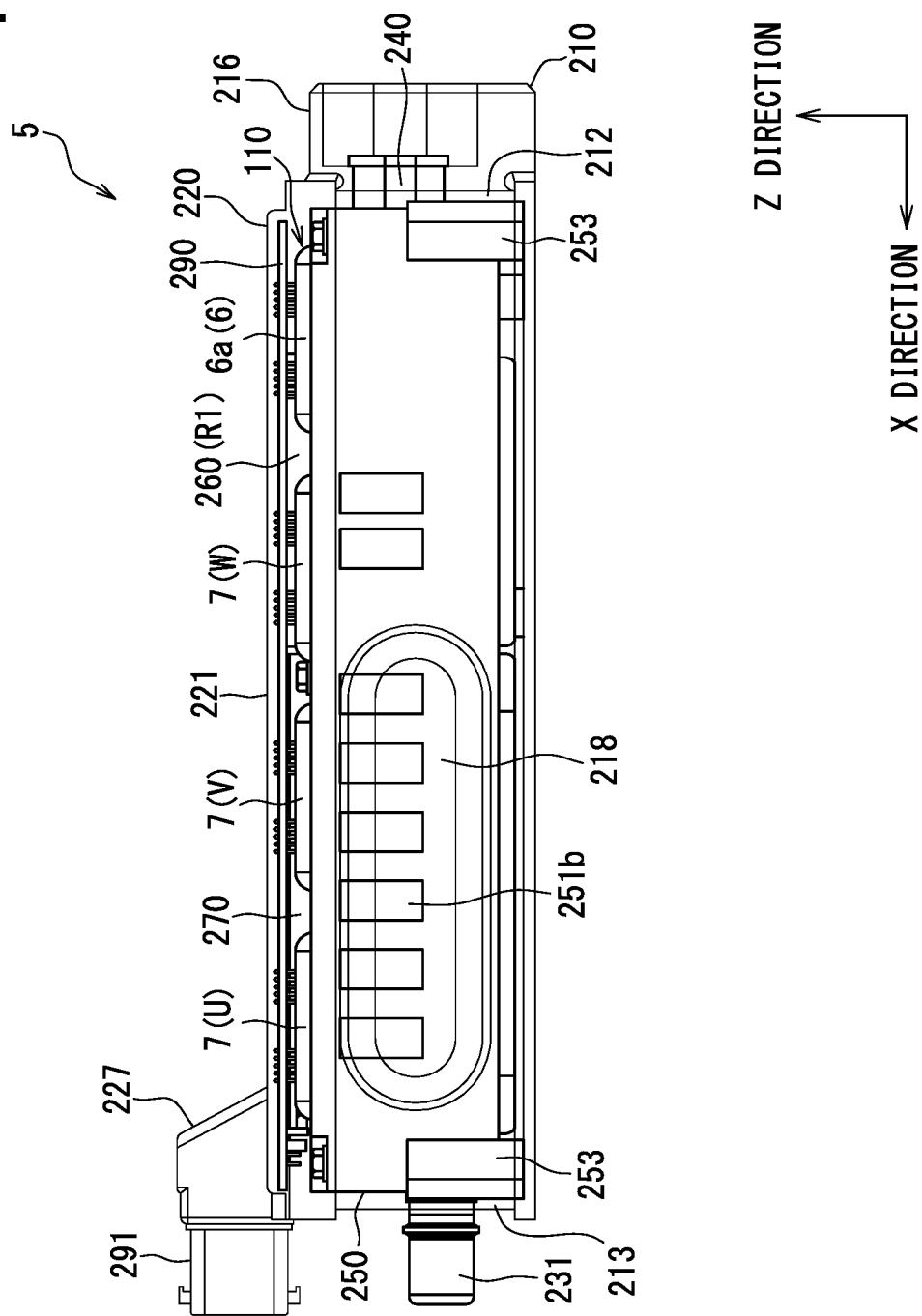
FIG. 39 is a plan view when
Figure 40:
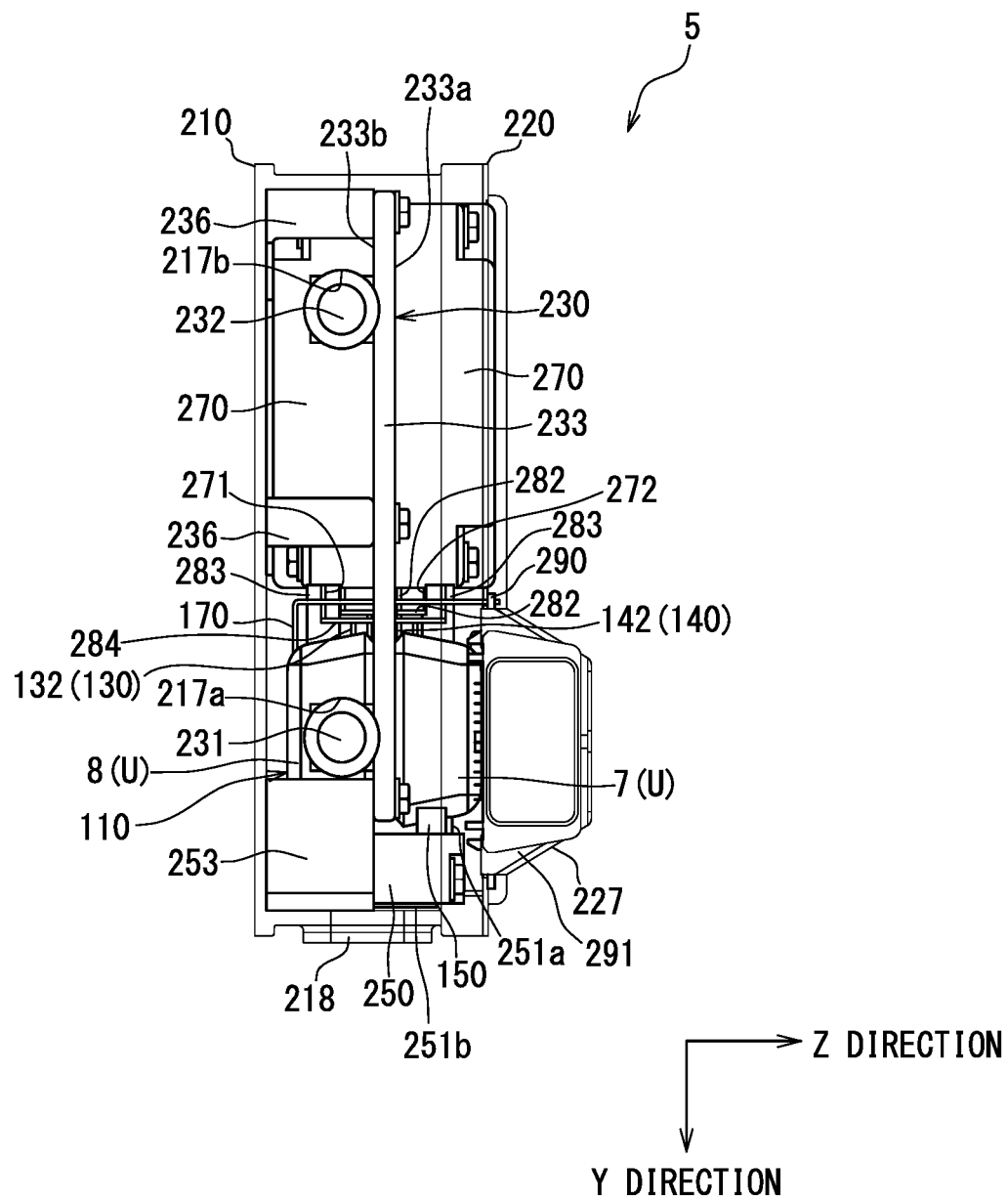
FIG. 40 is a plan view when

In the case 210, the heat exchange portion 233 is placed in most of the region other than the input terminal block 240 and the output terminal block 250. As shown in FIG. 30, FIG. 37, and the like, the heat exchange portion 233 has a notch portion 235. Thereby, the heat exchange portion 233 has a substantially U-shape. Two arms of the substantially U-shaped heat exchange portion 233 extend in the X direction. The cooler 230 is housed by the case 210 so that both ends of the U-shaped portion of the heat exchange portion 233 are close to the lateral wall 212 in the X direction. That is, the two arms of the heat exchange portion 233 are arranged in the Y direction. The supply pipe 231 and the discharge pipe 232 are connected to not ends of the U shaped portion but the arms opposite to the ends, and protrude outward from the lateral wall 213. The supply pipe 231 is connected to one arm of the heat exchange portion 233, and the one arm is different from an arm connected to the discharge pipe 232.

Of the two arms of the heat exchange portion 233, on the arm connected to the supply pipe 231, the power module 110 is placed. On the arm connected to the discharge pipe 232, the reactor 260 and the capacitor unit 270 are placed. In such a manner, in the present example, the cooler 230 (heat exchange portion 233) cools the power module 110, the reactor 260, and the capacitor unit 270. The heat exchange portion 233 (cooler 230) is supported by multiple support portions 236 at a predetermined height with respect to the bottom wall 211 of the case 210. In the supported state, the heat exchange portion 233 is fixed to the case 210 by screw fastening or the like.

As the refrigerant flowing through the flow path 234, the phase transition refrigerant such as the water ammonia or the non-phase transition refrigerant such as the ethylene glycol can be used. The refrigerant is cooled by, for example, a radiator, and is supplied to the cooler 230. The cooler 230 mainly cools the elements configuring the electric power conversion device 5, specifically, the power module 110, the reactor 260, and the capacitor unit 270. However, in addition to the cooling function, the cooler 120 may have a warming function when the environmental temperature is low. Then, the cooler 230 may be referred to as the temperature adjusting instrument. The refrigerant is referred to as a heat medium.

In the present example, the electric power conversion device 5 includes eight power modules 110. Each power module 110 has a configuration basically similar to the configuration described above (see FIGS. 21 to 26). However, in consideration of the connectivity to the different elements, a bent portion is placed at a part of the configuration, and the length of the configuration is different. Among the eight power modules 110, the two configure the converter 6, and the remaining six configure the inverters 7 and 8. The eight power modules 110 are arranged in the X direction in a set of four at predetermined intervals, and these sets are arranged in two stages in the Z direction. Hereinafter, the set placed close to the bottom wall 221 of the cover 220 is also referred as an upper set, and the set placed close to the bottom wall 211 of the case 210 is also referred to as a lower stage.

The upper stage includes the power module 110 configuring the first phase of the converter 6 and three power modules 110 configuring the three phases (U, V, W) of the inverter 7. Hereinafter, the first phase of the converter 6 is also referred to as a converter 6a, and the second phase is also referred as a converter 6b. The power module 110 of the upper stage is one arm of the substantially U-shaped heat exchange portion 233, and is placed on the first surface 233a. Specifically, four power modules 110 are arranged in the order of the U phase of the inverter 7, the V phase, the W phase, and the converter 6a from the lateral wall 213.

The lower stage includes the power module 110 configuring the converter 6b and three power modules 110 configuring the three phases (U, V, W) of the inverter 8. The power module 110 of the lower stage is the same arm as that of the upper stage at the substantially U-shaped heat exchange portion 233, and is placed on the second surface 233b. Specifically, four power modules 110 are arranged in the order of the U phase of the inverter 8, the V phase, the W phase, and the converter 6b from the lateral wall 213.

As shown in FIG. 37, each power module 110 is placed so that the lateral surface 183 of the protective member 180, that is, the protrusion surface of the common wiring portions 132 and 142 between the P bus bar 130 and the N bus bar 140 and the external connection terminal 170 is positioned close to the lateral wall 215 of the case 210, and the lateral surface 184 is positioned close to the lateral wall 214. The power module 110 of the upper stage and the power module 110 of the lower stage are placed so as to overlap each other in the projection view in the Z direction. That is, four pairs of the power modules 110 sandwich the heat exchange portion 233.

Figure 44:
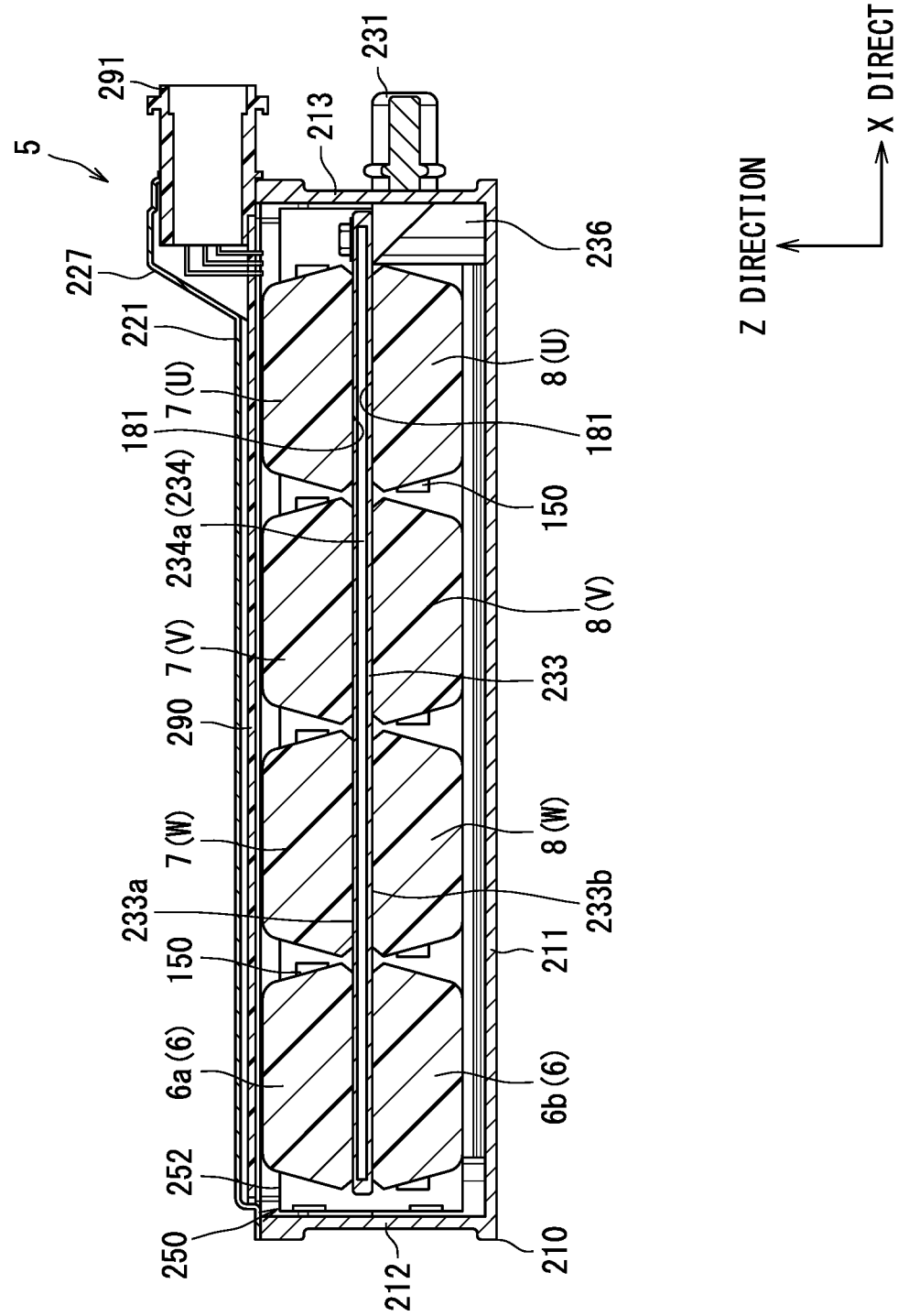
FIG. 44 is a cross-sectional view taken along a XLIV-XLIV line of FIG. 36.

As shown in FIG. 44, each power module 110 is placed so that the first surface 181 of the protective member 180 is close to the heat exchange portion 233. The power module 110 is fixed to the heat exchange portion 233 by fixing means such as adhesion and fastening. The four output bus bars 150 of the upper stage are arranged in the X direction at predetermined intervals. The four output bus bars 150 of the lower stage are also arranged in the X direction at the predetermined intervals same as that of the upper stage. The power modules 110 forming the pair of the upper stage and the lower stage are placed symmetrically with respect to the Y direction. Therefore, in the X direction, a position of the output bus bar 150 of the upper stage and a position of the output bus bar 150 of the lower stage are deviated from each other. In the power module 110 forming the pair of the upper stage and the lower stage, a protrusion position of the output bus bar 150 is close to one end of the protective member 180 in the X direction at the upper stage, and the protrusion position is close to an end opposite to that of the upper stage at the lower stage. Therefore, in the adjacent pair, the output bus bar 150 of the upper stage and the output bus bar 150 of the lower stage are placed close to each other in the X direction.

On the other hand, the common wiring portions 132 and 142 of the P bus bar 130 and the N bus bar 140 are placed on a center line that passes through the center in the X direction and is parallel to the Y direction. The common wiring portions 132 and 142 are symmetrically placed with respect to this center line. The power modules 110 are symmetrically placed with respect to the center line in a portion other than the protrusion portion of the output bus bar 150. In the power modules 110 forming the pair of the upper stage and the lower stage, the common wiring portions 132 and 142 at the upper stage and the common wiring portions 132 and 142 at the lower stage overlap each other in the projection view in the Z direction. Details of the cooling structure including the flow path of the power module 110 will be described later.

The input terminal block 240 has a positive electrode terminal 241 and a negative electrode terminal 242 for electrically connecting the direct current power source 2 and the electric power conversion device 5, and a housing 243 that holds the terminals 241 and 242. The positive electrode terminal 241 and the negative electrode terminal 242 function as, for example, terminals for inputting the direct voltage supplied from the direct current power source 2 to the electric power conversion device 5. Each of the positive electrode terminal 241 and the negative electrode terminal 242 may be formed of one conductive member (for example, bus bar), and may be formed of multiple electrically connected conductive members. The input terminal block 240 is placed close to one of four corners of the case 210 having the substantially rectangular plane shape. Specifically, the input terminal block 240 is placed close to the corner defined by the lateral walls 212 and 215. The input terminal block 240 is placed on the bottom wall 211. The input terminal block 240 is placed from the bottom wall 211 to a position closer to the cover 220 than the first surface 233a of the heat exchange portion 233 in the Z direction.

The positive electrode terminal 241 is electrically connected to the positive electrode of the direct current power source 2, and the negative electrode terminal 242 is electrically connected to the negative electrode of the direct current power source 2. The housing 243 is formed of an electric insulation material, for example, a resin material. In the present example, the housing 243 formed of the resin material is integrally molded with the positive electrode terminal 241 and the negative electrode terminal 242. The positions of the positive electrode terminal 241 and the negative electrode terminal 242 are same in the Z direction in at least a part of a region from a position close to the connection with the direct current power source 2. The positive electrode terminal 241 and the negative electrode terminal 242 are arranged with the predetermined intervals in the Y direction.

The housing 243 has power source connection portions 244a and 244b and a bus bar fixing portion 245. The power source connection portions 244a and 244b are portions within a predetermined range from the connection end with the direct current power source 2. The power source connection portion 244a covers the positive electrode terminal 241 so that the positive electrode terminal 241 is exposed from one end of the power source connection portion 244a. Thereby, the positive electrode terminal 241 and the positive electrode of the direct current power source 2 can be electrically connected. The power source connection portion 244b covers the negative electrode terminal 242 so that the negative electrode terminal 242 protrudes from one end of the power source connection portion 244b. Thereby, the negative electrode terminal 242 and the negative electrode of the direct current power source 2 can be electrically connected.

Each of the power source connection portions 244a and 244b has a substantially columnar shape, and is connected so as to form one portion in the Y direction. Thereby, an outer surface of the housing 243 has a substantially 8-shape in accordance with the penetration hole 216a. In a state where tip portions of the power source connection portions 244a and 244b are placed at the penetration hole 216a, a seal member (not shown) is placed between the outer surfaces of the power source connection portions 244a and 244b and the wall surface of the penetration hole 216a in the case 210, and a waterproof seal portion is formed.

The bus bar fixing portion 245 is connected to the power source connection portions 244a and 244b in the X direction, and the entire is housed in the case 210. The bus bar fixing portion 245 is a portion fixing a part of the bus bar 280, and has a flat mounting surface so that the bus bar 280 is easily fixed. In the present example, the bus bar fixing portion 245 includes a mounting surface 245a fixing a VL bus bar 281 described later and a mounting surface 245b fixing a N bus bar 282. The bus bar fixing portion 245 has a substantially rectangular parallelepiped shape. The mounting surfaces 245a and 245b are placed on the same side in the Z direction. The mounting surfaces 245a and 245b are arranged in the Y direction, and are placed so that positions in the Z direction deviate. That is, the bus bar fixing portion 245 has a stepped shape on the fixing surface side of the bus bar 280. The mounting surface 245b is placed farther apart from the bottom wall 221 of the cover 220 than the mounting surface 245a. Both of the mounting surfaces 245a and 245b are positioned closer to the cover 220 than the first surface 233a of the heat exchange portion 233.

The output terminal block 250 has multiple terminals 251 connected to the power module 110, a housing 252 that holds these, and a support portion 253 for fixing the output terminal block 250 in the case 210. The terminal 251 may be formed of one conductive member (for example, bus bar), and may be formed of multiple electrically connected conductive members. The output terminal block 250 is placed next to the lateral wall 214. The output terminal block 250 faces almost the entire of the lateral wall 214. The output terminal block 250 is placed in a region defined by the lateral walls 212, 213, and 214. The output terminal block 250 is placed so as to face, in the Y direction, the power module 110 of the upper stage, the heat exchange portion 233, and the power module 110 of the lower stage. That is, at least a part of the power modules 110 of the upper stage and the lower stage overlaps with the output terminal block 250 in the projection view in the Y direction. The power module 110 is placed next to the output terminal block 250. Thereby, it may be possible to shorten the wiring length between the terminal 251 and the output bus bar 150.

In the present example, the output terminal block 250 has eight terminals 251 in accordance with the number of power modules 110. Two terminals 251 of the eight terminals 251 correspond to the two power modules 110 configuring the converter 6, and the remaining six terminals correspond to the six power modules 110 configuring the inverters 7 and 8. The terminals 251 corresponding to the converter 6 functions as, for example, a terminal for connecting the reactor 260 and the power module 110. The terminal 251 can also function as a terminal for monitoring an IL current described later. The terminals 251 corresponding to the inverters 7 and 8 function as terminals for outputting a predetermined AC voltage to the motor generators 3 and 4 that are loads. Therefore, together with the output bus bar 150, the terminals 251 correspond to the output wiring 15 shown in FIG. 1.

The housing 252 is formed of the electric insulation material, for example, the resin material. In the present example, the housing 252 formed of the resin material is integrally molded with the terminal 251. The housing 252 has the substantially rectangular parallelepiped shape of which longitudinal direction is the X direction. The housing 252 (output terminal block 250) is fixed to the case 210 via the support portions 253 arranged at both ends in the Y direction. In the housing 252, a current sensor (not shown) is enclosed. The current sensor placed at the terminals 251 corresponding to the converter 6 detects the current (IL current) flowing to the boost wiring 14. The current sensor placed at the terminals 251 corresponding to the inverters 7 and 8 detects a phase current. A detection signal of the current sensor is output to the control substrate 290 via the conductive member such as the bus bar. When the current sensor is placed at the power module 110 (output bus bar 150), the current sensor may not be placed at the housing 252.

The terminal 251 includes a first connection portion 251a and a second connection portion 251b. In the Y direction, the first connection portion 251a protrudes from a first surface of the housing 252, and the second connection portion 251b protrudes from a second surface opposite to the first surface. The first connection portion 251a and the second connection portion 251b are electrically connected inside the housing 252.

The first connection portion 251a protrudes from the first surface of the housing 252, and extends in the Y direction. The first connection portion 251a is connected to the output bus bar 150 (narrow width portion 152) of the power module 110. The housing 252 has a protrusion portion 252a at the first surface close to the power module 110. The housing 252 has five protrusion portions 252a. The protrusion portion 252a protrudes in the Y direction with a predetermined height in the Z direction. The first connection portion 251a protrudes from the protrusion portion 252a.

The first connection portions 251a connected to the output bus bar 150 of the upper stage are placed at the four protrusion portions 252a from the side of the lateral wall 213. The first connection portions 251a connected to the output bus bar 150 of the lower stage are placed at the four protrusion portions 252a from the side of the lateral wall 214. The protrusion portion 252a closest to the lateral wall 213 is placed at the output bus bar 150 of the upper stage, specifically, only the first connection portion 251a corresponding to the output bus bar 150 of the U phase of the inverter 7. The protrusion portion 252a closest to the lateral wall 212 is placed at the output bus bar 150 of the lower stage, specifically, only the first connection portion 251a corresponding to the output bus bar 150 of the U phase of the converter 6b.

The second connection portion 251b is exposed from a surface opposite to the first connection portion 251a in the housing 252, that is, a facing surface with the lateral wall 214. Among the eight second connection portions 251b, in the Y direction, six second connection portions 251b close to the lateral wall 213 are electrically connected to the output bus bar 150 of each phase configuring the inverters 7 and 8. These second connection portions 251b face the opening portion 218 placed in the lateral wall 214. Thereby, the three-phase windings of the motor generators 3 and 4 can be electrically connected via the opening portion 218. The remaining two second connection portions 251b, that is, the two second connection portions 251b close to the lateral wall 212 can be used as, for example, the output portion of the current sensor that detects the IL current. A seal member (not shown) is placed at the periphery of the opening portion 218 in the case 210 and the facing portion with the output terminal block 250, and a waterproof portion is formed.

The reactor 260 configures reactors R1 and R2 of the converter 6. The reactor 260 is placed at an arm different from an arm for the power module 110 among the two arms of the heat exchange portion 233. In the present example, two reactors 260 are provided, and one reactor 260 configures the reactor R1 and the remaining one configures the reactor R2. The reactor 260 close to the R1 is placed on the first surface 233a of the heat exchange portion 233, and the reactor 260 close to the R2 is placed on the second surface 233b. The reactor 260 is fixed to the heat exchange portion 233 by screw fastening or the like. The reactor 260 close to the R1 and the reactor 260 close to the R2 are placed so as to substantially coincide with each other in the projection view in the Z direction. The reactors 260 are arranged with the capacitor unit 270 in the X direction. The reactors 260 are arranged close to the lateral wall 212. In the Y direction, the power module 110 is placed between the reactor 260 and the capacitor unit 270 and the output terminal block 250.

The reactor 260 has, as external connection terminals, a first terminal 261 and a second terminal 262. The first terminal 261 is a terminal electrically connected to the positive electrode of the direct current power source 2 and the positive electrode of the filter capacitor C3. The second terminal 262 is a terminal electrically connected to the output bus bar 150 of the power module 110 configuring the converter 6. The main portion of the reactor 260 has the substantially rectangular plane shape of which longitudinal direction is the Y direction. The first terminal 261 and the second terminal 262 project from longitudinal side facing the lateral wall 212 in a state where the thickness direction is the Y direction.

The capacitor unit 270 configures the smoothing capacitor C2 and the filter capacitor C3. The capacitor unit 270 is formed by, for example, placing a film capacitor in a case. The capacitor unit 270 is placed at the same arm as that for the reactor 260 among the two arms of the heat exchange portion 233. The capacitor unit 270 is fixed to the heat exchange portion 233 by the screw fastening or the like.

In the present example, the capacitor unit 270 is placed at each of the first surface 233a and the second surface 233b of the heat exchange portion 233. Hereinafter, a position close to the first surface 233a is also referred to as the upper stage, and a position close to the second surface 233b is also referred to as the lower stage. At the capacitor unit 270 at the upper stage, a part of the smoothing capacitor C2 and the filter capacitor C3 are configured. At the capacitor unit 270 at the lower stage, the smoothing capacitor C2 is configured. The capacitor unit 270 at the upper stage and the capacitor unit 270 at the lower stage are placed so as to substantially coincide with each other in the projection view in the Z direction. The capacitor unit 270 is placed closer to the lateral wall 213 as compared with the reactor 260.

The capacitor unit 270 has, as external connection terminals, a positive electrode terminal 271 and a negative electrode terminal 272. The positive electrode terminal 271 is a terminal electrically connected to the VH line 12H. The negative electrode terminal 272 is a terminal electrically connected to the N line 13. The capacitor unit 270 has the substantially rectangular plane shape of which longitudinal direction is the X direction. The positive electrode terminal 271 and the negative electrode terminal 272 protrude from a center portion of the longitudinal side facing the lateral wall 214 in a state where the thickness direction is the Z direction. The positive electrode terminal 271 and the negative electrode terminal 272 and the common wiring portions 132 and 142 of the power module 110 protrude from the surfaces facing each other in the Y direction. The positive electrode terminal 271 and the negative electrode terminal 272, and the common wiring portions 132 and 142 of the power module 110 extend so as to approach each other in the Y direction. The positive electrode terminal 271 and the negative electrode terminal 272 face each other in the Z direction. Thereby, it may be possible to reduce the inductance of the main circuit wiring.

Figure 42:
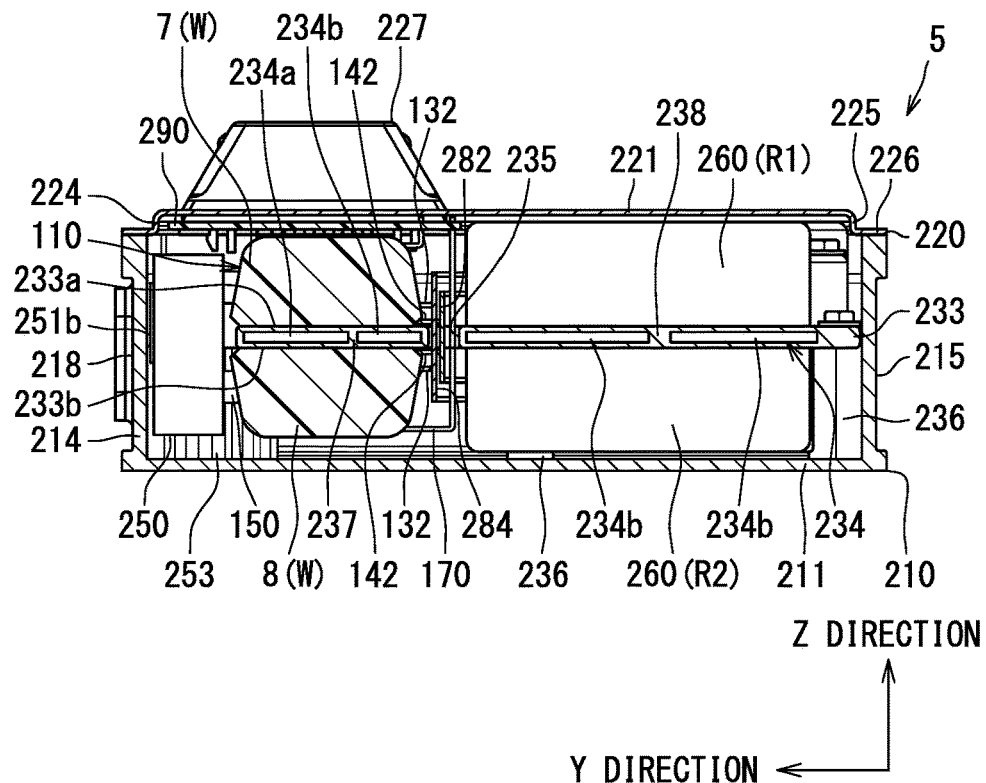
FIG. 42 is a cross-sectional view taken along a XLII-XLII line of FIG. 36.
Figure 43:
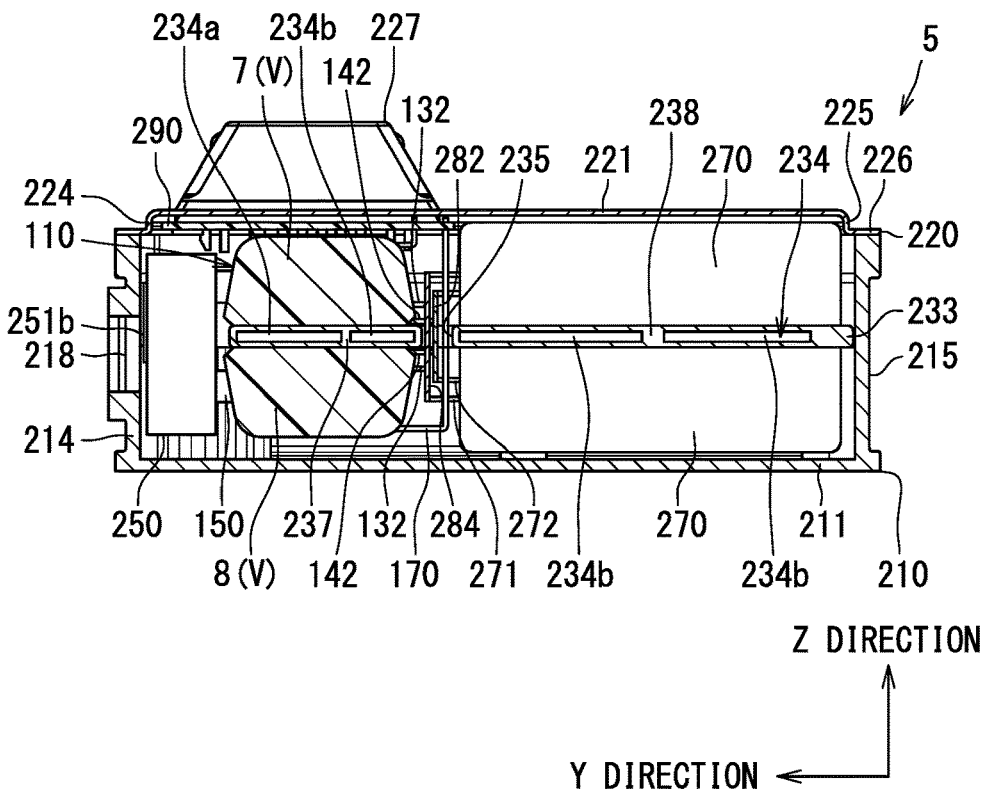
FIG. 43 is a cross-sectional view taken along a XLIII-XLIII line of FIG. 36.

As shown in FIGS. 42 and 43, the positive electrode terminal 271 and the negative electrode terminal 272 are placed at positions separated from the heat exchange portion 233 than the common wiring portions 132 and 142 of the power module 110 in the Z direction. Specifically, at the upper stage, the common wiring portion 142 of the N bus bar 140, the common wiring portion 132 of the P bus bar 130, the negative electrode terminal 272, the positive electrode terminal 271 are placed in this order from a position close to the first surface 233a of the heat exchange portion 233. Similarly, also at the lower stage, the common wiring portion 142 of the N bus bar 140, the common wiring portion 132 of the P bus bar 130, the negative electrode terminal 272, the positive electrode terminal 271 are placed in this order from a position close to the second surface 233b of the heat exchange portion 233.

The capacitor unit 270 has an external connection terminal (not shown) other than the positive electrode terminal 271 and the negative electrode terminal 272. This external connection terminal is a terminal electrically connected to the VL line 12L.

The bus bar 280 electrically connects the other elements configuring the electric power conversion device 5. The bus bar 280 is formed by processing, for example, pressing a metal plate material having an excellent conductivity such as copper. The bus bar 280 has the VL bus bar 281, the N bus bar 282, an IL bus bar 283, and a VH bus bar 284. Each bus bar 280 is accommodated in the case 210.

The VL bus bar 281 configures the VL line 12L. The VL bus bar 281 connects the positive electrode terminal 241 of the input terminal block 240 and the reactor 260, and connects the positive electrode terminal 241 and the capacitor unit 270. The VL bus bar 281 is placed at the mounting surface 245a of the input terminal block 240 so that the thickness direction is substantially parallel to the Z direction as shown in FIG. 36. The VL bus bar 281 is electrically connected to the positive electrode terminal 241 by the screwing fastening in this placement state. The VL bus bar 281 is branched.

One branch of the VL bus bar 281 is bent with respect to the fixing portion with the input terminal block 240 so that the thickness direction is the X direction, and is connected to the first terminal 261 of the reactor 260 close to the R1. Another branch of the VL bus bar 281 has a Y direction extension portion that extends toward the side of the lateral wall 215 along the long side of the reactor 260 close to the R1 from the fixing portion of the input terminal block 240, and an X direction extension portion that extends in the X direction between a short side of the reactor 260 close to the R1 and the lateral wall 215 and is connected to the capacitor unit 270. The Y direction extension portion has a bent portion in front of a boundary with the X direction extension portion. The plate thickness direction is changed by this bent portion. The plate thickness direction of the X direction extension portion is substantially parallel to the Y direction. Another branched VL bus bar 281 extends from the bent portion of the Y direction extension portion towards the bottom wall 211 in the Z direction, and is connected to the first terminal 261 of the reactor 260 close to the R2.

Figure 41:
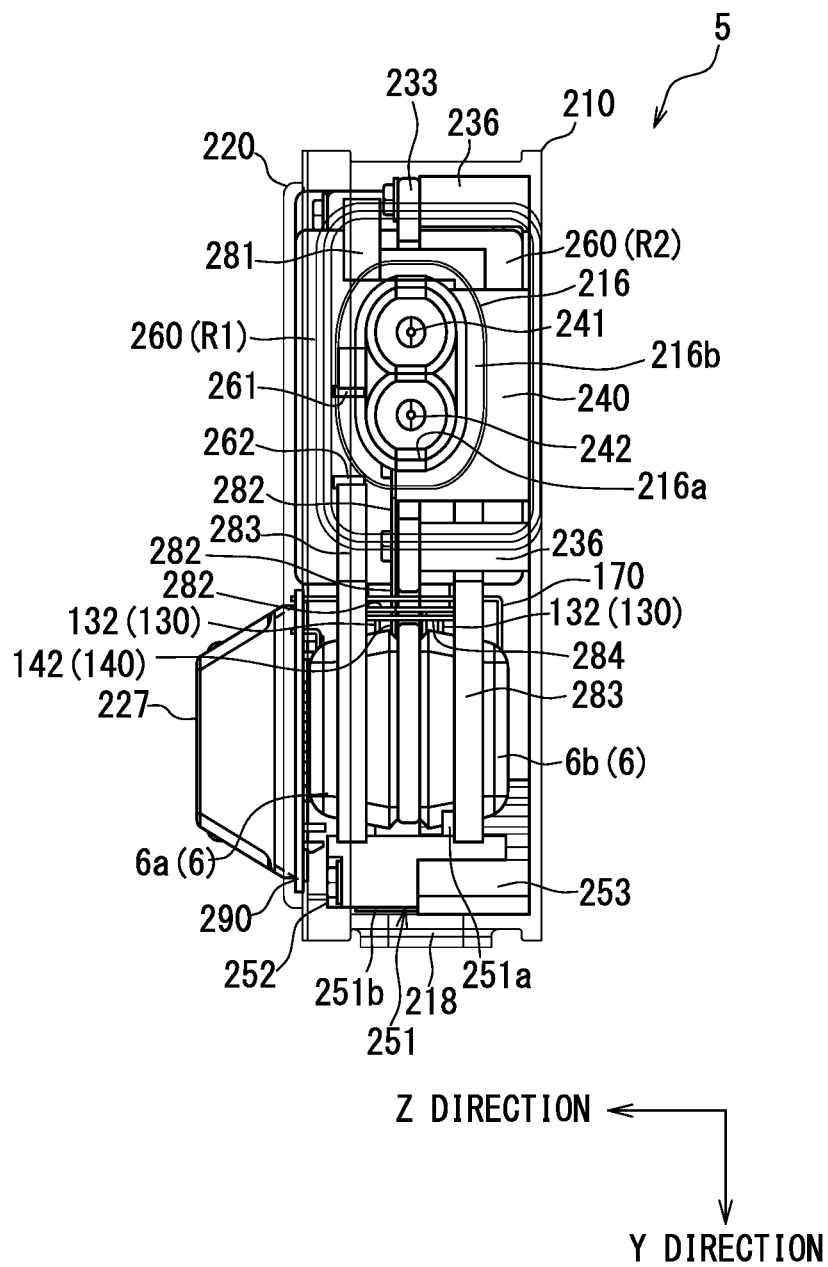
FIG. 41 is a plan view when

The N bus bar 282 configures the N line 13. The N bus bar 282 is placed at the mounting surface 245b of the input terminal block 240 so that the thickness direction is substantially parallel to the Z direction as shown in FIG. 35 and FIG. 36. The N bus bar 282 is electrically connected to the negative electrode terminal 242 by the screwing fastening in this placement state. The N bus bar 282 extends from the fixing portion to the input terminal block 240 towards the lateral wall 214 in the Y direction with the same plate thickness direction, as shown in FIG. 37 and FIG. 41. In a region overlapping with the notch portion 235 of the heat exchange portion 233 in the projection view in the Z direction, the N bus bar 282 is bent so that the plate thickness direction is substantially parallel to the Y direction.

In the N bus bar 282, a bent portion whose thickness direction is substantially parallel to the Y direction extends to a position closer to the lateral wall 212 than the common wiring portion 142 (N bus bar 140) of the power module 110 configuring the converters 6a and 6b in the X direction, as shown in FIG. 37. A bent portion of the N bus bar 282 extends to a position closer to the lateral wall 213 than the common wiring portion 142 (N bus bar 140) of the power module 110 configuring the U phase of the inverters 7 and 8. The bent portion of the N bus bar 282 is placed, in the Z direction, from the negative electrode terminal 272 of the upper stage to the negative electrode terminal 272 of the lower stage, as shown in FIG. 42 and FIG. 43. In such a manner, the N bus bar 282 extends in the X direction while having the predetermined width in the Z direction.

The bent portion of the N bus bar 282 is connected to each negative electrode terminal 272 of the capacitor unit 270 and each common wiring portion 142 of the power module 110. In such a manner, in a region overlapping the notch portion 235 in the projection view in the Z direction, the N bus bar 282 is connected to the capacitor unit 270 and the power module 110. That is, the N line 13 is connected to the smoothing capacitor C2, the filter capacitor C3, and the common wiring 11N of each upper-lower arm circuit 10.

The IL bus bar 283 configures the boost wiring 14. The IL bus bar 283 connects the second terminal 262 of the reactor 260 and the output bus bar 150 of the power module 110 configuring the converter 6. In the present example, as shown in FIG. 30, two IL bus bars 283 are provided. One of the IL bus bar 283 connects, at a position close to the first surface 233a, the second terminal 262 of the reactor 260 close to the R1 and the output bus bar 150 of the power module 110 configuring the converter 6a. Another one of the IL bus bar 283 connects, at a position close to the second surface 233b, the second terminal 262 of the reactor 260 and the output bus bar 150 of the power module 110 configuring the converter 6b.

The IL bus bar 283 has, at least, a first extension portion that extends from the connection portion with the second terminal 262 toward the power module 110, a second extension portion that is bent with respect to the first extension portion and extends towards the lateral wall 212 in the Y direction, and a third extension portion that extends from the second extension portion toward the lateral wall 214 along the lateral wall 212. The IL bus bar 283 may be directly connected to the output bus bar 150, and may be connected to the output bus bar 150 via the terminal 251.

The VH bus bar 284 configures the VH line 12H. As shown in FIG. 37 or the like, the VH bus bar 284 is placed in a region overlapping the notch portion 235 in the projection view from the Z direction. The VH bus bar 284 is placed in a region overlapping the notch portion 235 so that the plate thickness direction is substantially parallel to the Y direction. As shown in FIG. 37, the VH bus bar 284 extends to a position closer to the lateral wall 212 than the common wiring portion 132 (P bus bar 130) of the power module 110 configuring the converters 6a and 6b in the X direction. The VH bus bar 284 extends to a position closer to the lateral wall 213 than the common wiring portion 132 (P bus bar 130) of the power module 110 configuring the U phase of the inverters 7 and 8. The VH bus bar 284 is placed, in the Z direction, from the positive electrode terminal 271 of the upper stage to the positive electrode terminal 271 of the lower stage, as shown in FIG. 42 and FIG. 43. In such a manner, the VH bus bar 284 extends in the X direction while having the predetermined width in the Z direction.

The VH bus bar 284 is connected to each positive electrode terminal 271 of the capacitor unit 270 and each common wiring portion 132 of the power module 110. In such a manner, in a region overlapping the notch portion 235 in the projection view in the Z direction, the VH bus bar 284 is connected to the capacitor unit 270 and the power module 110. That is, the VH line 12H is connected to the smoothing capacitor C2 and the common wiring 11P of each upper-lower arm circuit 10.

In the present example, the VH bus bar 284 includes the bent portion of the N bus bar 282 in the projection view from the Y direction. That is, the entire bent portion of the N bus bar 282 faces the VH bus bar 284 in the Y direction. Thereby, it may be possible to reduce the inductance of the main circuit wiring. In the Y direction, the bent portion of the N bus bar 282 is placed at a position close to the reactor 260 and the capacitor unit 270. The VH bus bar 284 is placed at a position close to the power module 110. Therefore, in the power module 110, a protrusion length of the common wiring portion 142 from the lateral surface 183 is longer than that of the common wiring portion 132. In the capacitor unit 270, the positive electrode terminal 271 is longer than the negative electrode terminal 272.

The control substrate 290 forms the control circuit portion 9. The control substrate 290 is formed by mounting an electronic component on a printed board. The control substrate 290 includes a microcomputer as the electronic component. On the control substrate 290, the connector 291 is mounted. The control circuit portion 9 is electrically connected to a higher level ECU or the like via the connector 291. Such a connector 291 is also referred to as a low voltage connector.

The control substrate 290 (printed board) has a substantially rectangular plane shape of which longitudinal direction is the X direction. In the X direction, a length of the control substrate 290 is substantially equal to or slightly smaller than a length from an inner surface of the lateral wall 212 to an inner surface of the lateral wall 213. The control substrate 290 is placed relatively close to the lateral wall 214 in the Y direction. The control substrate 290 is placed so as to overlap, in the Y direction, the output terminal block 250, the power module 110, and the notch portion 235 of the heat exchange portion 233 and not to overlap the reactor 260 and the capacitor unit 270. The control substrate 290 is accommodated in the cover 220 as shown in FIG. 44 and the like.

The connector 291 is mounted near an end in the X direction, specifically, an end close to the lateral wall 213. The connector 291 is inserted, and mounted at the control substrate 290. The connector 291 protrudes from an opening portion formed between the recess 227 and the case 210 in a state where the case 210 and the cover 220 are assembled. A seal member (not shown) is placed at a facing portion between the housing of the connector 291, and the case 210 and the cover 220, and a waterproof seal portion is formed.

The control substrate 290 is connected to the external connection terminal 170 of the power module 110. The external connection terminal 170 is inserted, and mounted at the control substrate 290. As shown in FIG. 37, the external connection terminal 170 is mounted at the control substrate 290 in a region overlapping the notch portion 235 in the projection view from the Z direction. That is, the external connection terminal 170 is mounted near one end in the Y direction, specifically, an end close to the lateral wall 215. As shown in FIG. 34, FIG. 37, and the like, the external connection terminal 170 of the power module 110 protrudes from the lateral surface 183 in the Y direction, is bent at an angle of approximately 90 degrees, and extends towards the bottom wall 221 of the cover 220. That is, the protrusion portion from the lateral surface 183 is substantially L-shaped. Since the control substrate 290 is placed close to the cover 220, the extension length of the external connection terminal 170 of the power module 110 of the lower stage is longer than that of the power module 110 of the upper stage. The external connection terminal 170 of the lower stage is inserted through the notch portion 235. The position of the bent portion of the lower stage is closer to the reactor 260 or the capacitor unit 270 than that of the upper stage so that the external connection terminals 170 of the upper stage and the lower stage do not interfere with each other. Thereby, in the control substrate 290, the mounting positions of the external connection terminals 170 are provided at two stages in the Y direction. A position close to the substrate end is the mounting position of the lower stage.

Figure 45:
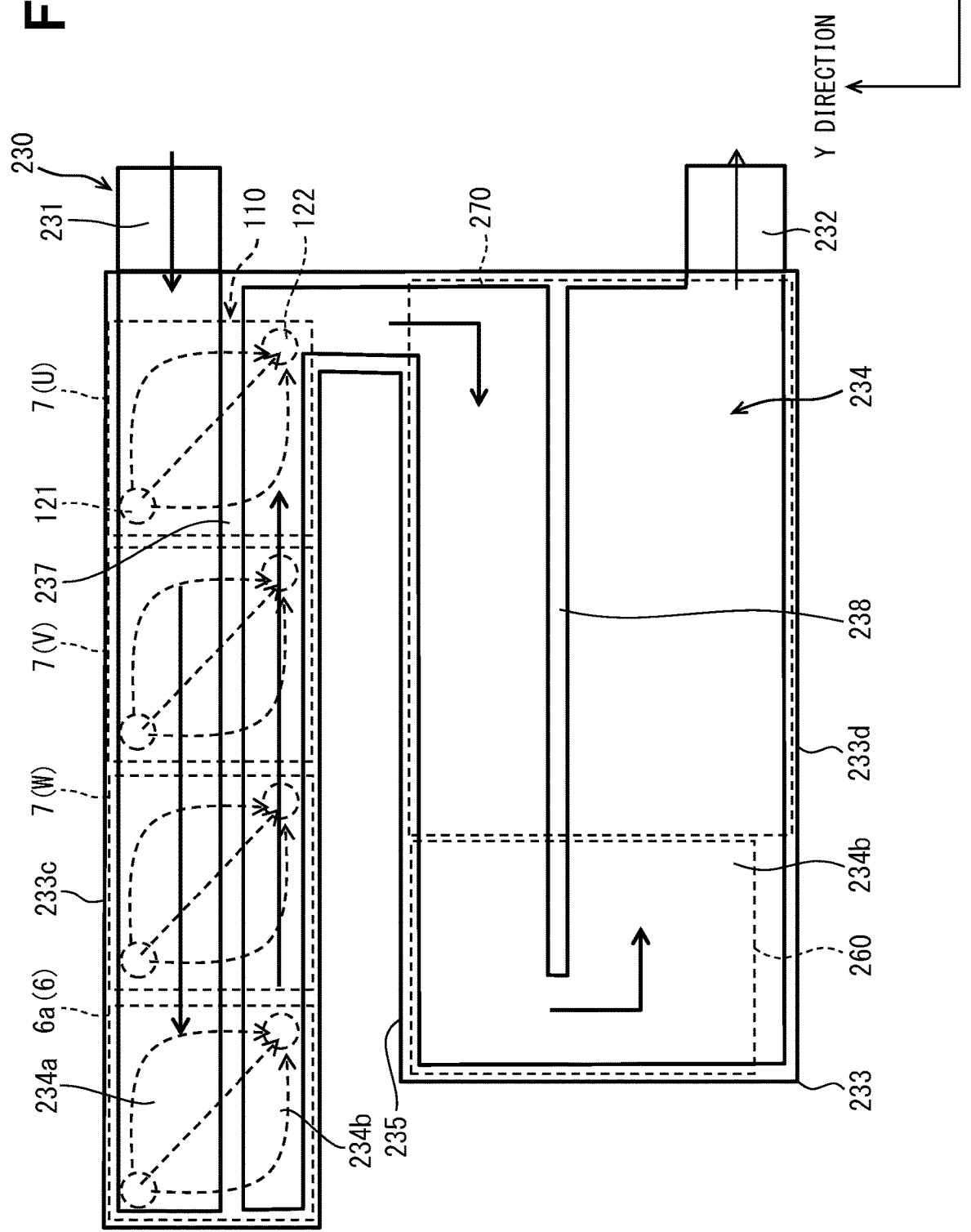
FIG. 45 is a plan view showing a cooling structure.
Figure 46:
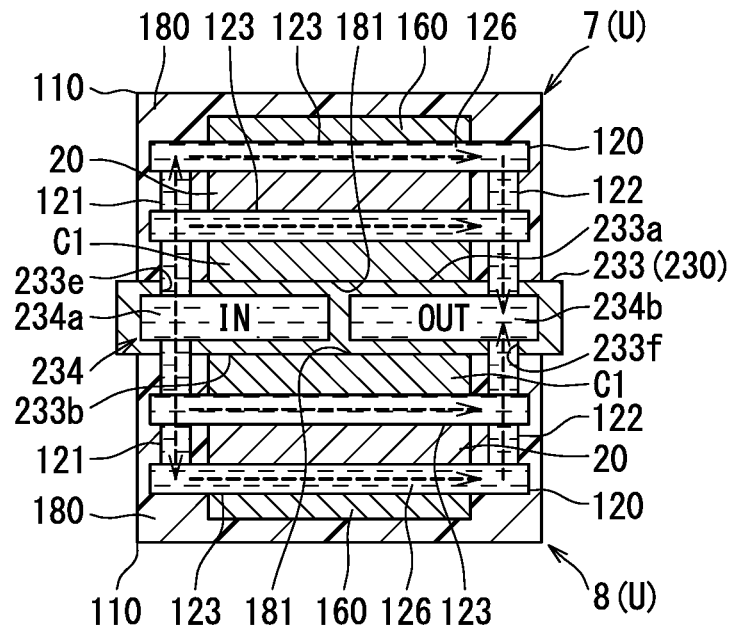
FIG. 46 is a schematic cross-sectional view showing the cooling structure.

Next, the cooling structure will be described with reference to FIG. 45 and FIG. 46. FIG. 45 is a schematic view showing the arrangement of the cooler, the power module, the reactor, and the capacitor unit. FIG. 46 is a schematic cross-sectional view showing the flow path. In FIG. 46, for convenience, one semiconductor device 20 of the power module 110 is shown.

As shown in FIG. 45, the heat exchange portion 233 of the cooler 230 has substantially U-shaped plane. The power module 110 is placed at an arm 233c of one of the U-shaped portions of the heat exchange portion 233. The reactor 260 and the capacitor unit 270 are placed at another arm 233d. In the X direction, a length of the arm 233c is longer than that of the arm 233d. In the Y direction, a length of the arm 233d is longer than that of the arm 233c. A longitudinal direction of each of the arms 233c and 233d is the X direction. The heat exchange portion 233 of the cooler 230 has the flow path 234 inside. The heat exchange portion 233 has partition portions 237 and 238 inside, in addition to the notch portion 235.

The partition portion 237 is placed at the arm 233c. The partition portion 237 extends in the X direction, and divides the flow path 234 in the arm 233c into two regions in the Y direction. The partition portion 237 divides the flow path 234 into an upstream region 234a connected to the flow path of the supply pipe 231 and a downstream region 234b connected to the flow path of the discharge pipe 232. The supply pipe 231 is connected to the heat exchange portion 233 at a position opposite to both ends of the U-shaped portion with respect to the heat exchange portion 233. In the arm 233c, the upstream region 234a and the downstream region 234b extend in the X direction. One end of the upstream region 234a is connected to the flow path of the supply pipe 231, and the other end is dead-end at a position close to the tip of the arm 233c. The downstream region 234b is dead-end at a position close to the tip of the arm 233c, and the other end is connected to a position close to the arm 233d. In the arm 233c, a length in the Y direction, that is, a width of the upstream region 234a is longer than that of the downstream region 234b.

The partition portion 238 is placed at the arm 233d. The partition portion 238 extends from a lateral surface opposite to the both ends of the U-shaped portion in the X direction. By providing the partition portion 238, the flow path 234 (downstream region 234b) in the arm 233d has a folded structure. The discharge pipe 232 is connected to the heat exchange portion 233 at a position opposite to both ends of the U-shaped portion with respect to the heat exchange portion 233. The flow path of the discharge pipe 232 is connected to the end of the folded structure, that is, the end of the flow path 234. In such a manner, since the folded structure of the flow path 234 (downstream region 234b) with use of the partition portion 238 in the arm 233d is employed, the uneven flow of the refrigerant in the flow path 234 in the arm 233d is prevented. It may be possible to effectively cool the reactor 260 and the capacitor unit 270.

The notch portion 235 is placed between the arms 233c and 233d. The notch portion 235 functions similarly to the partition portion 238. Due to the notch portion 235 and the partition portion 238, the downstream region 234b of the flow path 234 has a meandering shape. In such a manner, by employing the meandering shape, it may be possible to effectively cool the reactor 260 and the capacitor unit 270 while cooling all the power modules 110 arranged in the X direction. Further, the notch portion 235 is sandwiched, and the power module 110 faces the reactor 260 and the capacitor unit 270. Therefore, it may be possible to simplify the connection structure including the bus bar 280 while effectively cooling the reactor 260 and the capacitor unit 270.

The multiple power modules 110 are placed, on the arm 233c, in the order of configuring the U phase of the inverters 7 and 8, the V phase, the W phase, and the converter 6 from a position close to the supply pipe 231. Specifically, on the first surface 233a, the power modules 110 are placed in the order of configuring the U phase of the inverter 7, the V phase, the W phase, and the converter 6a from a position close to the supply pipe 231. On the second surface 233b, the power modules 110 are placed in the order of configuring the U phase of the inverter 8, the V phase, the W phase, and the converter 6b from a position close to the supply pipe 231. The multiple power modules 110 are arranged along a direction in which the refrigerant flow in the arm 233c. In FIG. 45, the refrigerant flow is indicated by a solid arrow.

The reactor 260 and the capacitor unit 270 are arranged in the X direction on the arm 233d. Specifically, on the first surface 233a, the capacitor unit 270 and the reactor 260 close to the R1 are placed in this order from a position close to the discharge pipe 232. On the second surface 233b, the capacitor unit 270 and the reactor 260 close to the R2 are placed in this order from the side of the discharge pipe 232.

In the present example, the power module 110 has the cooler 120. The power module 110 has a structure shown in FIG. 22. That is, the capacitor C1, the heat exchange portion 123 of the first stage, the semiconductor device 20, the heat exchange portion 123 of the second stage, the drive substrate 160 are placed in this order from the side of the first surface 181 of the protective member 180. As shown in FIG. 46, the upstream region 234a and the downstream region 234b communicate with each other via the flow path 126 of the power module 110. The upstream region 234a of the flow path 234, the flow path 126, the downstream region 234b of the flow path 234 form one flow path. Accordingly, the same refrigerant flows through the flow paths 126 and 234.

The power modules 110 are placed on the first surface 233a of the heat exchange portion 233 and the second surface 233b. The supply pipe 121 of the cooler 120 of the power module 110 and the discharge pipe 122 protrude from the first surface 181 of the protective member 180 in the Z direction. On the side of the first surface 233a of the heat exchange portion 233 and the side of the second surface 233b, penetration holes 233e and 233f for attaching the supply pipe 121 and the discharge pipe 122 are placed for each power module 110.

In the present example, the supply pipe 121 and the heat exchange portion 233 are connected, in a state where the supply pipe 121 is inserted into the penetration hole 233e connected to the upstream region 234a and the flow path of the supply pipe 121 is connected to the flow path 234 (upstream region 234a). The connection portion between the supply pipe 121 and the heat exchange portion 233 is liquidtightly sealed by an annular elastic member (for example, O-ring), a liquid seal member before curing, welding, or the like. Similarly, the discharge pipe 122 and the heat exchange portion 233 are connected, in a state where the discharge pipe 122 is inserted into the penetration hole 233f connected to the downstream region 234b and the flow path of the discharge pipe 122 is connected to the flow path 234 (downstream region 234b). The connection portion between the discharge pipe 122 and the heat exchange portion 233 is also liquidtightly sealed.

According to the structure described above, the refrigerant flows as described below. The refrigerant supplied from the supply pipe 231 of the cooler 230 to the flow path 234 flows toward the tip (U-shaped tip) of the arm 233c in the upstream region 234a, as shown in FIG. 45. Then, the refrigerant flows from the upstream region 234a to the downstream region 234b via the flow path 126 of the power module 110. Thereby, the example of the power module 110, for example, the semiconductor device 20 and the capacitor C1 is cooled.

Specifically, the refrigerant flows from the upstream region 234a to components of the heat exchange portion 123 of the second stage through the supply pipe 121, and discharged from the discharge pipe 122 to the downstream region 234b. The supply pipe 121 and the discharge pipe 122 are placed at diagonal positions with respect to the heat exchange portion 123 having the substantially rectangular plane shape. The position of the supply pipe 121 is closer to the supply pipe 231 in the X direction than that of the discharge pipe 122. Accordingly, the refrigerant flows through the flow path 126 in the heat exchange portion 123, as shown by broken arrows in FIG. 45 and FIG. 46.

The refrigerant flowing from the flow path 126 into the downstream region 234b circumvents the notch portion 235 from a portion of the arm 233c, and flows to the side of the arm 233d. The refrigerant flows in the downstream region 234b along the partition portion 238, changes the flowing direction on the tip side of the arm 233d, and is discharged from the discharge pipe 232. In such a manner, on the side of the arm 233*d*, the refrigerant flows in the flow path 234, and thereby the reactor 260 and the capacitor unit 270 are cooled.

Next, the effect of the electric power conversion device 5 of the present embodiment will be described.

The electric power conversion device 5 includes the cooler 230 and the multiple power modules 110 configuring the electric power converter. The power module 110 includes not only the semiconductor device 20 configuring the upper-lower arm circuit 10 but also the capacitor C1 connected to the upper-lower arm circuit 10 in parallel. In such a manner, for each power module 110, in other words, each upper-lower arm circuit 10, the capacitor C1 is provided. Further, in the power module 110, the semiconductor device 20 and the capacitor C1 are arranged in the Z direction.

The power module 110 having such a configuration is placed on both of the first surface 233*a* of the cooler 230 (heat exchange portion 233) and the second surface 233*b*. The power module 110 placed on each surface is cooled by the cooler 230. Accordingly, it may be possible to reduce the size of the electric power conversion device 5 in the direction orthogonal to the Z direction while cooling the semiconductor device 20. The capacitor can be placed closer to the semiconductor device as compared with the configuration in which the semiconductor device is placed on one surface of the cooler, the capacitor is placed on the rear surface, and the semiconductor device and the capacitor are connected in parallel. Accordingly, it may be possible to reduce the inductance of the wiring connecting the semiconductor device and the capacitor, and suppress the surge voltage.

In the cooler 230, the length of the heat exchange portion 233 in the Z direction, that is, the thickness is shorter than the minimum length in the X direction orthogonal to the Z direction and the minimum length in the Y direction. In such a manner, the cooler 230 has a flat shape having a thin thickness. Accordingly, the temperature difference is unlikely to occur in the temperature distribution of the refrigerant in the thickness direction in the flow path 234, specifically, between a front layer on the side of the first surface 233*a* and a front layer on the side of the second surface 233*b*. Thereby, it may be possible effectively cool each of the power modules 110 placed on the both surfaces.

The power module 110 also includes the cooler 120. The flow path 126 of the cooler 120 communicates with the flow path 234 so that refrigerant returns from the flow path 234 of the cooler 230 to the flow path 234 via the flow path 126. In such a manner, the refrigerant can be drawn from the cooler 230 to the cooler 120 in the power module 110, and the semiconductor device 20 in the power module 110 can be cooled. The semiconductor device 20 is placed on one surface of the cooler 120. The cooler 120 is placed closer to the semiconductor device 20 than the cooler 230. Therefore, it may be possible to effectively cool the semiconductor device 20. In the cooler 120, the capacitor C1 is placed on the opposite side to the semiconductor device 20. Accordingly, it may be possible to effectively cool the capacitor C1. The cooler 230 corresponds to a first cooler, the flow path 234 corresponds to a first flow, the cooler 120 corresponds to a second cooler, and the flow path 126 corresponds to a second flow path.

The flow path 234 of the cooler 230 is divided into the upstream region 234*a* and the downstream region 234*b*. The flow path 126 of the power module 110 connects the upstream region 234*a* and the downstream region 234*b*. Thereby, the refrigerant flows into the side of the flow path 126 of the cooler 120. Accordingly, it may be possible to more effectively cool the semiconductor device 20 and the capacitor C1.

Figure 47:
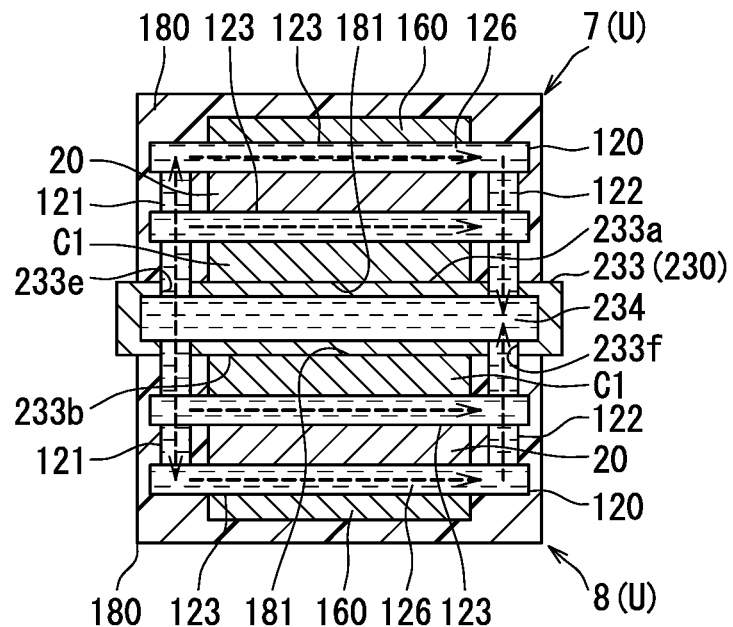
FIG. 47 is a schematic cross-sectional view showing another example of the cooling structure.

As in another example shown in FIG. 47, the power module 110 may be placed at the heat exchange portion 233 having the non-divided flow path 234, the flow path 126 may be connected. FIG. 47 corresponds to FIG. 46. However, in consideration of the size of the power module 110, in a direction in which the refrigerant flows, the cross-sectional area of the flow path 126 is smaller than that of the flow path 234. The flow path 234 of the cooler 230 is a common main flow path to the multiple power modules 110, and the flow path 126 of the cooler 120 is a sub flow path. As shown in the present example, it is preferable to employ the configuration in which the refrigerant easily flows into the side of the cooler 120.

For example, although not shown, the cooler 230 may have a communication region that connects the upstream region 234*a* and the downstream region 234*b*, and a cross-sectional area of this communication region may be smaller than that of the upstream region 234*a* or the downstream region 234*b*. By providing the communication region, the resistance flowing from the upstream region 234*a* to the downstream region 234*b* is increased, and it becomes easy to flow into the side of the cooler 120. However, the configuration shown in the present example is more effective.

The heat exchange portions 123 of the cooler 120 are provided in two stages. That is, the cooler 120 is branched into two stages in the Z direction. The cooler 120 (heat exchange portion 123) is provided with an inner fin or the like to have a higher heat transfer coefficient than the cooler 230 (heat exchange portion 233). The heat exchange portions 123 of the two stages sandwiches the semiconductor device 20. The capacitor C1 is placed on the side opposite to the semiconductor device 20 with respect to at least one of the two stages of the heat exchange portions 123. Thereby, the heat exchange portions 123 of the two stages can cool the semiconductor device 20 from both surface sides in the Z direction. Accordingly, it may be possible to more effectively cool the semiconductor device 20. The heat exchange portion 123 can cool the capacitor C1. In particular, in the present example, the capacitor C1 is placed between the heat exchange portion 123 of the first stage close to the cooler 230 and the heat exchange portion 233. Accordingly, it may be possible to effectively cool the capacitor C1.

The capacitor C1 is placed on the opposite side to the semiconductor device 20 with respect to one of the two stages of the heat exchange portion 123. The drive substrate 160 is placed on the opposite side to the semiconductor device 20 with respect to the other of the two stages of the heat exchange portion 123. The signal terminal 80 of the semiconductor device 20 is connected to the drive substrate 160. Thereby, it may be possible to cool the drive substrate 160 while reducing the size in the direction orthogonal to the Z direction. Further, it may be possible to shorten the signal terminal 80. Since the semiconductor device 20 and the drive substrate 160 can be connected in a short distance, it may be possible to suppress the delay of an on-off timing of the switching elements Q1 and Q2. Further, it may be possible to improve noise resistance.

The electric power conversion device 5 includes the capacitor unit 270 including the smoothing capacitor C2 in addition to the multiple power modules 110 configuring the inverters 7 and 8. The capacitance of the smoothing capacitor C2 is larger than the capacitance of the capacitor C1 of each power module 110. Since the smoothing capacitor C2 is provided in addition to the capacitor C1, the capacitor C1 may have a function of supplying electric charges required for switching of the switching elements Q1 and Q2 of the parallelly connected upper-lower arm circuit 10. Accordingly, it may be possible to reduce the size of the capacitor C1. Further, by providing the smoothing capacitor C2, it may be possible to prevent the direct voltage from changing. In particular, in the present example, the capacitor C1 and the upper-lower arm circuit 10 are connected to the VH line 12H and the N line 13 that are the electric power lines via the common wirings 11P and 11N. Specifically, the capacitor C1 and the upper-lower arm circuit 10 are connected to the VH bus bar 284 and the N bus bar 282 via the common wiring portions 132 and 142. Accordingly, it may be possible to suppress the surge voltage. The capacitor C1 corresponds to a first capacitor. The smoothing capacitor C2 corresponds to a second capacitor.

The capacitor units 270 configuring the smoothing capacitor C2 are placed on both surfaces of the heat exchange portion 233 of the cooler 230. In such a manner, in the Z direction, the cooler 230 is placed between the capacitor units 270. Accordingly, it may be possible to effectively cool the capacitor unit 270 including the smoothing capacitor C2 while reducing the size in the direction orthogonal to the Z direction.

The cooler 230 has the notch portion 235 that divides the region into the region where the power module 110 is placed and the region where the capacitor unit 270 including the smoothing capacitor C2 is placed. Thereby, while the power module 110 and the capacitor unit 270 are placed on both surfaces of the heat exchange portion 233, the connection of the N bus bar 282 configuring the N line 13, the VH bus bar 284 configuring the VH line 12H and the power module 110, the capacitor unit 270 can be simplified. Accordingly, it may be possible to also reduce the inductance of the main circuit wiring. Further, it may be possible to simplify the connection between the power module 110 and the control substrate 290. For example, those can be connected in a short distance.

The electric power conversion device 5 includes the reactor 260 configuring the converter 6 and the power module 110. The reactor 260 and the capacitor unit 270 are arranged in one direction orthogonal to the Z direction. In such a manner, the reactor 260 and the capacitor unit 270 are placed close to each other. Thereby, it may be possible to reduce the size of the electric power conversion device 5. The VL bus bar 281 is shortened, and thereby it may be possible to reduce copper loss.

The reactor 260 and the capacitor unit 270 are arranged in the X direction that is the direction in which the multiple power modules 110 are arranged. By aligning the arrangement direction in such a manner, it may be possible to reduce the size of the electric power conversion device 5. In the Y direction, the reactor 260 and the capacitor unit 270 face the power module 110. Each power module 110 overlaps with at least one of the reactor 260 or the capacitor unit 270 in the projection view in the Y direction. The distance between the power module 110 and the reactor 260 and the distance between the power module 110 and the capacitor unit 270 are shortened, and the connection distance from the power module 110 to the capacitor unit 270 via the IL bus bar 283, the N bus bar 282, and the VH bus bar 284 can be shortened. Thereby, it may be possible to reduce the copper loss.

As the converter 6, a multi-phase converter including multiple reactors R1 and R2 is employed. The reactor 260 close to the R1 is placed on the first surface 233a of the heat exchange portion 233, and the reactor 260 close to the R2 is placed on the second surface 233b. That is, the reactors 260 are placed on both surfaces of the cooler 230. Accordingly, it may be possible to effectively cool the reactor 260 while reducing the size in the direction orthogonal to the Z direction.

The power module 110 is placed on the upstream side of the flow path 234. The reactor 260 and the capacitor unit 270 are placed on the downstream side of the flow path 234 as compare with the power module 110. Thereby, it may be possible to effectively cool not only the power module 110 but also the reactor 260 and the capacitor unit 270. Further, it may be possible to effectively cool the power module 110 whose temperature change per unit time is large, specifically the semiconductor chip 40 on which the switching elements Q1 and Q2 are formed by the refrigerant of which temperature is lower than that of the reactor 260 whose temperature change per unit time is low and that of the capacitor unit 270.

The power module 110 applied to the electric power conversion device 5 is not limited to the configuration shown in the present example. For example, the power module 110 including the semiconductor device 20 having the 2-in-1 package structure can be employed. As the placement of the main terminal 70, a configuration other than the example can be also employed.

The example in which the semiconductor device 20 is placed between the heat exchange portions 123 of the two stages in the power module 110 has been described. However, it is not limited to this. The capacitor C1 may be placed between the heat exchange portions 123 of the two stages, and the semiconductor device 20 may be placed between the heat exchange portion 233 and the heat exchange portion 123 of the first stage. However, when the protective member 180 is placed between the cooler 230, it is more preferable that the semiconductor device 20 whose temperature change per unit time is large is cooled between the heat exchange portions 123 of the two stages.

Figure 48:
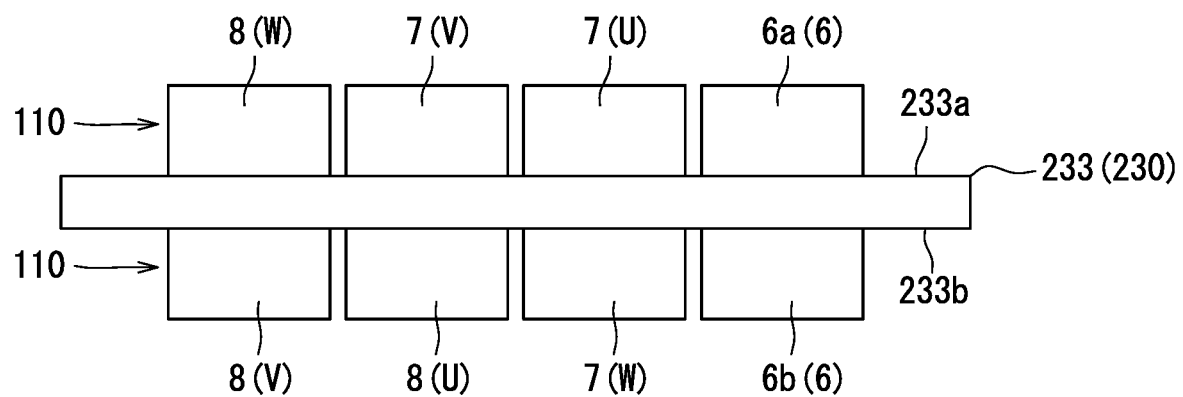
FIG. 48 is a schematic plan view showing another example of arrangement of the power modules.

The placement of the multiple power modules 110 is not limited to the example described above. For example, in another example shown in FIG. 48, a part of the power modules 110 configuring the inverter 7 is placed on the first surface 233a of the heat exchange portion 233, and the remaining part of the power modules 110 is placed on the second surface 233b. A part of the power modules 110 configuring the inverter 8 is placed on the first surface 233a of the heat exchange portion 233, and the remaining part of the power modules 110 is placed on the second surface 233b. Specifically, on the first surface 233a, the converter 6a, the four power modules 110 configuring the U-phase and the V-phase of the inverter 7 and the W-phase of the inverter 8 are placed. On the second surface 233b, the converter 6b, the four power modules 110 configuring the W phase of the inverter 7 and the U phase and the V phase of the inverter 8 are placed.

The example in which the semiconductor device 20 is placed on the side of the cooler 230 in the power module 110 has been described. However, it is not limited to this. The capacitor C1 may be placed between the heat exchange portions 123 and 233. However, it is more preferable that the semiconductor device 20 whose temperature change per unit time is large is cooled between the heat exchange portions 123 and 233.

The output bus bar 150 of the power module 110 configuring the converter 6 and the IL bus bar 283 may be directly connected not via the terminal 251 of the output terminal block 250. That is, the terminals 251 for the inverters 7 and 8 may be placed at the output terminal block 250.

Second Embodiment

The present embodiment can refer to the preceding embodiment. Therefore, a description of portions common to the drive system 1, the electric power conversion device 5, the semiconductor device 20, and the power module 110 in the preceding embodiment will be omitted.

Figure 49:
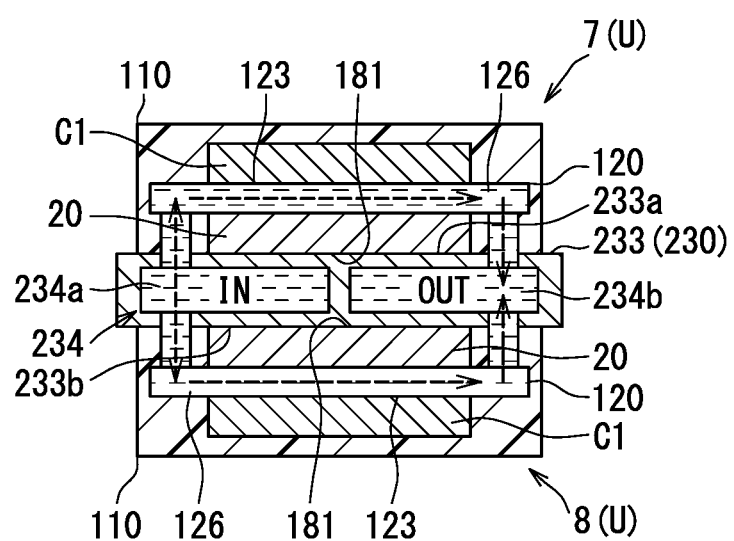
FIG. 49 is a schematic cross-sectional view showing the cooling structure in the electric power conversion device according to a second embodiment.

As shown in FIG. 49, in the present embodiment, in the cooler 120 of the power module 110, the heat exchange portion 123 is placed in one stage. FIG. 49 corresponds to FIG. 46. In the present embodiment, the power modules 110 are placed on both of the first surface 233a and the second surface 233b of the heat exchange portion 233 of the cooler 230. The semiconductor device 20 is placed between the heat exchange portions 123 and 233. The capacitor C1 connected to the semiconductor device 20 in parallel is placed on the opposite side to the semiconductor device 20 with respect to the heat exchange portion 123. The power module 110 does not include the drive substrate 160. The other configurations are same as those of the preceding embodiment (for example, see FIG. 46).

In such a manner, also in the present embodiment, the semiconductor device 20 and the capacitor C1 are arranged in the Z direction. The power module 110 having such a configuration is placed on both of the first surface 233a of the cooler 230 (heat exchange portion 233) and the second surface 233b. Accordingly, it may be possible to reduce the size of the electric power conversion device 5 in the direction orthogonal to the Z direction while cooling the semiconductor device 20.

In the same power module 110, the semiconductor device 20 is placed closer to the heat exchange portion 233 than the capacitor C1. Accordingly, the heat exchange portion 233 of the cooler 230 can effectively cool the semiconductor device 20.

Similarly to the preceding embodiment, the cooler 230 (heat exchange portion 233) has the flat shape of which thickness is thin. Since the temperature difference of the refrigerant is unlikely to occur in the Z direction, it may be possible effectively cool each of the power modules 110 placed on the both surfaces.

The semiconductor device 20 is placed between the heat exchange portions 123 and 233. Accordingly, the heat exchange portions 123 and 233 can cool the semiconductor device 20 from the both surfaces in the Z direction. Thereby, it may be possible to more effectively cool the semiconductor device 20. The heat exchange portion 123 can also cool the capacitor C1.

The heat exchange portion 233 is not particularly limited to the configuration shown in FIG. 49. For example, as shown in FIG. 47, the configuration having the non-divided flow path 234 or the configuration having the communication region may be employed.

The example in which the semiconductor device 20 is placed on the side of the cooler 230 in the power module 110 has been described. However, it is not limited to this. The capacitor C1 may be placed between the heat exchange portions 123 and 233. However, it is more preferable that the semiconductor device 20 whose temperature change per unit time is large is cooled between the heat exchange portions 123 and 233.

Third Embodiment

The present embodiment can refer to the preceding embodiment. Therefore, a description of portions common to the drive system 1, the electric power conversion device 5, the semiconductor device 20, and the power module 110 in the preceding embodiments will be omitted.

Figure 50:
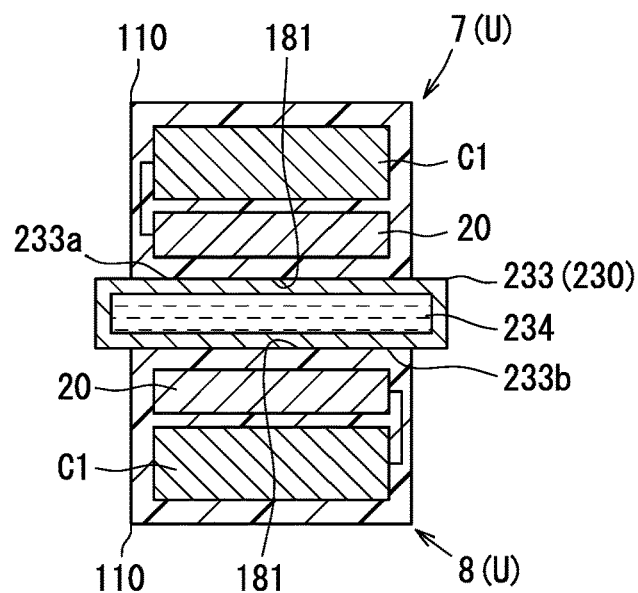
FIG. 50 is a schematic cross-sectional view showing the cooling structure in the electric power conversion device according to a third embodiment.

As shown in FIG. 50, in the present embodiment, the power module 110 does not include the cooler 120 and the drive substrate 160. In the present embodiment, the power modules 110 are placed on both of the first surface 233a and the second surface 233b of the heat exchange portion 233 of the cooler 230. The semiconductor device 20 is placed on the side of the cooler 230. The heat exchange portion 233 of the cooler 230 is not partitioned between the upstream and the downstream. The other configurations are same as those of the preceding embodiment (for example, see FIG. 46).

In such a manner, also in the present embodiment, the semiconductor device 20 and the capacitor C1 are arranged in the Z direction. The power module 110 having such a configuration is placed on both of the first surface 233a of the cooler 230 (heat exchange portion 233) and the second surface 233b. Accordingly, it may be possible to reduce the size of the electric power conversion device 5 in the direction orthogonal to the Z direction while cooling the semiconductor device 20.

In the same power module 110, the semiconductor device 20 is placed closer to the heat exchange portion 233 than the capacitor C1. Accordingly, the heat exchange portion 233 of the cooler 230 can effectively cool the semiconductor device 20.

Similarly to the preceding embodiments, the cooler 230 (heat exchange portion 233) has the flat shape of which thickness is thin. Since the temperature difference of the refrigerant is unlikely to occur in the Z direction, it may be possible effectively cool each of the power modules 110 placed on the both surfaces.

The example in which the semiconductor device 20 is placed on the side of the cooler 230 in the power module 110 has been described. However, it is not limited to this. The capacitor C1 may be placed on the side of the cooler 230. However, it is more preferable that the semiconductor device 20 whose temperature change per unit time is large is placed on the side of the cooler 230, and is cooled.

Fourth Embodiment

This embodiment is a modification example which is based on the preceding embodiments. The embodiments described above shows the example in which one surface of the heating element different from the power module 110 is cooled by the heat exchange portion 233. Instead of this, in this embodiment, multiple surfaces of the heating element are cooled by the heat exchange portion 233.

Figure 51:
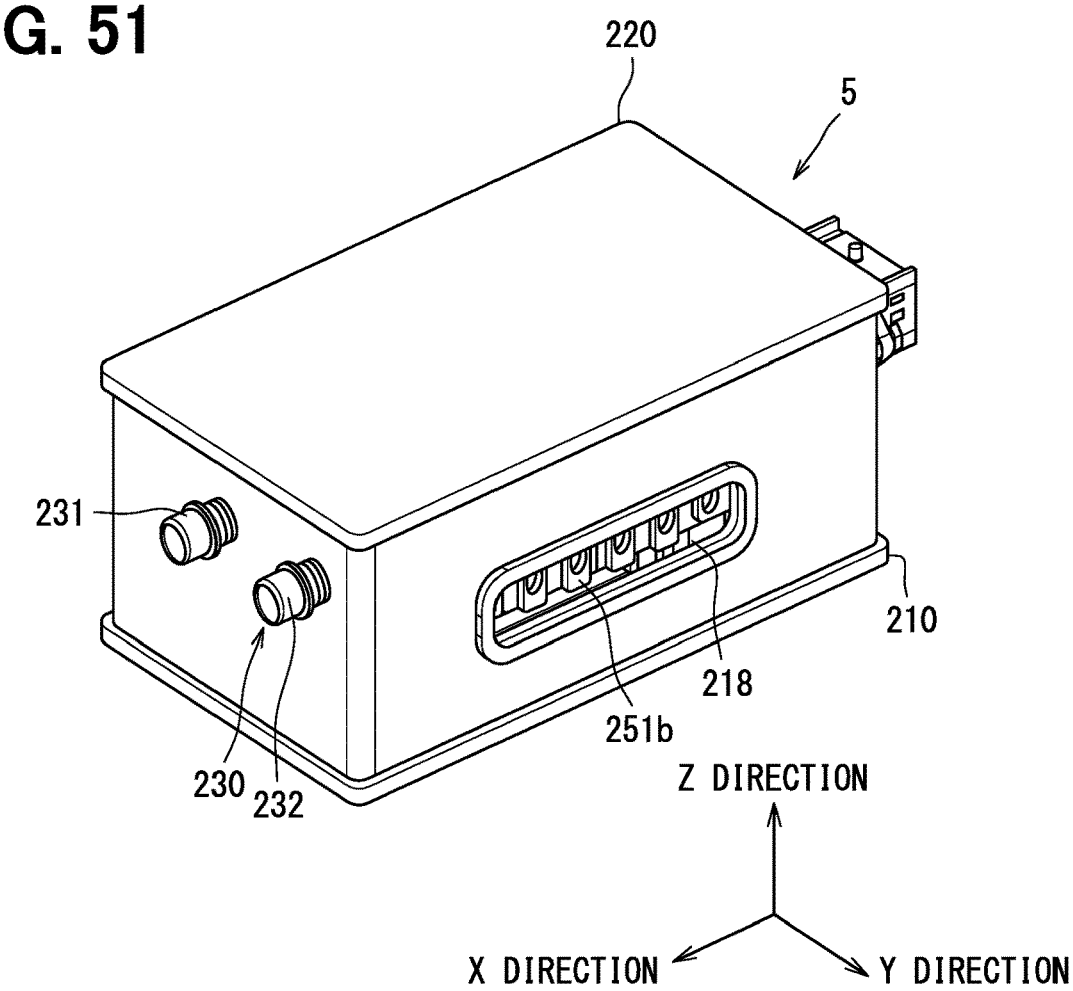
FIG. 51 is a perspective view showing the electric power conversion device according to a fourth embodiment.

As shown in FIG. 51, also in the electric power conversion device 5 of the present embodiment, in an internal space of the housing configured by assembling the case 210 and the cover 220, at least a part of each of the other elements is housed. Most of the cooler 230 is placed inside the case 210, and a part of the cooler 230, specifically a part of each of the supply pipe 231 and the discharge pipe 232 protrude from the case 210. FIG. 51 shows the electric power conversion device 5 in a simplified manner.

Figure 52:
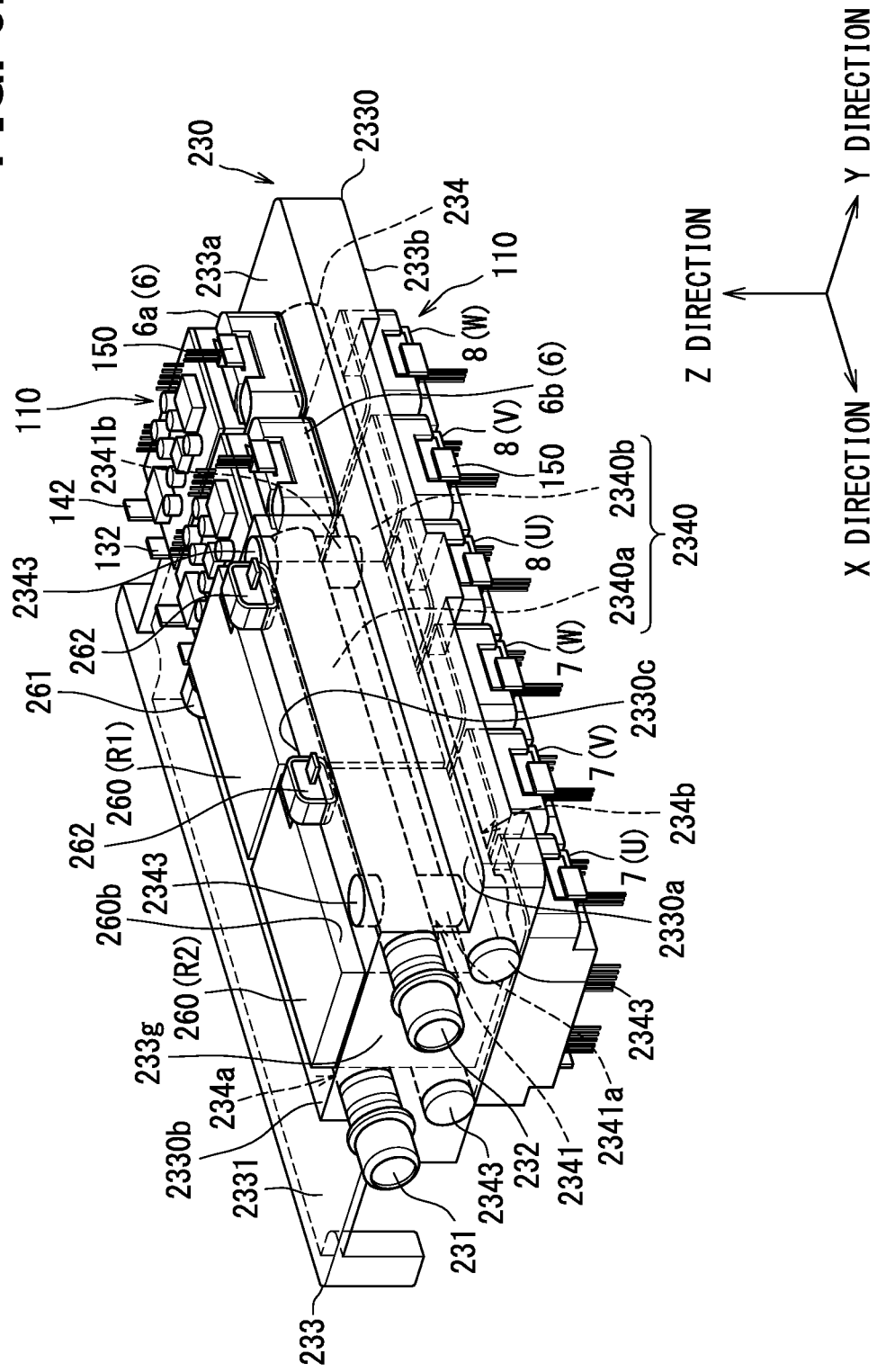
FIG. 52 is a perspective view showing a periphery of the cooler.
Figure 53:
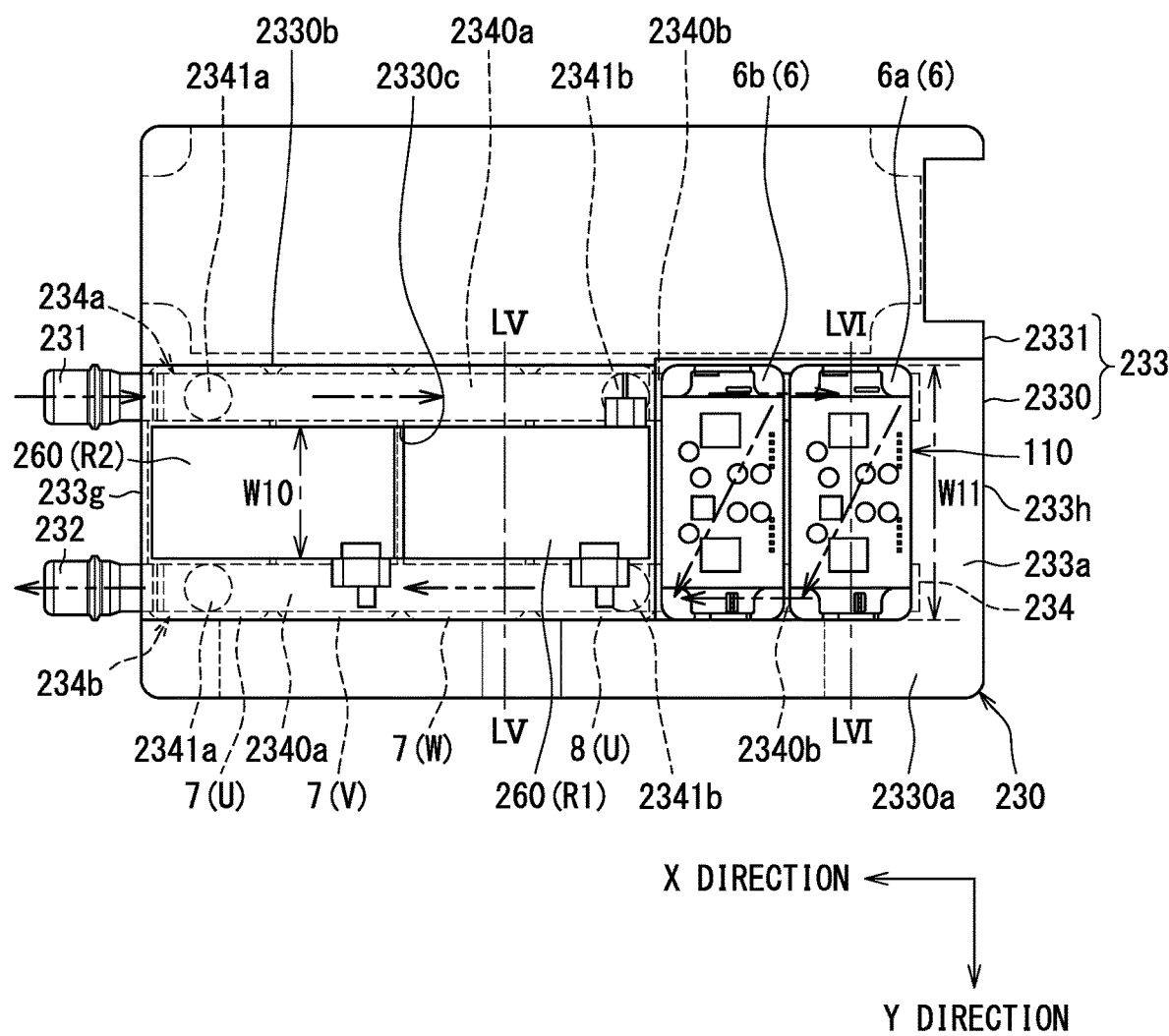
FIG. 53 is a plan view showing the periphery of the cooler.
Figure 54:
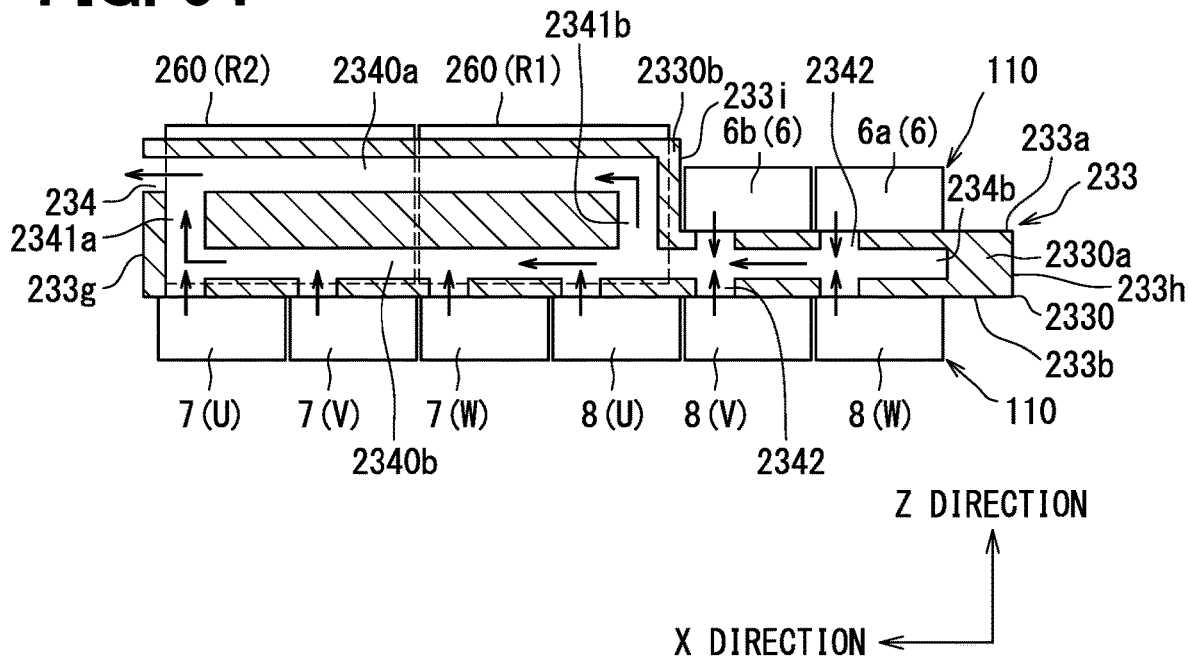
FIG. 54 is a view showing a flow path of the cooler.
Figure 55:
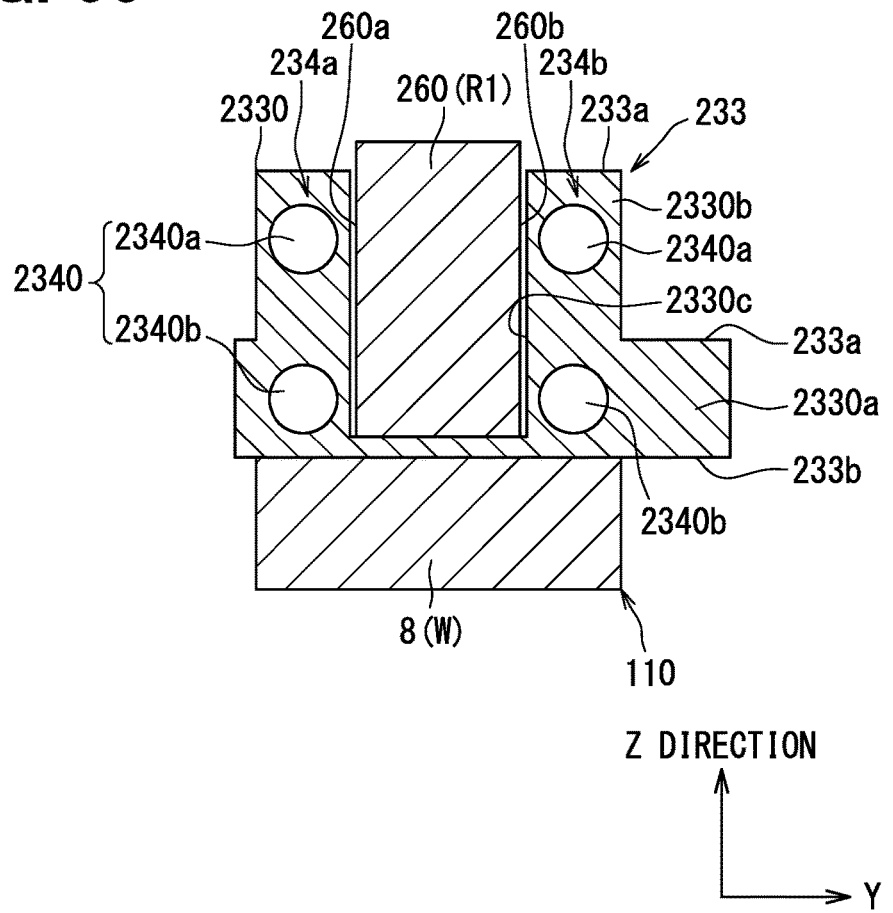
FIG. 55 is a cross-sectional view taken along a line LVI-LVII of FIG. 53.
Figure 56:
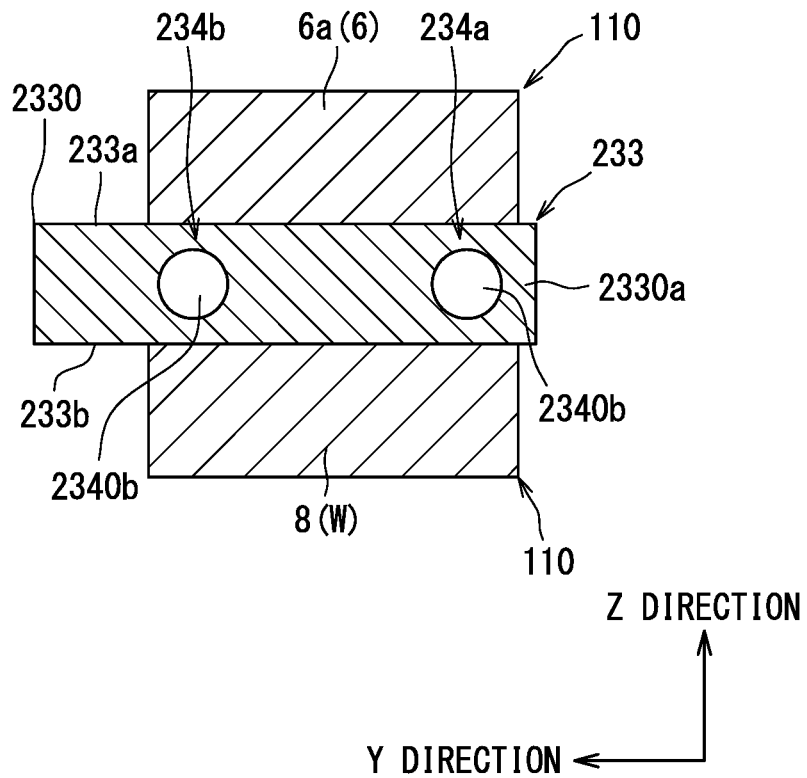
FIG. 56 is a cross-sectional view taken along a line LV-LV of FIG. 53.

The heat exchange portion 233 is formed of the metal material such as aluminum. The heat exchange portion 233 may be referred to as a cooling housing. As shown in FIG. 52 and FIG. 53, the heat exchange portion 233 includes a main portion 2330 and a support portion 2331. As shown in FIGS. 52 to 56, the flow path 234 is placed at the main portion 2330. In FIG. 53 and FIG. 54, for convenience, a plug portion 2343 is omitted. In FIG. 55 and FIG. 56, for convenience, the reactor 260 and the power module 110 are simply shown.

On the main portion 2330, all the power modules 110 are placed. The power module 110 is placed on each of the first surface 233a and the second surface 233b of the main portion 2330. In the present embodiment, elements configuring the converter 6 are placed on the side of the first surface 233a of the main portion 2330.

Specifically, the two power modules 110 configuring the converters 6a and 6b and the two reactors 260 (R1, R2) are placed. The reactor 260 is placed on the side of the first surface 233a, and is the heating element different from the power module 110 placed on the first surface 233a. The reactor 260 is placed on the opposite side to the second surface 233b. The six power modules 110 corresponding to each phase of the inverters 7 and 8 are placed on the side of the second surface 233b of the main portion 2330.

The main portion 2330 has a base portion 2330a, a convex portion 2330b, and an inserted portion 2330c. The base portion 2330a has the substantially rectangular plane shape of which longitudinal direction is the X direction. The convex portion 2330b protrudes from the base portion 2330a in the Z direction. The convex portion 2330b is placed on a part of the base portion 2330a on the side of the first surface 233a. In the main portion 2330, a part where the convex portion 2330b is placed on the base portion 2330a is a thick portion, and a part where the convex portion 2330b is placed on the base portion 2330a is a thin portion.

The convex portion 2330b also has the substantially rectangular plane shape of which longitudinal direction is the X direction. The convex portion 2330b is placed so as to include one of the four corners of the base portion 2330a. The convex portion 2330b is unevenly placed, in the X direction, close to one of the two short sides of the base portion 2330a having the substantially rectangular plane shape. In the X direction, one lateral surface of the base portion 2330a is substantially flush with one lateral surface of the convex portion 2330b, and a lateral surface 233g of the heat exchange portion 233 is formed. Another lateral surface of the base portion 2330a forms a lateral surface 233h opposite to the lateral surface 233g. The convex portion 2330b is unevenly placed, in the Y direction, close to one of the two long sides of the base portion 2330a. A part of the lateral surface of the convex portion 2330b and the protrusion tip surface form a part of the first surface 233a.

The inserted portion 2330c is a recess portion placed in the main portion 2330. At least a part of the heating element is inserted into the inserted portion 2330c, and is placed. The inserted portion 2330c of the present embodiment is a bottomed hole portion. The inserted portion 2330c is placed at a position overlapping the convex portion 2330b in the plan view from the Z direction. The inserted portion 2330c penetrates the convex portion 2330b, and reaches the middle of the base portion 2330a. The inserted portion 2330c is substantially rectangular in plan view with the X direction as the longitudinal direction.

The reactors 260 that are the heating elements are inserted into the inserted portion 2330c, and is placed. In the present embodiment, in one inserted portion 2330c, the two reactor 260 (R1, R2) are arranged. In the inserted portion 2330c, the reactors 260 are aligned in the X direction. The longitudinal direction of each reactor 260 is the X direction. The two reactors 260 have the same structure as each other, and entirely overlap each other in the projection view from the X direction.

In the Z direction, most of the reactor 260 is placed in the inserted portion 2330c, and the remaining part protrudes from the inserted portion 2330c. A gap may be placed between a part of a front surface of the part of the reactor 260 placed in the inserted portion 2330c and a wall surface of the inserted portion 2330c. In this gap, a heat conductive member (for example, heat conductive gel) (not shown) may be placed. Thereby, as compared with the configuration in which the heat conductive member is not placed, it may be possible to more effectively cool the reactor 260. The heat conductive member may have an electrical insulation property if necessary.

The two power modules 110 configuring the converter 6 is placed on a region where the convex portion 2330b is not placed in the base portion 2330a, as shown in FIG. 52, FIG. 55, and the like. The power module 110 is placed on the extension of a line where the two reactors 260 are arranged. The two reactors 260 and the two power modules 110 are placed along the X direction. In the X direction, one of the power modules 110 is placed with a slight gap from the convex portion 2330b.

Each power module 110 placed on the side of the first surface 233a has the substantially rectangular plane. The power module 110 is placed in a state where the longitudinal of the power module 110 is the Y direction. The power module 110 has the output bus bar 150 on one end side in the Y direction, and has the common wiring portions 132 and 142 on the other end.

The power module 110 placed on the side of the second surface 233b is also placed in a state where the longitudinal of the power module 110 is the Y direction. Six power modules 110 are arranged in the X direction in a state where the longitudinal direction is the Y direction. The six power modules 110 are placed on a region directly under the reactors 260 and the power module 110 that are placed close to the first surface 233a.

The flow path 234 is divided into the upstream region 234a and the downstream region 234b. The upstream region 234a and the downstream region 234b extend in a direction in which the power module 110 placed on the side of the first surface 233a and the reactor 260 are placed. The flow path 234 extends from the lateral surface 233g toward the opposite lateral surface 233h. The reactor 260 is placed between the upstream region 234a of the flow path 234 and the downstream region 234b in the direction orthogonal to the arrangement direction. A lateral surface 260a of one of the reactors 260 is cooled by the refrigerant flowing through the upstream region 234a of the flow path 234. The lateral surface 260b opposite to the lateral surface 260a is cooled by the refrigerant flowing through the downstream region 234b. The reactors 260 are sandwiched by the heat exchange portions 233 (main portions 2330) placed close to the both lateral surfaces 260a and 260b.

In the present embodiment, in the plan view from the Z direction, the upstream region 234a and the downstream region 234b extend in substantially parallel to the X direction that is the direction in which the power module 110 and the reactor 260 are arranged. In the Y direction, the reactor 260 is placed between the upstream region 234a and the downstream region 234b. The inserted portion 2330c is placed between the upstream region 234a and the downstream region 234b. In the Y direction, the upstream region 234a is placed on the side of the support portion 2331.

The upstream region 234a and the downstream region 234b have an extension portion 2340 and join portions 2341 and 2342. The extension portion 2340 extends in the X direction. The extension portion 2340 includes a first extension portion 2340a and a second extension portion 2340b. The extension portion 2340 of the upstream region 234a and the extension portion 2340 of the downstream region 234b overlap at positions overlapping each other in the projection view from the Y direction, in other words, placed at the same position in the ZX plane.

The first extension portion 2340a is placed at the convex portion 2330b. One end of the first extension portion 2340a opens on the lateral surface 233g. This open end is connected to the supply pipe 231 in the upstream region 234a, and is connected to the discharge pipe 232 in the downstream region 234b. An end opposite to the open end is closed. The first extension portion 2340a may be placed so as not to open on a lateral surface 233i opposite to the lateral surface 233g in the convex portion 2330b. The first extension portion 2340a may be placed so as to open on the lateral surface 233i, and may be closed by the plug portion 2343 described later. The similar applies to the closed portions.

As shown in FIG. 55, the first extension portion 2340a of the upstream region 234a is placed on one side of the convex portion 2330b sandwiching the inserted portion 2330c, and the first extension portion 2340a of the downstream region 234b is placed on the other side. The reactor 260 is placed between the first extension portion 2340a of the upstream region 234a and the first extension portion 2340a of the downstream region 234b.

The second extension portion 2340b is placed at a position closer to the second surface 233b than the first extension portion 2340a. The second extension portion 2340b is placed at the base portion 2330a. The second extension portion 2340b is placed so as to overlap the first extension portion 2340a in the projection view from the Z direction. Both ends of the second extension portion 2340b are closed. In the present embodiment, the second extension portion 2340b opens on the lateral surface 233g, and extends to the front of the lateral surface 233h in the X direction. The end close to the lateral surface 233g is closed by the plug portion 2343. The second extension portion 2340b is placed on the side of the first surface 233a, and extends closer to the lateral surface 233h than the power module 110 on the side closer to the lateral surface 233h. The second extension portion 2340b extends longer than the first extension portion 2340a.

As shown in FIG. 55, the second extension portion 2340b of the upstream region 234a is placed on one side of the base portion 2330a sandwiching the inserted portion 2330c, and the second extension portion 2340b of the downstream region 234b is placed on the other side. The reactor 260 is placed between the second extension portion 2340b of the upstream region 234a and the second extension portion 2340b of the downstream region 234b. As shown in FIG. 56 and the like, the power module 110 is placed directly on the second extension portion 2340b of the upstream region 234a and the second extension portion 2340b of the downstream region 234b. The power module 110 is placed so that one end side in the longitudinal direction overlaps the second extension portion 2340b of the upstream region 234a in the projection view from the Z direction and the other end in the longitudinal direction overlaps the second extension portion 2340b of the downstream region 234b.

The joint portion 2341 joins the different extension portions 2340 on the same region side as that of the flow path 234. The joint portion 2341 extends in the Z direction. The joint portion 2341 includes a first joint portion 2341a and a second joint portion 2341b. The joint portion 2341 of the upstream region 234a and the joint portion 2341 of the downstream region 234b overlap at positions overlapping each other in the projection view from the Y direction, in other words, placed at the same position in the ZX plane. The joint portion 2341 is placed at a position overlapping the extension portion 2340 in the projection view from the Z direction.

The first joint portion 2341a is placed on the open end side of the first extension portion 2340a, and the second joint portion 2341b is placed on the closed end side of the first extension portion 2340a. One end of the first joint portion 2341 opens on the protrusion tip surface of the convex portion 2330b, and is closed by the plug portion 2343. The first joint portion 2341a communicates with the first extension portion 2340a on one end side, and communicates with the second extension portion 2340b on the other end. The similar applies to the second joint portion 2341b.

The joint portion 2342 is a portion in the flow path 234 that is connected to the flow path 126 of the cooler 120 of the power module 110 as shown in FIG. 54. The joint portion 2342 is placed corresponding to each power module 110. The joint portion 2342 is placed at a position overlapping the supply pipe 121 of the power module 110 and the discharge pipe 122. The joint portion 2342 extends in the Z direction. One end of the joint portion 2342 opens on the surface of the base portion 2330a of the main portion 2330, and the other end communicates with the second extension portion 2340b. The joint portion 2342 corresponding to the power module 110 of the converter 6 opens on the first surface 233a. The joint portion 2342 corresponding to the power modules of the inverters 7 and 8 open on the second surface 233b.

A long dashed double-dotted line arrow shown in FIG. 53 and a solid arrow shown in FIG. 54 show the refrigerant flow. When the refrigerant is introduced from the supply pipe 231 to the upstream region 234a of the flow path 234, the refrigerant flows through a first extension portion 230a, the first joint portion 2340a and the second extension portion 2340b, the second extension portion 2340b, the joint portion 2342, and the power module 110 in this order. The refrigerant flowing in the power module 110 flows through, in the downstream region 234b, the joint portion 2342, the second extension portion 2340b, the first joint portion 2341a and the second joint portion 2341b and the first extension portion 2340a in this order, and is discharged from the discharge pipe 232.

The support portion 2331 is integrally connected to the main portion 2330. The support portion 2331 extends from the main portion 2330 in the Y direction. The support portion 2331 extends from the long side close to the convex portion 2330b in the Y direction. At at least one of the first surface 233a or the second surface 233b of the support portion 2331, for example, a part of elements configuring the electric power conversion device 5 is placed. In the present embodiment, the capacitor unit 270 (not shown) is placed. The capacitor unit 270 is placed on, at least, the second surface 233b of the support portion 2331, and is fixed by the support portion 2331 by screw fastening or the like. The capacitor unit 270 is cooled by the support portion 2331.

In the present embodiment, the power module 110 and the reactor 260 that is the heating element different from the power module 110 are placed on the side of the first surface 233a in the heat exchange portion 233 of the cooler 230. The power module 110 and the reactor 260 are arranged in the X direction. The upstream region 234a of the flow path 234 and the downstream region 234b extend in a direction in which the power module 110 and the reactor 260 are arranged. The reactor 260 is placed between the upstream region 234a of the flow path 234 and the downstream region 234b in the direction orthogonal to the arrangement direction. The lateral surface 260a of one of the reactors 260 is cooled by the refrigerant flowing through the upstream region 234a. The lateral surface 260b opposite to the lateral surface 260a is cooled by the refrigerant flowing through the downstream region 234b.

In such a manner, since the flow path 234 are placed on the side of the both lateral surfaces 260a and 260b of the reactor 260 that is the heating element, the reactor 260 can be cooled from the side of the both lateral surfaces 260a and 260b. Accordingly, as compared with the configuration in which the reactor 260 is cooled from one surface, it may be possible to effectively cool the reactor 260. When the cooling performances are same, as compared with the configuration in which the reactor 260 is cooled from one surface, it may be possible to reduce the side in the direction orthogonal to the Z direction.

In particular, in the present, the upstream region 234a and the downstream region 234b extend along the X direction. As shown in FIG. 53, a width W10 of the reactor 260 is placed between the upstream region 234a and the downstream region 234b is narrower than a width W11 of the power module 110. Accordingly, it may be possible to reduce the size, in particular, in the Y direction while effectively cooling the reactor 260.

In the present embodiment, the reactor 260 is placed between the first extension portion 2340a of the upstream region 234a and the first extension portion 2340a of the downstream region 234b. The first extension portion 2340a sandwiches the reactor 260. Accordingly, the refrigerant flowing through the first extension portion 2340a can effectively cool the reactor 260 from the both lateral surfaces 260a and 260b. The reactor 260 is placed between the second extension portion 2340b of the upstream region 234a and the second extension portion 2340b of the downstream region 234b. The second extension portion 2340b sandwiches the reactor 260. Accordingly, the refrigerant flowing through the second extension portion 2340b can effectively cool the reactor 260 from the both lateral surfaces 260a and 260b.

In the heat exchange portion 233, not only the vicinity of the flow path 234 but also the portion away from the flow path 234 are cooled by the refrigerant flowing through the flow path 234. Therefore, the portion away from the flow path 234 also has the heat exchange function. The reactor 260 is cooled by, for example, the main portion 2330 positioned on the bottom surface side of the reactor 260.

In the present embodiment, the power module 110 is placed directly on the second extension portion 2340b of the upstream region 234a and the second extension portion 2340b of the downstream region 234b. Accordingly, the refrigerant flowing through the second extension portion 2340b can effectively cool the power module 110.

In the present embodiment, the convex portion 2330b is placed at the main portion 2330, and the inserted portion 2330c is placed at the convex portion 2330b. Thereby, the facing area between the heat exchange portion 233 and the reactor 260, particularly, the facing area with the lateral surfaces 260a and 260b can be increased. Accordingly, it may be possible to effectively cool the reactor 260 while preventing the size in the direction orthogonal to the Z direction from increasing.

In the present embodiment, the base portion 2330a is placed at the inserted portion 2330c. Thereby, the reactor 260 can be placed closer to the second surface 233b than the power module 110 placed on the side of the first surface 233a. Accordingly, it may be possible to prevent the size in the Z direction from increasing while effectively cooling the reactor 260 by increasing the facing area.

In the present embodiment, both of the power module 110 configuring the converter 6 and the reactor 260 are placed on the side of the first surface 233a. Accordingly, it may be possible to simplify the connection structure between the power module 110 and the reactor 260, for example, shorten the connection distance (wiring length).

Figure 57:
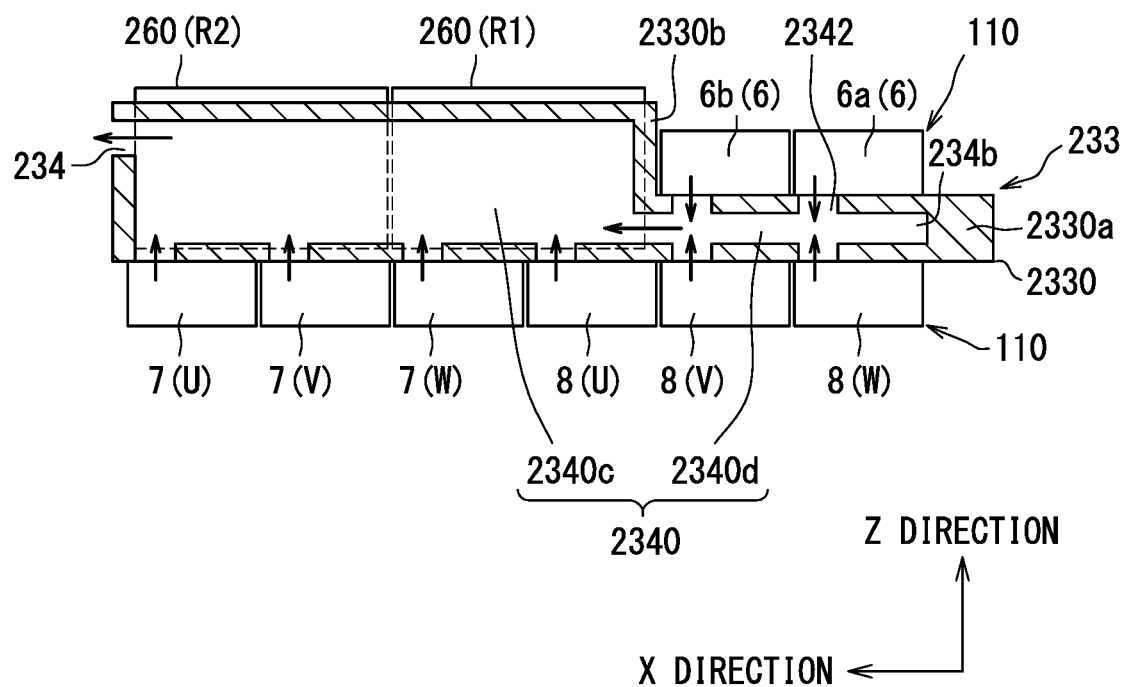
FIG. 57 is a view showing another example of the flow path.

The configurations of the upstream region 234a and the downstream region 234b of the flow path 234 is not limited to the example. For example, in an example shown in FIG. 57, the downstream region 234b includes one extension portion 2340. The extension portion 2340 has a wide width portion 2340c that has a wide width in the Z direction and a narrow width portion 2340d that communicates with the wide width portion 2340c and has a narrower width than the wide width portion 2340c. The upstream region 234a has the similar configuration.

The narrow width portion 2340d corresponds to a portion placed at the base portion 2330a in the second extension portion 2340b. The wide width portion 2340c has a configuration obtained by removing portions between the first extension portion 2340a, the second extension portion 2340b, the first joint portion 2341a, the second joint portion 2341b from the main portion 2330 and integrating those. That is, the partitioning portion is removed, and one wide width portion 2340c is formed. According to this, it may be possible to more efficiently cool the reactor 260 by further increasing the area of the flow path 234 facing the reactor 260.

Figure 58:
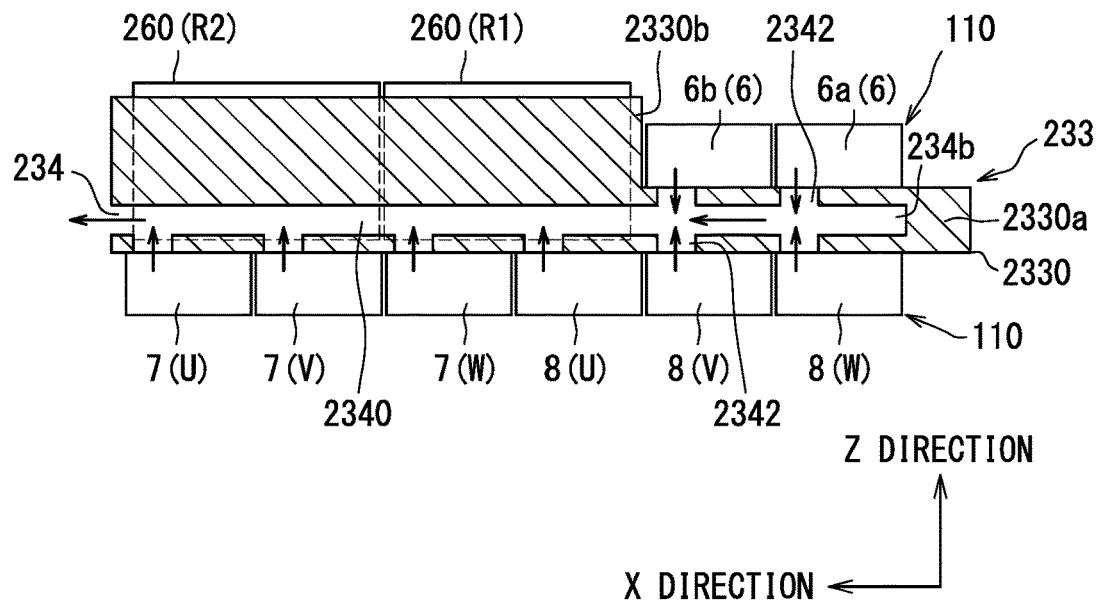
FIG. 58 is a view showing another example of the flow path.

Also in an example shown in FIG. 58, the downstream region 234b includes one extension portion 2340. The extension portion 2340 corresponds to the second extension portion 2340b. The upstream region 234a has the similar configuration. Since the reactor 260 is sandwiched by the extension portion 2340, the reactor 260 can be cooled from the both lateral surfaces 260a and 260b.

The example in which the upstream region 234a and the downstream region 234b have the same structure has been described. However, it is not limited to this. That is, the upstream region 234a and the downstream region 234b may have different structures.

Although the example in which the heat exchange portion 233 includes the support portion 2331 has been shown, the support portion 2331 may not include the support portion 2331. Then, the capacitor unit 270 is placed at the main portion 2330. In the present embodiment, in the Y direction, the support portion 2331 is connected to the side of the upstream region 234a. Thereby, even when the support portion 2331 is not placed at the flow path 234, it may be possible to effectively cool the elements placed at the support portion 2331.

The heat exchange portion 233 may not include the convex portion 2330b. For example, the main portion 2330 may include only the base portion 2330a, and the inserted portion 2330c may be placed at the base portion 2330a.

The inserted portion 2330c may be placed only in the convex portion 2330b. When the inserted portion 2330c opens on one lateral surface together with the protrusion tip surface of the convex portion 2330b, the inserted portion 2330c is provided as a notch.

Figure 59:
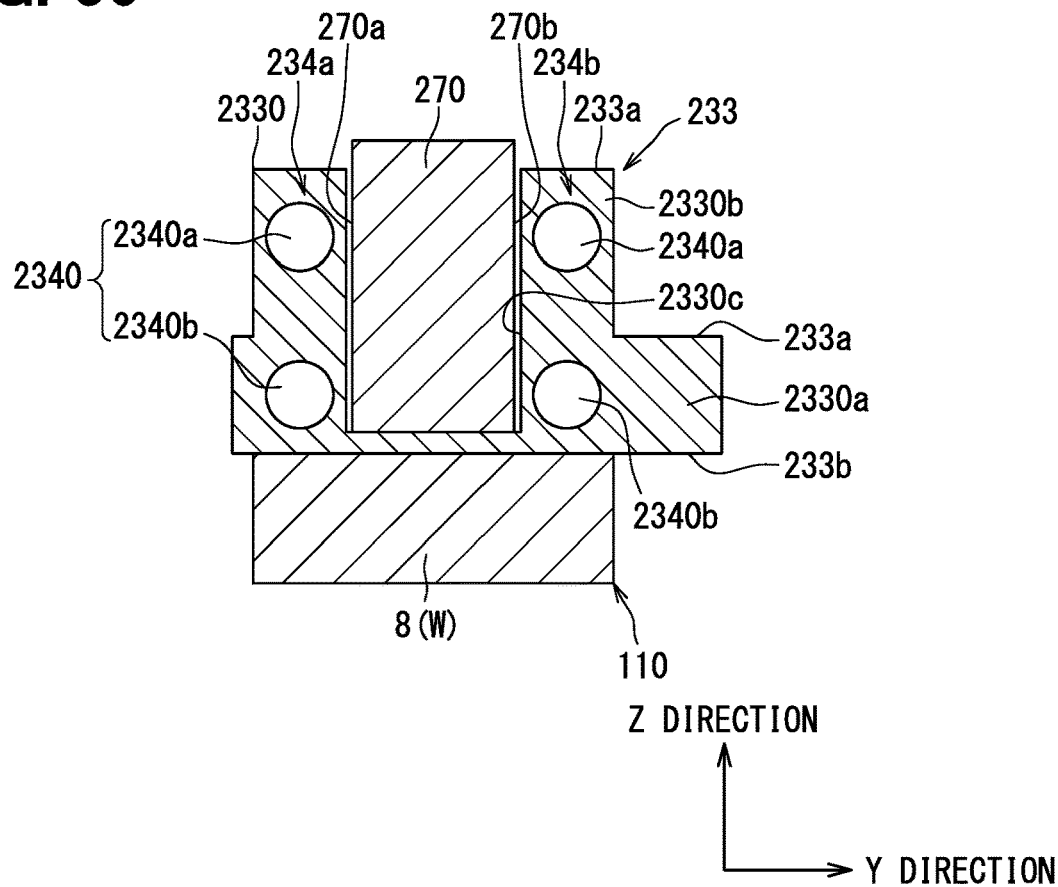
FIG. 59 is a cross-sectional view showing another example of a heating element.

In the example, the reactor 260 has been shown as the heating element. However, it is not limited to this. For example, as shown in FIG. 59, the capacitor unit 270 as the heating element may be cooled from both of lateral surfaces 270a and 270b. In FIG. 59, for convenience, the capacitor unit 270 is simply shown. The reactor 260 and the capacitor unit 270 may be heating elements. The reactor 260, the capacitor unit 270, and the power module 110 may be arranged in a row along the X direction.

The example in which the power module 110 and the heating element are placed close to the first surface 233a has been shown. However, it is not limited to this. It is sufficient that the power module 110 and the heating element are placed at at least one of the first surface 233a or the second surface 233b. For example, the power module 110 and the heating element may be placed at both of the first surface 233a and the second surface 233b.

As the heating element, the power module 110 different from the power module 110 configuring the converter 6, specifically, the power module 110 configuring the inverters 7 and 8 may be employed. That is, the power module having the different calorific value may be used as the heating element. With respect to the power module 110 configuring the inverters 7 and 8, the power module 110 configuring the converter 6 may be used as the heating element.

As the heating element, the bus bar may be employed. For example, the VL bus bar 281 or the VH bus bar 284 may be employed.

The example in which the upstream region 234a and the downstream region 234b are partitioned has been shown. However, it is not limited to this. For example, the substantially U-shaped flow path 234 in which the upstream region 234a and the downstream region 234b integrally communicate with each other can be applied.

In the electric power conversion device 5, a part of the power module 110 may be inserted into the flow path 234 of the cooler 230, and may be immersed. For example, in the Y direction, only a part of the power module 110 may be immersed. Specifically, a placement part from the lateral surface 184 to the semiconductor device 20 and the capacitor C1 may be immersed, and the lateral surface 183 may not be immersed. Then, the output bus bar 150 may be routed in the protective member 180 so as to protrude from the lateral surface 183.

The example in which the electric power conversion device 5 configures the multi-phase converter 6, the inverters 7 and 8 for the motor generators 3 and 4, the smoothing capacitor C2, and the filter capacitor C3 has been shown. However, it is not limited to this. The electric power conversion device 5 may be placed at the cooler 230 and each of the both surfaces of the cooler 230, and may include, at least, the power module 110 configuring the electric power converter. Accordingly, a configuration including only the power module 110 configuring the converter 6 together with the cooler 230 or a configuration obtained by adding the reactor 260 and the IL bus bar 283 to the configuration including only the power module 110 configuring the converter 6 can be employed. The converter 6 is not limited to the multi-converter, and may be a single phase converter. A configuration including only the power module 110 configuring the inverter 8 together with the cooler 230 and a configuration obtained by adding the bus bar configuring the P line 12, the N bus bar 282, and the capacitor unit 270 including the smoothing capacitor C2 to the configuration including only the power module 110 configuring the inverter 8 may be employed. The capacitor C1 may have a function of smoothing the direct voltage, and there by the smoothing capacitor C2 may not be provided. Then, in the three-phase inverter, the capacitance of the capacitor C1 of each parallel circuit 11 is, for example, about 300 μF.

In the above, the embodiments, the configurations, the aspects of the electric power conversion device according to the present disclosure are exemplified. The present disclosure is not limited to the above-described embodiments, each configuration and each aspect related to the present disclosure. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. An electric power conversion device comprising:
a cooler that includes
a flow path through which a refrigerant flows,
a first surface, and
a second surface opposite to the first surface in a thickness direction; and
a plurality of power modules including a first power module and a second power module, each of the plurality of power modules including
a semiconductor device configuring an upper arm circuit and a lower arm circuit, and
a first capacitor connected in parallel to the upper and lower arm circuits,
wherein:
in each of the plurality of power modules, the first capacitor and the semiconductor device are arranged in the thickness direction;
the first power module is arranged on the first surface of the cooler; and
the second power module is arranged on the second surface of the cooler.

2. The electric power conversion device according to claim 1, wherein:
the cooler is a first cooler;
the flow path of the first cooler is a first flow path;
each of the plurality of power modules includes a second cooler that includes a second flow path connected to the first flow path;
the second flow path of the second cooler of each of the plurality of power modules is connected to the first flow path to return the refrigerant from the first flow path, via the second flow path, to the first flow path; and
in each of the plurality of power modules, the semiconductor device is placed on a first surface of the second cooler and the first capacitor is placed on a side opposite to the semiconductor device with respect to the second cooler, in the thickness direction.

3. The electric power conversion device according to claim 2, wherein:
the first flow path is divided into an upstream region and a downstream region; and
the second flow path of the second cooler of each of the plurality of power modules connects the upstream region and the downstream region.

4. The electric power conversion device according to claim 2, wherein in each of the plurality of power modules:
the second cooler has a heat transfer coefficient higher than the first cooler and is branched into two stages in the thickness direction;
the semiconductor device is sandwiched by the two branched stages of the second cooler; and
at least one of the two branched stages of the second cooler, the first capacitor is placed on a side opposite to the semiconductor device.

5. The electric power conversion device according to claim 4, wherein in each of the plurality of power modules:
the semiconductor device includes a signal terminal;
a drive circuit of the semiconductor device is formed in a circuit board;

the first capacitor is placed on a side opposite to the semiconductor device at one of the two branched stages of the second cooler; and the circuit board is placed on a side opposite to the semiconductor device at another of the two branched stages of the second cooler and is connected to the signal terminal.

6. The electric conversion device according to claim 1, wherein:

in at least one of the plurality of power modules, the semiconductor device is closer to the cooler than is the first capacitor.

7. The electric power conversion device according to claim 1, wherein:

for the cooler, a length in the thickness direction is shorter than a minimum length in a direction orthogonal to the thickness direction.

8. The electric power conversion device according to claim 1, wherein:

the semiconductor device in each of at least a first part of the plurality of power modules configures an inverter; and the electric power conversion device further includes a second capacitor that is placed between a direct current power source and the first capacitor of each semiconductor device that configures the inverter, and has a capacitance higher than a capacitance of the first capacitor.

9. The electric power conversion device according to claim 8, wherein:

the second capacitor is placed on both of the first and second surfaces of the cooler.

10. The electric power conversion device according to claim 8, wherein:

the cooler includes a notch portion that partitions a placement region of the second capacitor and a placement region of the plurality of power modules.

11. The electric power conversion device according to claim 8, further comprising:

a reactor, wherein:

each semiconductor device of a second part of the plurality of power modules configures a converter together with the reactor; and the second capacitor and the reactor are arranged in one direction orthogonal to the thickness direction.

12. The electric power conversion device according to claim 11, wherein:

the second capacitor and the reactor are arranged in a same direction as an arrangement direction of the plurality of power modules; and in a direction orthogonal to the thickness direction and the arrangement direction, the second capacitor and the reactor face each of the plurality of power modules.

13. The electric power conversion device according to claim 11, wherein:

the reactor includes a plurality of reactors;

the converter is a multi-phase converter connected to the plurality of reactors in parallel to each other; and the plurality of power modules configuring the multi-phase converter and the plurality of reactors are placed on both of the first and second surfaces of the cooler.

14. The electric power conversion device according to claim 11, wherein:

the plurality of power modules are placed on an upstream side of the flow path; and the second capacitor and the reactor are placed on a downstream side of the flow path as compared with the plurality of power modules.

15. The electric power conversion device according to claim 3, further comprising:

a heating element different from the plurality of power modules, wherein:

at least one of the plurality of power modules and the heating element are arranged close to at least one of the first surface and the second surface of the first cooler;

the upstream region and the downstream region extend in an arrangement direction of the at least one of the plurality of power modules and the heating element;

the heating element is placed between the upstream region and the downstream region in the flow path; and in a direction orthogonal to the arrangement direction, one lateral surface of the heating element is cooled by the upstream region and a surface opposite to the one lateral surface is cooled by the downstream region.

* * * * *